(12) United States Patent
Natori et al.

(10) Patent No.: US 7,825,569 B2
(45) Date of Patent: Nov. 2, 2010

(54) CERAMIC AND METHOD OF MANUFACTURING THE SAME, DIELECTRIC CAPACITOR, SEMICONDUCTOR DEVICE, AND ELEMENT

(75) Inventors: Eiji Natori, Chino (JP); Takeshi Kijima, Matsumoto (JP); Koichi Furuyama, Sayama (JP); Yuzo Tasaki, Hachoiji (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/385,539

(22) Filed: Apr. 10, 2009

(65) Prior Publication Data

US 2009/0230821 A1 Sep. 17, 2009

Related U.S. Application Data

(60) Division of application No. 11/987,971, filed on Dec. 6, 2007, which is a continuation of application No. 11/314,996, filed on Dec. 23, 2005, now Pat. No. 7,323,257, which is a continuation of application No. 10/166,707, filed on Jun. 12, 2002, now Pat. No. 7,008,669.

(30) Foreign Application Priority Data

| Jun. 13, 2001 | (JP) | ............................. 2001-178840 |
| Jun. 26, 2001 | (JP) | ............................. 2001-193048 |
| Mar. 26, 2002 | (JP) | ............................. 2002-086139 |

(51) Int. Cl.
*H01L 41/187* (2006.01)
(52) U.S. Cl. ..................................... 310/358
(58) Field of Classification Search ................ 310/358; 252/62.9 R, 62.9 PZ
See application file for complete search history.

(56) References Cited

U.S. PATENT DOCUMENTS 5,198,269 A    3/1993   Swartz et al.

(Continued)

FOREIGN PATENT DOCUMENTS

CN    1469842 A    1/2004

(Continued)

OTHER PUBLICATIONS

Dec. 24, 2009 Office Action issued in U.S. Appl. No. 11/987,971.

(Continued)

*Primary Examiner*—Walter Benson
*Assistant Examiner*—Derek J Rosenau
(74) *Attorney, Agent, or Firm*—Oliff & Berridge, PLC

(57) ABSTRACT

A method of manufacturing a ceramic includes forming a film which includes a complex oxide material having an oxygen octahedral structure and a paraelectric material having a catalytic effect for the complex oxide material in a mixed state, and performing a heat treatment to the film, wherein the paraelectric material is one of a layered catalytic substance which includes Si in the constituent elements and a layered catalytic substance which includes Si and Ge in the constituent elements. The heat treatment includes sintering and post-annealing. At least the post-annealing is performed in a pressurized atmosphere including at least one of oxygen and ozone. A ceramic is a complex oxide having an oxygen octahedral structure, and has Si and Ge in the oxygen octahedral structure.

7 Claims, 47 Drawing Sheets

U.S. PATENT DOCUMENTS

| | | | |
|---|---|---|---|
| 5,279,996 A | | 1/1994 | Hase et al. |
| 5,973,351 A | | 10/1999 | Kotecki et al. |
| 6,001,416 A | * | 12/1999 | Moriyama et al. ........... 427/100 |
| 6,117,806 A | * | 9/2000 | Yokoi et al. ................. 501/135 |
| 6,126,743 A | | 10/2000 | Saegusa et al. |
| 6,197,102 B1 | * | 3/2001 | Sawada et al. ......... 106/287.18 |
| 6,281,022 B1 | | 8/2001 | Li et al. |
| 6,398,978 B1 | | 6/2002 | Hirose et al. |
| 6,402,303 B1 | * | 6/2002 | Sumi ............................ 347/68 |
| 6,922,351 B2 | | 7/2005 | Natori et al. |
| 7,205,056 B2 | | 4/2007 | Natori et al. |
| 7,323,257 B2 | * | 1/2008 | Natori et al. ................ 428/701 |
| 2003/0021079 A1 | | 1/2003 | Natori et al. |
| 2003/0036001 A1 | | 2/2003 | James et al. |
| 2003/0227803 A1 | | 12/2003 | Natori et al. |
| 2004/0136891 A1 | | 7/2004 | Kijima et al. |
| 2008/0159939 A1 | * | 7/2008 | Natori et al. ................ 423/263 |

FOREIGN PATENT DOCUMENTS

| | | |
|---|---|---|
| EP | 0 270 099 A2 | 6/1988 |
| EP | 0 525 590 A1 | 2/1993 |
| EP | 1 039 525 A1 | 9/2000 |
| JP | A-01-102805 | 4/1989 |
| JP | A-03-040962 | 2/1991 |
| JP | A-03-69512 | 3/1991 |
| JP | A-05-85704 | 4/1993 |
| JP | A-06-191941 | 7/1994 |
| JP | A 06-318405 | 11/1994 |
| JP | A-07-057535 | 3/1995 |
| JP | A-08-55919 | 2/1996 |
| JP | A-08-245263 | 9/1996 |
| JP | A-08-253324 | 10/1996 |
| JP | A-08-340086 | 12/1996 |
| JP | A-10-12833 | 1/1998 |
| JP | A-2000-239061 | 9/2000 |
| JP | A-2001-181034 | 7/2001 |
| WO | WO 02/32809 A1 | 4/2002 |
| WO | WO 03/023858 | 3/2003 |

OTHER PUBLICATIONS

Collier et al., "Ferroelectric Thick-Films for Piezoelectric Applications", Ferroelectrics, vol. 154, No. 1-4, pp. 47-52, 1994 (Abstract).

Kim et al., "Low-Firing Lead magnesium Niobate—Lead Titanate—Lead Germanium Silicate Ferroelectric Compositions for Thick Film Capacitor Applications", The International Journal of Microcircuits and Electronic Packaging, vol. 22, No. 2, pp. 137-145, Apr. 1999.

Wang et al., "Structural and Electrical Properties of Ferroelectric Pb(Zr1-xTiz)O3-SiO2 Glass Ceramic Thin Films Derived by Sol Gel Methods," *Japan Journal of Applied Physics*, vol. 40, Part 1, No. 3A, Mar. 2001.

M. Volnyanskii, Dielectric Properties of Crystals, $Li_2(Ge_1-xSi_x)_7O_{15}$, Fiz Tverd Tela, May 1988, vol. 30, No. 5, pp. 1520-1523.

\* cited by examiner

100nm

SBT

BSO-BGO-SBT

100nm

20nm

CERAMIC AND METHOD OF MANUFACTURING THE SAME, DIELECTRIC CAPACITOR, SEMICONDUCTOR DEVICE, AND ELEMENT

This is a Divisional of application Ser. No. 11/987,971 filed Dec. 6, 2007, which is in turn is a Continuation of application Ser. No. 11/314,996 filed Dec. 23, 2005, which in turn is a Continuation of application Ser. No. 10/166,707 filed Jun. 12, 2002. The disclosures of the prior applications are hereby incorporated by reference herein in their entirety.

BACKGROUND

The present invention relates to a ceramic and a method of manufacturing the same, a dielectric capacitor, a semiconductor device, and other elements including the ceramic of the present invention.

As a ferroelectric film applied to semiconductor devices (ferroelectric memory (FeRAM), for example), a ferroelectric film having a perovskite structure (PbZrTiO-type ferroelectric film, for example) and a ferroelectric film having a layered perovskite structure (BiLaTiO-type, BiTiO-type, or SrBiTaO-type ferroelectric film, for example) have been proposed. The ferroelectric film having a layered perovskite structure is generally formed by crystal growth from an amorphous state.

In the case of forming a ferroelectric film having a layered perovskite structure by using this formation method, the crystal growth rate in the c-axis direction becomes lower than those in the a-axis direction and the b-axis direction due to the crystal structure of the ferroelectric film. Specifically, crystals tend to be grown in the a-axis direction and the b-axis direction. Therefore, a ferroelectric film having a layered perovskite structure formed by using the above method has a rough surface morphology, whereby openings (holes or grooves, for example) are easily formed between crystals of the resulting ferroelectric film. Generally, the above-described ferroelectric film must be sintered at a temperature as high as about 600 to 800° C. for a long period of time. Therefore, when forming a ferroelectric memory by combining a ferroelectric capacitor using such a ferroelectric film with a semiconductor element, it is necessary to prevent the semiconductor element from being affected by the high temperature treatment for a long period of time for forming the ferroelectric film. This gives rise to problems such as complexity of the manufacturing process for the ferroelectric memory.

SUMMARY

The present invention may provide a method of manufacturing a ceramic capable of lowering the crystallization temperature of the ceramic and improving the surface morphology of the ceramic.

The present invention may also provide a novel ceramic obtained by the method of manufacturing a ceramic of the present invention.

The present invention may further provide a semiconductor device and other elements to which the ceramic of the present invention is applied.

A ceramic according to one aspect of the present invention is a complex oxide having an oxygen octahedral structure, and comprises Si and Ge in the oxygen octahedral structure.

A method of manufacturing a ceramic according to another aspect of the present invention comprises forming a film which includes a complex oxide material having an oxygen octahedral structure and a paraelectric material having a catalytic effect for the complex oxide material in a mixed state, and performing a heat treatment to the film, wherein the paraelectric material is one of a layered catalytic substance which includes Si in the constituent elements and a layered catalytic substance which includes Si and Ge in the constituent elements. The heat treatment may include sintering and post-annealing, wherein at least the post-annealing may be performed in a pressurized atmosphere including at least one of oxygen and ozone. The annealing in the pressurized atmosphere is hereinafter referred to as "pressure annealing". The pressure annealing may be performed not only during post-annealing but also during sintering.

A dielectric capacitor according to further aspect of the present invention comprises a lower electrode, a film of the ceramic of the present invention which is formed on the lower electrode, and an upper electrode formed on the ceramic film. The ceramic may be applied to various types of devices of the dielectric capacitor.

DETAILED DESCRIPTION OF EMBODIMENTS

Figure 1:
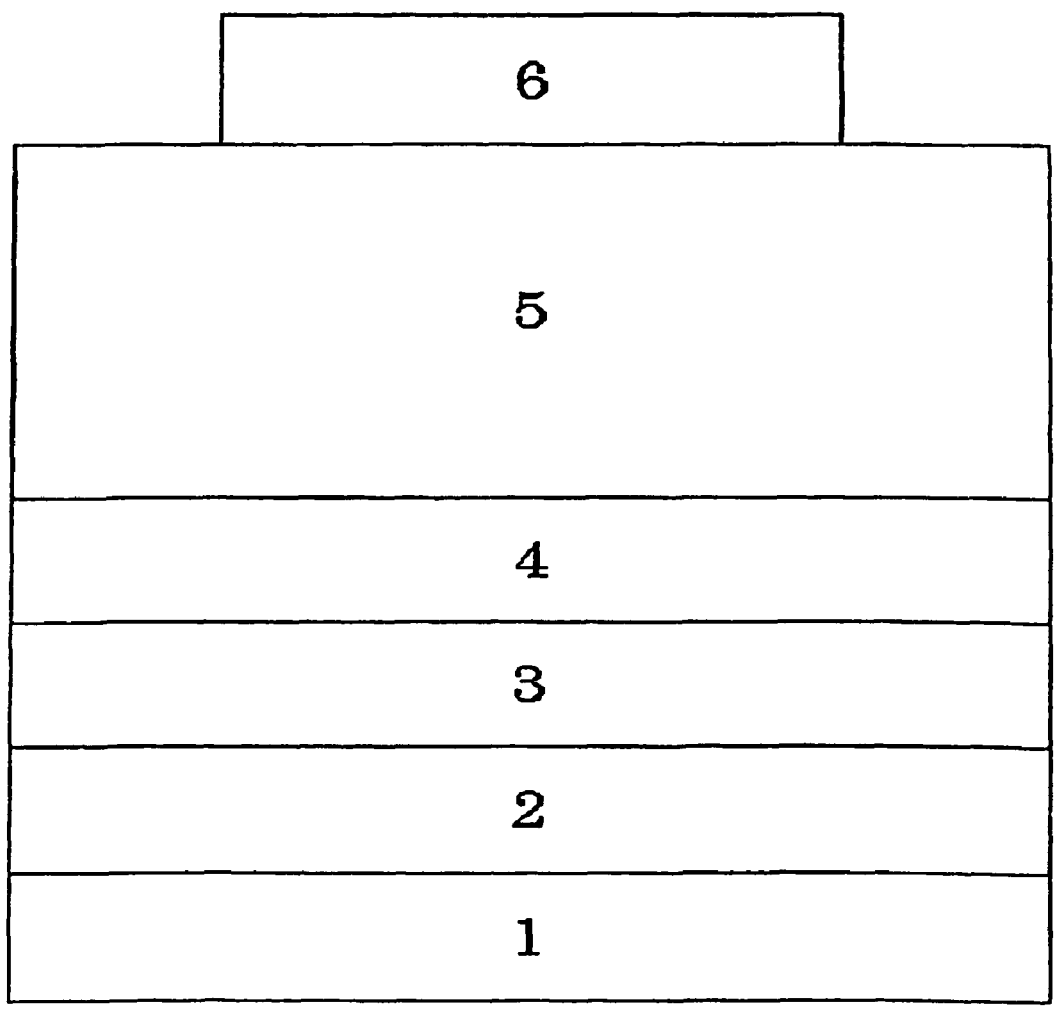
FIG. 1 is a cross-sectional view showing a high-dielectric/ferroelectric capacitor formed by using a high-dielectric thin film of the present invention.

Embodiments of the present invention are described below.

(A) A first method of manufacturing a ceramic film of the present invention comprises:

a step of forming a ceramic film by crystallizing a raw material body, wherein the raw material body includes different types of raw materials in a mixed state, and wherein the different types of raw materials differ from one another in at least one of a crystal growth condition and a crystal growth mechanism in the crystallization of the raw materials.

The different types of raw materials differ from one another in at least one of the crystal growth condition and the crystal growth mechanism in the crystallization of the raw materials. Specifically, the raw materials are judged to be different depending on whether or not the raw materials differ from one another in at least one of the crystal growth condition and the crystal growth mechanism.

One of the different types of raw materials is a complex oxide material having an oxygen octahedral structure such as a perovskite material, Bi-layer structured material, superconducting oxide material, and tungsten bronze material, and the other raw material is a paraelectric material such as a layered catalytic substance which includes Si or Si and Ge in the constituent elements.

As examples of the crystal growth condition and the crystal growth mechanism in the crystallization of the raw materials, a crystallization temperature, crystal nucleus formation temperature, crystal growth temperature, crystal growth rate, crystal nucleus formation rate, size of crystal nuclei, crystallization method, and the like can be given.

Moreover, examples include a phenomenon in which the density of initial crystal nuclei is increased by allowing a region in which one of the raw materials is crystallized before the other raw material to occur over the entire film, thereby preventing abnormal growth of crystals to provide good surface morphology.

In this embodiment, the raw material body includes the different types of raw materials. Specifically, the raw material body includes at least two types of raw materials. The different types of raw materials differ from one another in at least one of the crystal growth condition and the crystal growth mechanism in the crystallization of the raw materials. Therefore, one of the raw materials can be crystallized before the other raw material and the other raw material can be crystallized in the openings between crystals produced from the above raw material by controlling various conditions, for example. Specifically, the openings between crystals produced from one of the raw materials can be filled with crystals produced from the other raw material. Therefore, surface morphology of the ceramic film can be improved.

The different types of raw materials may be crystallized at the same time by controlling various conditions. For example, the crystallization temperature can be adjusted by causing a metal element of the raw material to be replaced with another element. This enables the crystallization temperatures of the different types of raw materials to be approximately the same. The different types of raw materials can be crystallized at the same time if the crystallization temperatures of the different types of raw materials are approximately the same.

(B) A second method of manufacturing a ceramic film of the present invention comprises:

a step of forming a ceramic film by crystallizing a raw material body, wherein the raw material body includes different types of raw materials in a mixed state, and wherein the different types of raw materials differ from one another in a crystal structure produced from the raw materials.

The different types of raw materials differ from one another in the crystal structure produced from the raw materials. Specifically, the raw materials are judged to be different when the raw materials differ from one another in the crystal structure of the crystals obtained from the raw materials.

When crystals obtained from the raw materials are expressed as $(Bi_2O_2)^{2+}(A_{m-1}B_mO_{3m+1})^{2-}$, crystals having a different crystal structure have different values for m, different elements for A and B, and the like.

For example, when crystals obtained from the raw materials are expressed as $(Bi_2O_2)^{2+}(A_{m-1}B_mO_{3m+1})^{2-}$, crystals having a different crystal structure have either Si or Si and Ge for B.

In this embodiment, the different types of raw materials differ from one another in the crystal structures produced from the raw materials. If the raw materials differ from one another in the crystal structure of the crystals obtained from the raw materials, the raw materials differ from one another in the crystal growth condition and the crystal growth mechanism of the raw materials. Therefore, effects the same as in the first method of manufacturing a ceramic film of the present invention can be obtained.

(C) A third method of manufacturing a ceramic film of the present invention comprises:

a step of forming a ceramic film by crystallizing a raw material body, wherein the raw material body includes different types of raw materials in a mixed state, and wherein the different types of raw materials are individually crystallized at least at an initial stage of crystallization.

The different types of raw materials are individually crystallized at least at an initial stage of crystallization.

In the third method of manufacturing a ceramic film of the present invention, the different types of raw materials are individually crystallized at least at an initial stage of crystallization. Therefore, crystals produced from one of the raw materials can be grown in the openings between crystals produced from the other raw material. As a result, occurrence of openings between the crystals can be prevented, whereby the surface morphology is improved.

The first to third methods of manufacturing a ceramic film of the present invention may have any of the following features.

(a) The ceramic film may be a ferroelectric or a high dielectric.

(b) The ceramic film may be a paraelectric.

(c) The ceramic film may include a ferroelectric and a paraelectric in a mixed state.

(d) At least two of the different types of raw materials may differ from each other in crystallization temperature in the crystallization of the raw materials.

(e) At least two of the different types of raw materials may differ from each other in crystal nucleus formation temperature in the crystallization of the raw materials.

(f) At least two of the different types of raw materials may differ from each other in crystal growth temperature in the crystallization of the raw materials.

(g) At least two of the different types of raw materials may differ from each other in crystal growth rate in the crystallization of the raw materials.

(h) At least two of the different types of raw materials may differ from each other in crystal nucleus formation rate in the crystallization of the raw materials.

(i) At least two of the different types of raw materials may differ from each other in the size of crystal nuclei in the crystallization of the raw materials.

(j) At least two of the different types of raw materials may differ from each other in crystallization method in the crystallization of the raw materials.

(k) There may be a time lag between the crystallizations of the different types of raw materials.

(l) There may be a time lag between the formation of crystal nuclei in the crystallization of the raw materials.

(m) One of the raw materials crystallized first may have a catalytic effect for the other raw material crystallized later.

(n) The different types of raw materials may be crystallized at the same time.

(o) The different types of raw materials may be compound-crystallized at the same time.

(p) The different types of raw materials may be dissolved at the same time.

When crystallizing the different types of raw materials at the same time, crystals produced from one of the raw materials interrupt the growth of crystals produced from the other raw material. As a result, the resulting crystals can be microcrystallized. This causes the openings between the crystals to become narrow, whereby the surface morphology is improved.

When crystallizing the different types of raw materials at the same time, it is preferable to use raw materials which produce a ceramic having a different crystal structure. This enables the crystal growth conditions and the crystal growth mechanism during crystallization of the raw materials to be changed at the same time.

(q) When ceramics obtained from the raw materials are expressed as $(Bi_2O_2)^{2+}+(A_{m-1}B_mO_{3m+1})^{2-}$, the different types of raw materials may have different values for m.

(r) One of the different types of raw materials may be a complex oxide material having an oxygen octahedral structure such as a perovskite and bismuth-layer structured oxide material shown by $ABO_3$ or $(Bi_2O_2)^{2+}(A_{m-1}B_mO_{3m+1})^{2-}$ (wherein A represents at least one element selected from the group consisting of Li, Na, K, Rb, Pb, Ca, Sr, Ba, Bi, La, and Hf, B represents at least one element selected from the group consisting of Ru, Fe, Ti, Zr, Nb, Ta, V, W, and Mo, and m is a natural number of 5 or less), a superconducting oxide material shown by $LanBa_2Cu_3O_7$, $Trm_2Ba_2Ca_{n-1}Cu_nO_{2n+4}$, or $TrmBa_2Ca_{n-1}Cu_nO_{2n+3}$ (wherein Lan represents at least one ion selected from the group consisting of Y, La, Ce, Pr, Nd, Pm, Sm, Eu, Gd, Tb, Dy, Ho, Er, Tm, Yb, and Lu, Trm represents at least one ion selected from the group consisting of Bi, Tl, and Hg, and m is a natural number from 1 to 5), and a tungsten bronze structured material shown by $A_{0.5}BO_3$ (tetragonal bronze structure) or $A_{0.3}BO_3$ (hexagonal bronze structure) (wherein A represents at least one element selected from the group consisting of Li, Na, K, Rb, Cs, Pb, Ca, Sr, Ba, Bi, and La, and B represents at least one element selected from the group consisting of Ru, Fe, Ti, Zr, Nb, Ta, V, W, and Mo), and the other raw material may be a paraelectric material formed of a mixture of at least one oxide selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$, and $V_2O_5$, and $SiO_2$ or $SiO_2$ and $GeO_2$.

(s) The raw material body may be formed on a substrate by using a liquid source misted chemical deposition (LSMCD) method.

In the case of forming the raw material body on the substrate by using the LSMCD method, the raw material body is provided to the substrate in the form of a mist by ultrasonic waves. This improves mixing conditions for the different types of raw materials. Therefore, a ceramic film having microcrystals can be obtained.

The raw material body may be formed on a substrate by separately providing the different types of raw materials.

The raw material body may be formed on a substrate by providing the different types of raw materials at the same time.

(t) The raw material body may be formed on a substrate by spin coating or dipping.

(u) The raw material body may be formed on a substrate by a metal-organic chemical vapor deposition (MOCVD) method.

(v) The raw material body may be formed on a substrate by sputtering or laser ablation.

(w) The raw material body may be formed on a substrate by a solid phase method.

(x) The raw materials may be at least one of a sol-gel raw material and an MOD raw material.

(y) The raw material body may include a sol-gel raw material and an MOD raw material.

In the above (x) and (y), the sol-gel raw material may be polycondensed by hydrolysis.

In the above (x) and (y), the sol-gel raw material may be complex polymerized by hydrolysis.

The sol-gel raw material may have a crystal structure similar to the crystal structure of crystals obtained by crystallizing the raw material. This enables the sol-gel raw material to be easily crystallized.

The MOD raw material may be a polynuclear complex raw material.

The raw material body may include different types of sol-gel raw materials, and the different types of sol-gel raw materials may differ from one another in the degree of polycondensation or metal element composition.

The raw material body may include different types of sol-gel raw materials, and the different types of sol-gel raw materials may not be mixed at an atomic level or a molecular level.

The term "mixed at an atomic level" means that atoms which make up the raw materials are mixed, for example. Specifically, the raw materials are preferably mixed in a state in which individual molecules or aggregates are maintained. If the raw materials are not mixed at an atomic level or a molecular level, the effects of the present invention can be obtained reliably. Moreover, characteristics of the ceramic film can be further improved.

Specifically, the sol-gel raw material is in a state in which a long polycondensed organic metal network is dispersed in a solvent. This aims at bringing constituent elements of an objective oxide close to one another in advance. The MOD raw material is in a state in which the constituent elements of an objective oxide are dispersed without being bonded to one another. The feature in which the raw material body of the present invention includes the different types of sol-gel raw materials, and the different types of sol-gel raw materials are not mixed at an atomic level or a molecular level means as follows. The constituent elements of the sol-gel raw material for a ferroelectric form a network. The constituent elements of the sol-gel raw material for a paraelectric also form a network. However, these networks are not polycondensed and have a relation similar to that of the constituent elements in the MOD raw material. Specifically, these networks are not mixed at an atomic level or a molecular level. This enables each of the objective oxides to be formed separately.

(D) A fourth method of manufacturing a ceramic film of the present invention comprises:

a step of forming a ceramic film by crystallizing a raw material body, wherein the raw material body is crystallized so that a plurality of phases is formed.

The ceramic film may have any of the following features.

(a) The ceramic film may be a ferroelectric or a high dielectric.

(b) The ceramic film may be a paraelectric.

(c) The ceramic film may include a ferroelectric and a paraelectric in a mixed state.

(E) A fifth method of manufacturing a ceramic film of the present invention comprises:

a step of forming a ceramic film by crystallizing a ceramic raw material liquid which includes a first raw material liquid and a second raw material liquid, or a vaporized raw material gas of the ceramic raw material liquid, wherein the first raw material liquid and the second raw material liquid are different types of liquids, wherein the first raw material liquid is a raw material liquid for producing a ferroelectric including a perovskite material, Bi-layer structured material, superconducting oxide material, and tungsten bronze material, and wherein the second raw material liquid is a raw material liquid for producing a layered catalytic oxide in which Si or Si and Ge are provided in the B site.

A ferroelectric film having specific characteristics at a low temperature can be formed by forming a ceramic film using the ceramic raw material liquid of the present invention. A ceramic film obtained by using the ceramic raw material liquid of the present invention has excellent surface morphology.

If the molar ratio of a ferroelectric produced from the first raw material liquid to a paraelectric oxide produced from the second raw material liquid (complex oxide material/paraelectric material) is 1 or more, a ferroelectric ceramic film can be formed by crystallizing the raw material body.

If the molar ratio of a ferroelectric produced from the first raw material liquid to a paraelectric oxide produced from the second raw material liquid (complex oxide material/paraelectric material) is less than 1, a ceramic film including a ferroelectric and a paraelectric in a mixed state can be formed by crystallizing the raw material body.

This enables formation of a ceramic film which is formed of a mixture of a ferroelectric material having an oxygen octahedral structure produced from the first raw material liquid and a paraelectric material having an oxygen tetrahedral structure consisting of $SiO_2$ or a mixture of $SiO_2$ and $GeO_2$ in the crystal structure produced from the second raw material liquid, and which maintains a relative dielectric constant of the ferroelectric and does not shows hysteresis after mixing and crystallizing the complex oxide material and the paraelectric material.

If the molar ratio of a ferroelectric produced from the first raw material liquid to a paraelectric oxide produced from the second raw material liquid (complex oxide material/paraelectric material) is less than 1, a ferroelectric ceramic film including a ferroelectric and a paraelectric in a mixed state can be formed by crystallizing the raw material body.

This enables formation of a ceramic film which is formed of a mixture of a ferroelectric material having an oxygen octahedral structure produced from the first raw material liquid and a paraelectric material having an oxygen tetrahedral structure consisting of $SiO_2$ or a mixture of $SiO_2$ and $GeO_2$ in the crystal structure produced from the second raw material liquid, and which does not show changes in the Curie temperature of the ferroelectric material after mixing and crystallizing the complex oxide material and the paraelectric material.

A ferroelectric ceramic film orientated in an optional direction can be formed by providing DLC for determining the growth direction of the fifth ceramic film of the present invention at the interface with the substrate when crystallizing the ceramic film.

The first raw material liquid may be a solution in which a metal compound or a metal-inorganic compound of a metal element for the ferroelectric is dissolved in a solvent, and the second raw material liquid may be a solution in which a metal compound or a metal-inorganic compound of a metal element for the layered catalytic oxide is dissolved in a solvent.

(F) A sixth method of manufacturing a ceramic film of the present invention comprises:

wherein an uppermost raw material layer in the raw material body layer has a crystallization temperature lower than the crystallization temperature of a lower raw material layer which is in contact with the uppermost raw material layer.

According to this embodiment, crystals produced from the uppermost raw material layer function as a seed layer during crystallization of the lower raw material layer. Moreover, since crystals obtained from the uppermost raw material layer have no layered structure, the surface morphology of the ceramic film can be improved.

The lower raw material layer which is in contact with the uppermost raw material layer may be formed on a substrate with a first raw material layer interposed therebetween, and the first raw material layer may have a crystallization temperature lower than the crystallization temperature of the lower raw material layer which is in contact with the uppermost raw material layer. Therefore, crystals produced from the first raw material layer function as a seed layer during crystallization of the lower raw material layer which is in contact with the uppermost raw material layer.

(G) A seventh method of manufacturing a ceramic film of the present invention comprises:

a step of forming a raw material body layer which includes a raw material laminate in which a first raw material layer, a second raw material layer, and a third raw material layer are layered in that order, and a step of forming a ceramic film by crystallizing the raw material body layer, wherein the second raw material layer has a crystallization temperature lower than crystallization temperatures of the first and third raw material layers.

According to this embodiment, crystals produced from the second raw material layer function as a stopper for preventing the growth of crystals in the first raw material layer and the third raw material layer.

Therefore, the grain size of the crystals produced from the first raw material layer and the third raw material layer can be reduced.

A fourth raw material layer may be further layered on the third raw material layer, and the fourth raw material layer may have a crystallization temperature lower than the crystallization temperature of the third raw material layer. In this case, crystals produced from the fourth raw material layer function as a seed layer during crystallization of the third raw material layer.

(J) A tenth method of manufacturing a ceramic film of the present invention comprises:

a step of forming a raw material body layer in which a plurality of raw material layers is layered, and a step of forming a ceramic film by crystallizing the raw material body layer, wherein an uppermost raw material layer in the raw material body layer has a crystallization temperature higher than the crystallization temperature of a lower raw material layer which is in contact with the uppermost raw material layer.

According to this embodiment, crystals produced from the uppermost raw material layer can be formed to cover crystals produced from the lower raw material layer.

The crystals obtained from the uppermost raw material layer in the raw material body layer preferably have no layered structure. This enables the surface morphology of the ceramic film to be improved.

In the first to eighth methods of manufacturing a ceramic film of the present invention, the step of forming a ceramic film by crystallizing the raw material body may be performed two or more times.

Ceramic Film (A) A first ceramic film of the present invention is obtained by a method of manufacturing a ceramic film of the present invention.

(B) A second ceramic film of the present invention comprises:

a laminate in which a first crystal layer and a second crystal layer are layered in that order, wherein the second crystal layer has a melting point lower than the melting point of the first crystal layer, and wherein crystals in the second crystal layer do not have a layered structure.

In this embodiment, a region in which a constituent metal element of the first crystal layer and a constituent metal element of the second crystal layer are mixed may be present near the interface between the first crystal layer and the second crystal layer.

In this embodiment, the first crystal layer may be formed on a substrate with a third crystal layer interposed therebetween, and the third crystal layer may have a melting point lower than the melting point of the first crystal layer.

(C) A third ceramic film of the present invention comprises:

a crystal laminate in which a first crystal layer, a second crystal layer, and a third crystal layer are layered in that order, wherein the second crystal layer has a melting point lower than melting points of the first crystal layer and the third crystal layer.

In this embodiment, a region in which a constituent metal element of the first crystal layer and a constituent metal element of the second crystal layer are mixed may be present near the interface between the first crystal layer and the second crystal layer, and a region in which a constituent metal element of the second crystal layer and a constituent metal element of the third crystal layer are mixed may be present near the interface between the second crystal layer and the third crystal layer.

In this embodiment, a fourth crystal layer may be formed on the third crystal layer, the fourth crystal layer may have a melting point lower than the melting point of the third crystal layer, and a region in which a constituent metal element of the third crystal layer and a constituent metal element of the fourth crystal layer are mixed may be present near the interface between the third crystal layer and the fourth crystal layer.

(D) A fourth ceramic film of the present invention comprises:

a laminate in which a first crystal layer and a second crystal layer are layered in that order, wherein the second crystal layer has a melting point higher than the melting point of the first crystal layer, and wherein crystals in the second crystal layer do not have a layered structure.

In this embodiment, a region in which a constituent metal element of the first crystal layer and a constituent metal element of the second crystal layer are mixed may be present near the interface between the first crystal layer and the second crystal layer.

Application Example of Ceramic Film

A semiconductor device of the present invention comprises a capacitor including a ceramic film of the present invention.

An element of the present invention comprises the ceramic film of the present invention.

The present invention further provides a ferroelectric capacitor and a method of manufacturing a ceramic film given below.

A ferroelectric capacitor of the present invention comprises:

a lower electrode, a ceramic film which includes first crystals and second crystals and is formed on the lower electrode, and an upper electrode formed on the ceramic film, wherein the first crystals include a perovskite material, Bi-layer structured material, superconducting oxide material, and tungsten bronze structure, wherein the second crystals are a paraelectric oxide having an oxygen tetrahedral structure consisting of $SiO_2$ or a mixture of $SiO_2$ and $GeO_2$ in the structure, and wherein the first crystals are intermittently formed in the planar direction of the ceramic film, and the second crystals are formed so as to be interposed between the first crystals.

The ceramic film which makes up the ferroelectric capacitor may be formed by a first method given below.

The first method comprises:

a step of forming a ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a perovskite material, Bi-layer structured material, superconducting oxide material, and ferroelectric having a tungsten bronze structure, the second raw material liquid is a raw material liquid for producing a layered catalytic oxide in which Si or Si and Ge are provided in the B site, wherein a solvent included in the first raw material liquid and a solvent included in the second raw material liquid have different polarities, and wherein first crystals produced from the first raw material liquid are intermittently formed in the planar direction of the ceramic film, and second crystals produced from the second raw material liquid are formed so as to be interposed between the first crystals by depositing the ceramic film in a state in which the first raw material liquid and the second raw material liquid are phase separated.

The ceramic film which makes up the ferroelectric capacitor may be formed by a second method given below.

The second method comprises:

a step of forming a ceramic film by crystallizing a ceramic raw material liquid including a first raw material liquid and a second raw material liquid, wherein the first raw material liquid and the second raw material liquid are different types of liquids, wherein the first raw material liquid is a raw material liquid for producing a perovskite material, Bi-layer structured material, superconducting oxide material, and ferroelectric including a tungsten bronze structure, the second raw material liquid is a raw material liquid for producing a layered catalytic oxide in which Si or Si and Ge are provided in the B site, wherein a solvent included in the first raw material liquid and a solvent included in the second raw material liquid have different polarities, and wherein first crystals produced from the first raw material liquid are intermittently formed in the planar direction of the ceramic film, and second crystals produced from the second raw material liquid are formed so as to be interposed between the first crystals by forming a mist of the first raw material liquid so as to be dispersed on a substrate, and forming a film of the second raw material liquid on the substrate.

In the second method, as the method for forming the film of the second raw material liquid on the substrate on which the mist produced from the first raw material liquid is dispersed, a method of forming the film in a state in which the second raw material liquid is misted, or a method of forming the film of the second raw material liquid by spin coating may be used. These methods also apply to a second method described later.

The first and second methods may have the following features. These features also applied to first and second methods described later.

(a) One of the solvents included in the first raw material liquid and the second raw material liquid may be soluble in water, and the other solvent may be insoluble in water.

(b) The molar ratio of the ferroelectric produced from the first raw material liquid to the ABO-type oxide produced from the second raw material liquid may be from 100:20 to 100:100.

(c) The first raw material liquid may be a solution in which a metal compound or a metal inorganic compound of a metal element for the ferroelectric is dissolved in a solvent, and the second raw material liquid may be a solution in which a metal compound or a metal inorganic compound of a metal element for the layered catalytic oxide in which Si or Si and Ge are provided in the B site is dissolved in a solvent.

A ferroelectric capacitor of the present invention comprises:

a lower electrode, a ceramic film which includes first crystals and second crystals and is formed on the lower electrode, and an upper electrode formed on the ceramic film, wherein the first crystals include a perovskite material, Bi-layer structured material, superconducting oxide material, and tungsten bronze structure, wherein the second crystals are a layered catalytic oxide in which Si, or Si and Ge are provided in the B site, and wherein the first crystals are intermittently formed in the planar direction of the ceramic film, and the second crystals are formed so as to be interposed between the first crystals.

The ceramic which makes up the ferroelectric capacitor may be formed by a method similar to the above first and second methods.

Specifically, a first method comprises:

a step of forming a ceramic film by crystallizing a ceramic raw material liquid which includes a third raw material liquid and a fourth raw material liquid, wherein the third raw material liquid and the fourth raw material liquid are different types of liquids, wherein the third raw material liquid is a raw material liquid for producing a perovskite material, Bi-layer structured material, superconducting oxide material, and tungsten bronze type ferroelectric, wherein the fourth raw material liquid is a raw material liquid for producing a layered catalytic oxide in which Si or Si and Ge are provided in the B site, wherein a solvent included in the third raw material liquid and a solvent included in the fourth raw material liquid have different polarities, and wherein third crystals produced from the third raw material liquid are intermittently formed in the planar direction of the ceramic film, and fourth crystals produced from the fourth raw material liquid are formed so as to be interposed between the third crystals by depositing the ceramic film in a state in which the third raw material liquid and the fourth raw material liquid are phase separated.

A second method comprises:

a step of forming a ceramic film by crystallizing a ceramic raw material liquid which includes a third raw material liquid and a fourth raw material liquid, wherein the third raw material liquid and the second raw material liquid are different types of liquids, wherein the third raw material liquid is a raw material liquid for producing a perovskite material, Bi-layer structured material, superconducting oxide material, and tungsten bronze type ferroelectric, wherein the fourth raw material liquid is a raw material liquid for producing a layered catalytic oxide in which Si or Si and Ge are provided in the B site, wherein a solvent included in the third raw material liquid and a solvent included in the fourth raw material liquid have different polarities, and wherein third crystals produced from the third raw material liquid are intermittently formed in the planar direction of the ceramic film, and fourth crystals produced from the fourth raw material liquid are formed so as to be interposed between the third crystals by forming a mist of the third raw material liquid so as to be dispersed on a substrate, and forming a film of the fourth raw material liquid on the substrate.

In the second method, as the method of forming the film of the fourth raw material liquid on the substrate on which the mist produced from the third raw material liquid is dispersed, a method of forming the film in a state in which the fourth raw material liquid is misted, or a method of forming the film of the fourth raw material liquid by spin coating may be used.

The first and second methods may have the following features.

(a) One of the solvents included in the third raw material liquid and the fourth raw material liquid may be soluble in water, and the other solvent may be insoluble in water.

(b) The molar ratio of the ferroelectric produced from the third raw material liquid to the ABO-type oxide produced from the fourth raw material liquid may be from 100:20 to 100:100.

(c) The third raw material liquid may be a solution in which a metal compound or a metal-inorganic compound of a metal element for the ferroelectric is dissolved in a solvent, and the fourth raw material liquid may be a solution in which a metal compound or a metal-inorganic compound of a metal element for the layered catalytic oxide is dissolved in a solvent.

A ferroelectric capacitor of the present invention comprises:

a lower electrode, a ceramic film which includes first crystals and second crystals and is formed on the lower electrode, and an upper electrode formed on the ceramic film, wherein the first crystals are intermittently formed in the planar direction of the ceramic film, and the second crystals are formed so as to be interposed between the first crystals.

A first method for forming the ceramic film which makes up the ferroelectric capacitor comprises:

a step of forming a ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a ferroelectric, wherein the second raw material liquid is a raw material liquid for producing a layered catalytic oxide, wherein a solvent included in the first raw material liquid and a solvent included in the second raw material liquid have different polarities, and wherein first crystals produced from the first raw material liquid are intermittently formed in the planar direction of the ceramic film, and second crystals produced from the second raw material liquid are formed so as to be interposed between the first crystals by depositing the ceramic film in a state in which the first raw material liquid and the second raw material liquid are phase separated.

A second method for forming the ceramic film which makes up the ferroelectric capacitor comprises:

a step of forming a ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a ferroelectric, and the second raw material liquid is a raw material liquid for producing a layered catalytic oxide in which Si or Si and Ge are provided in the B site, wherein a solvent included in the first raw material liquid and a solvent included in the second raw material liquid have different polarities, and wherein first crystals produced from the first raw material liquid are intermittently formed in the planar direction of the ceramic film, and second crystals produced from the second raw material liquid are formed so as to be interposed between the first crystals by forming a mist of the first raw material liquid so as to be dispersed on a substrate, and forming a film of the second raw material liquid on the substrate.

There are no specific limitations to the first raw material liquid and the second raw material liquid insofar as the liquids have the above configuration. Various types of combinations are possible. Specifically, the manufacturing methods may be applied not only to the case of the above-described ferroelectric having a Bi-type layered perovskite structure or a PZT-type perovskite structure, but also to the case where the first raw material liquid is a raw material liquid for producing a perovskite material, Bi-layer structured material, superconducting oxide material, and tungsten bronze type ferroelectric, the fourth raw material liquid is a raw material liquid for producing a layered catalytic oxide in which Si or Si and Ge are provided in the B site, and the second raw material liquid is a raw material liquid for producing a layered catalytic oxide in which Si or Si and Ge are provided in the B site.

According to the above first and second methods, the first crystals produced from the first or third raw material liquid are intermittently formed in the planar direction of the ceramic film, and the second crystals produced from the second or fourth raw material liquid are formed so as to be interposed between the first crystals. This causes the second crystals (paraelectric, for example) to be disposed to surround the first crystals (ferroelectric, for example). In such a structure, occurrence of domains in the direction at an angle of 90° with respect to the direction of the thickness of the ferroelectric film of the ferroelectric capacitor formed by the upper and lower electrodes and the ferroelectric (generally called 90° domains) can be prevented. As a result, squareness of the hysteresis characteristics of the ferroelectric capacitor can be improved.

A ceramic of the present invention is a complex oxide having an oxygen octahedral structure, and comprises Si and Ge in the oxygen octahedral structure. The ceramic of the present invention may be referred to as a ceramic in which a paraelectric including Si and Ge is dissolved in a complex oxide having an oxygen octahedral structure. Si and Ge included in such an oxygen octahedral structure have a coordination number of six.

The ceramic of the present invention is obtained by replacing metal cations (B site ions) positioned in the oxygen octahedral structure of the complex oxide with an Si ion and a Ge ion. For example, a $(Bi,La)_4(Ti,Si,Ge)_3O_{12}$ ferroelectric of the present invention is obtained by replacing the B site ions with $Si^{4+}$ and $Ge^{4+}$. Such a $(Bi,La)_4(Ti,Si,Ge)_3O_{12}$ structure cannot be easily known from the analogy to $Bi_4Ti_3O_{12}$. Specifically, $Si^{4+}$ and $Ge^{4+}$ have strong covalent bonding properties and are not metal elements. Moreover, it is a common practice to replace an element which makes up a perovskite by using an ion having an ionic radius close to that of the element. However, $Si^{4+}$ has an ionic radius of 0.26 angstrom, which is extremely smaller than the ionic radius of $Ti^{4+}$ (0.6 angstrom). Therefore, it is difficult to consider to replace the B site ions with $Si^{4+}$ and $Ge^{4+}$. Because of this, the present invention overthrows the common knowledge of a conventional ferroelectric material. The ferroelectric material of the present invention completely differs from a conventional ferroelectric material.

Formation of the ceramic of the present invention is remarkably facilitated by replacing part of the B sites of the oxygen octahedron with Si and Ge. Since the ionic radius of Ge is larger than that of Si and close to the lattice spacing of the B site, Ge has remarkably high capability of replacing the B site of the oxygen octahedron in comparison with Si. Since the entire lattice of the oxygen octahedron shrinks or is distorted when Ge enters the B site of the oxygen octahedron, Si easily replaces the B site. In this case, it is important to use Si and Ge at the same time. This is because the introduction of covalent bonding properties into the oxygen octahedron is insufficient only by using Ge, whereby the catalytic function of the paraelectric is insufficient.

The molar ratio of Ge to Si in the ceramic of the present invention is preferably $0<Ge/Si \leq 10$, and still more preferably $0<Ge/Si \leq 1$.

If the ratio of Ge to Si is within the specific range, good surface morphology, crystallinity, and interface can be obtained. In particular, if the ratio is $0<Ge/Si \leq 1$, covalent bonding properties are increased due to a high percentage of Si having a small ionic radius, whereby the reduction resistance is remarkably improved. If the ratio is $0<Ge/Si \leq 10$, since Ge is the same group element as Si and has a large ionic radius for one period, Ge is easily added to the oxygen octahedral structure, whereby the thin film of the present invention can be easily formed. Since Ge has an ionic radius significantly smaller than that of the B site ion of a conventional ferroelectric, sufficient covalent bonding properties are provided in comparison with a conventional ferroelectric. The covalent bonding properties are decreased for an increase in ionic bonding properties in comparison with the case of using only Si.

Figure 45:
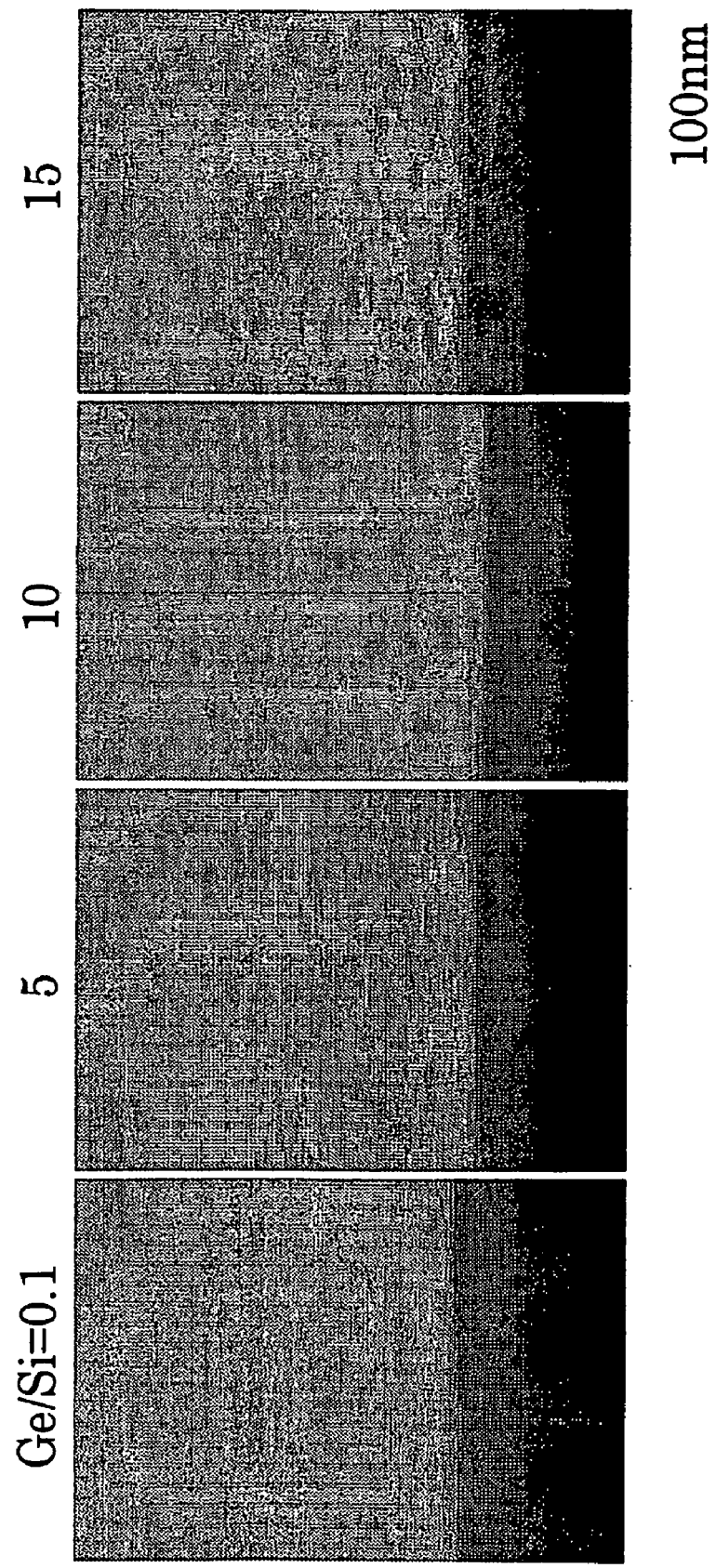
FIG. 45 is a view showing surface morphology of an oxide ferroelectric thin film of the present invention when Ge/Si is 0.1, 5, 10, or 15.
Figure 46:
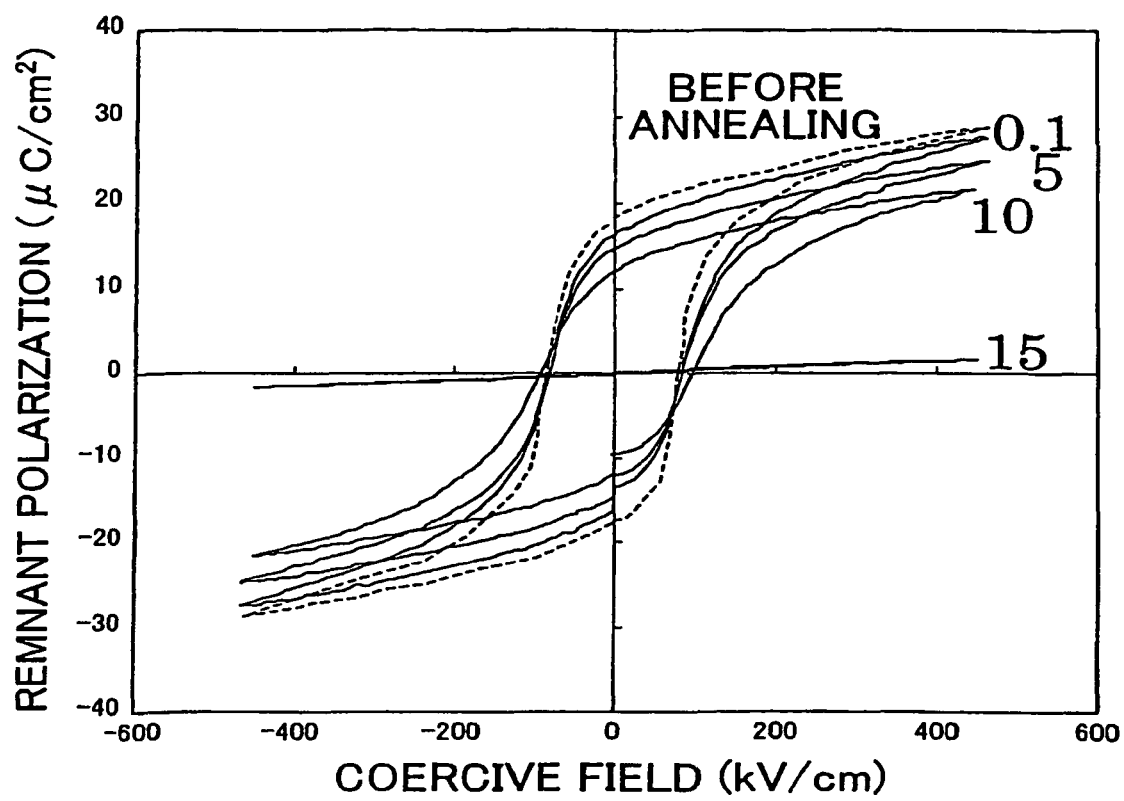
FIG. 46 is a view showing reduction resistance of an oxide ferroelectric thin film of the present invention when Ge/Si is 0.1, 5, 10, or 15.

When the ratio is $10<Ge/Si$, the surface morphology deteriorates as the ratio of Ge to Si is increased, as shown in FIG. 45. The surface morphology significantly deteriorates when Ge/Si=15. When subjected to a heat treatment for 10 minutes in a 3% $H_2$ atmosphere, not only the surface morphology becomes rough, but also the reduction resistance significantly deteriorates, as shown in FIG. 46.

Figure 47:
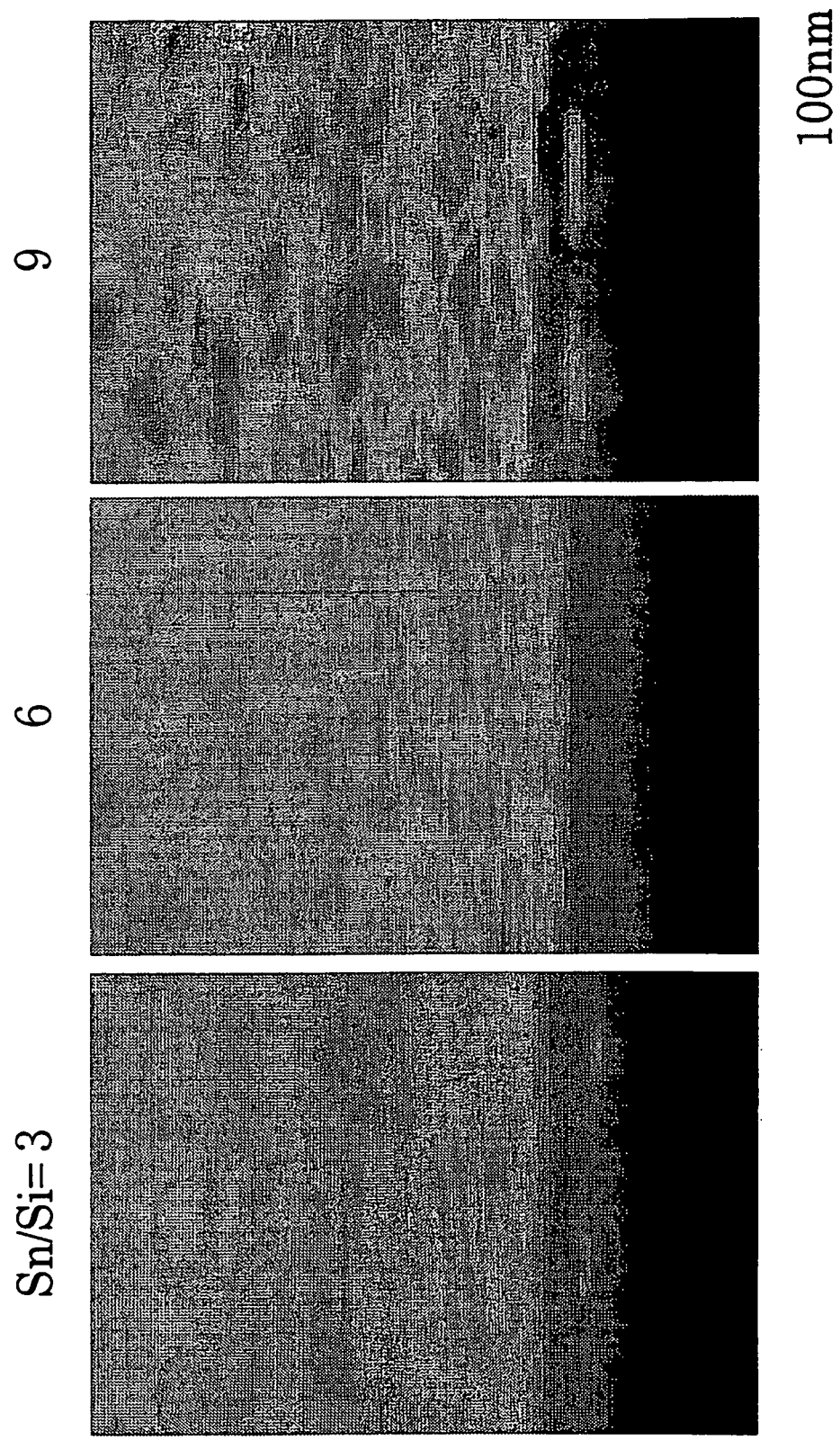
FIG. 47 is a view showing surface morphology of an oxide ferroelectric thin film of the present invention when Sn/Si is 3, 6, or 9.
Figure 48:
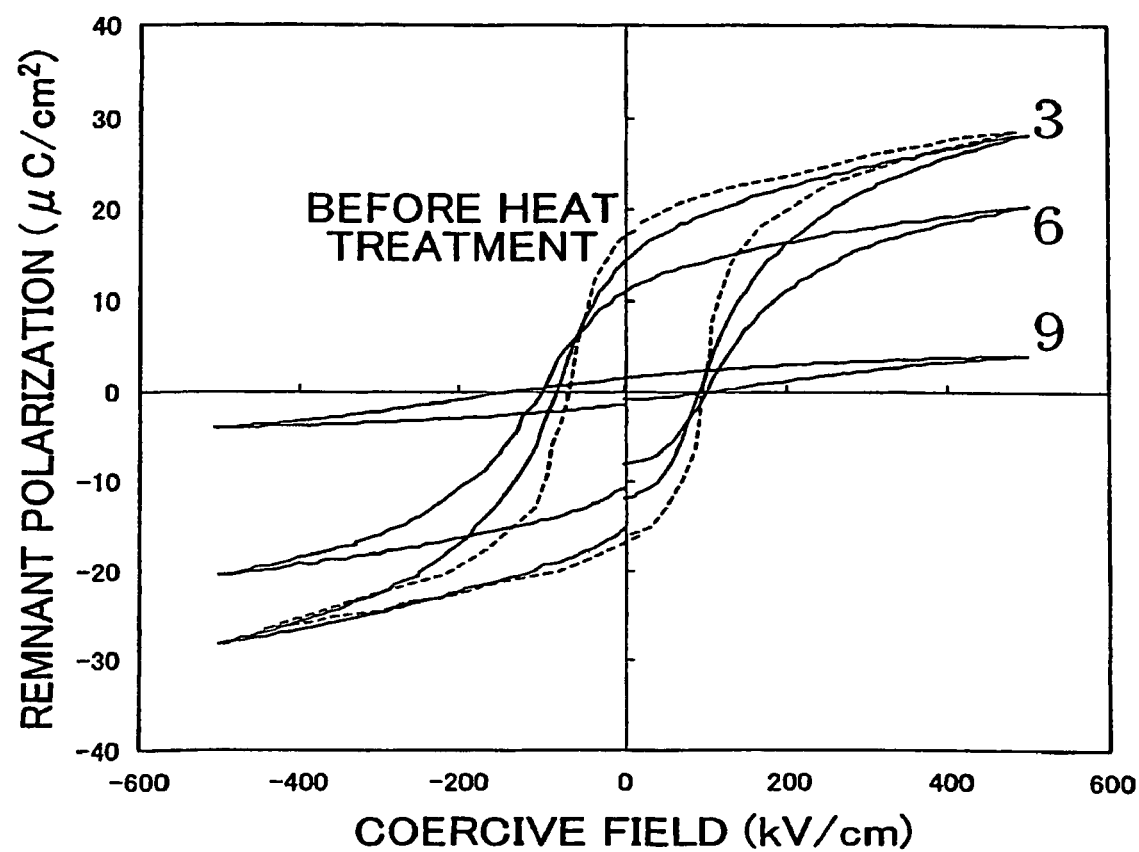
FIG. 48 is a view showing reduction resistance of an oxide ferroelectric thin film of the present invention when Sn/Si is 3, 6, or 9.

In the above example, formation of the thin film of the present invention can be further facilitated by using Sn instead of Ge, since Sn is easily added to the oxygen octahedral structure for a further increase in the ionic radius. In this case, the ratio of Sn to Si is $0<Sn/Si<9$. If the ratio is $9 \leq Sn/Si$, the surface morphology significantly deteriorates as shown in FIG. 47. Moreover, reduction resistance significantly deteriorates when subjected to a heat treatment for 10 minutes in a 3% $H_2$ atmosphere, as shown in FIG. 48.

Figure 49:
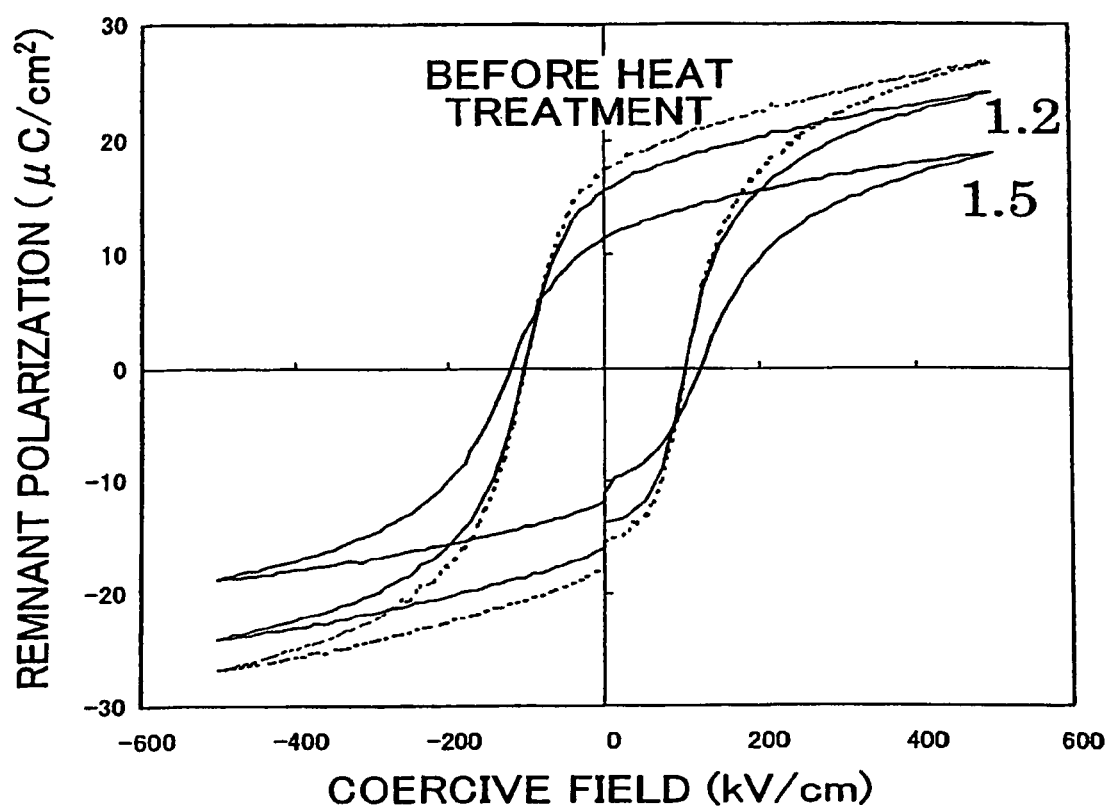
FIG. 49 is a view showing reduction resistance of an oxide ferroelectric thin film of the present invention when $1<(Ge+Sn)/Si \leq 10$ and Ge/Sn is 1.2 or 1.5.

When part of the Ge is replaced with Sn so that $1<(Ge+Sn)/Si \leq 10$ ($Ge/Sn \leq 1.2$), reduction resistance is improved in comparison with the case of using Si and Sn when subjected to a heat treatment for 10 minutes in a 3% $H_2$ atmosphere, as shown in FIG. 49.

The complex oxide having the oxygen octahedral structure may be at least one oxide selected from a perovskite, bismuth-layer structured oxide, superconducting oxide, and tungsten bronze structured oxide, and the paraelectric may be a layered catalytic substance which includes Si and Ge in the constituent elements.

The ceramic of the present invention may be a complex oxide having an oxygen octahedral structure, and comprise a ferroelectric layer which includes Si or Si and Ge, and a paraelectric layer having an oxygen tetrahedral structure which includes Si or Si and Ge in the constituent elements in the oxygen octahedral structure, wherein at least one of the ferroelectric layer and the paraelectric layer may have a column-shaped structure extending in the direction of the film thickness. In this case, the layer having the column-shaped structure may have a diameter of 1 to 50 nm.

The present inventors have found that, when the number of moles of the layered catalytic compound is relatively larger than that of the complex oxide having an oxygen octahedron, an excess layered catalytic compound is separated from the complex oxide having an oxygen octahedron in the direction of the film thickness. Therefore, characteristics such as ferroelectric characteristics can optionally be set by controlling the amount of the layered catalytic compound to be added.

The mixing ratio of the complex oxide material to the paraelectric material (complex oxide material/paraelectric material) is set taking into consideration the above characteristics such as ferroelectric characteristics. For example, if the molar ratio of the complex oxide material to the paraelectric material is 1 or more, characteristics can be controlled by optionally changing the material characteristics of the complex oxide material such as a remanent polarization in the case of using a ferroelectric material. If the molar ratio of the complex oxide material to the paraelectric material is less than 1, the surface morphology, crystallinity, and reduction resistance can be improved without changing the material characteristics of the complex oxide material such as a remanent polarization in the case of using a ferroelectric material.

If at least one of the ferroelectric layer and the paraelectric layer has the column-shaped structure, second crystals (paraelectric, for example) are disposed to surround first crystals (ferroelectric, for example). In such a structure, occurrence of domains in the direction at an angle of 90° with respect to the direction of the thickness of the ferroelectric film of the ferroelectric capacitor (generally called 90° domains) can be prevented. As a result, squareness of the hysteresis characteristics of the ferroelectric capacitor can be improved.

A method of manufacturing a ceramic according to the present invention comprises forming a film which includes a complex oxide material having an oxygen octahedral structure and a paraelectric material having a catalytic effect for the complex oxide material in a mixed state, and subjecting the film to a heat treatment, wherein the paraelectric material is a layered catalytic substance which includes Si in the constituent elements or a layered catalytic substance which includes Si and Ge in the constituent elements.

According to the manufacturing method of the present invention, since initial nuclei occur in the entire film in which the complex oxide material and the paraelectric material are present in a mixed state, coarse particles are rarely grown. Therefore, good surface morphology can be obtained.

According to the manufacturing method of the present invention, covalent bonding properties are increased over the entire crystal lattice by introducing Si and Ge into the oxygen octahedron of various types of complex oxide materials having strong ionic bonding properties such as a perovskite material, bismuth-layer structured material, superconducting oxide material, and tungsten bronze material, whereby resistance to reduction due to hydrogen or the like is increased.

According to the manufacturing method of the present invention, a metal element such as V or W, for which replacement in the crystal lattice is difficult using a coating method such as spin coating, can be easily replaced.

The heat treatment may include sintering and post-annealing, wherein at least the post-annealing may be performed in a pressurized atmosphere containing at least either oxygen or ozone (hereinafter called "oxygen atmosphere"). The post-annealing is preferably performed in a pressurized state such as at 2 atm. or more, and still more preferably at 2 to 9.9 atm. The post-annealing may be performed after forming an electrode on the film in which the complex oxide material and the paraelectric material are present in a mixed state.

The characteristics of the ceramic can be further stabilized and improved by performing post-annealing in such a pressurized oxygen atmosphere.

Oxygen deficiency (shift of XRD peak to higher angle side) in the complex oxide material can be improved by performing pressure annealing in the oxygen atmosphere. Moreover, crystal growth characteristics and leakage current characteristics can be improved. As a result, good ferroelectric characteristics can be stably obtained.

The oxide thin film of the present invention is formed of a mixture of fine crystal particles. Crystal growth is promoted by performing pressure annealing in oxygen at a comparatively low temperature, for example, annealing at 500° C. and 9.9 atm. in a 100% oxygen atmosphere, whereby the structure of the thin film is close to a single crystal structure. Specifically, crystals show behavior similar to epitaxial growth by pressure annealing in the oxygen atmosphere. It is known that oxygen deficiency is improved by performing pressure annealing in a conventional complex oxide material. However, behavior similar to epitaxial growth is peculiar to the complex oxide material of the present invention which includes Si and Ge in the oxygen octahedron.

The heat treatment in the pressurized oxygen atmosphere has a sufficient effect after crystallization. However, it is more effective to perform the heat treatment after providing an upper electrode taking into consideration the interface state between the film and the upper electrode. In the present invention, processing can be performed in an amorphous state which enables easy processing and thermal damage to the element can be minimized by performing crystallization in the pressurized oxygen atmosphere and formation of the upper electrode at the same time.

As the paraelectric material, a compound having an effect of lowering the crystallization temperature of the complex oxide material, specifically, a layered catalytic compound having a crystallization temperature lower than that of the ferroelectric is used.

The paraelectric material preferably includes Si or Si and Ge having a coordination number of four, and has an oxygen tetrahedral structure. Since the layered catalytic compound which includes Si and Ge in the constituent elements has a low crystallization temperature and low density, the layered catalytic compound has high catalytic action. Moreover, the layered catalytic compound has good lattice matching with many oxide materials having an oxygen octahedron. Therefore, the layered catalytic compound which includes Si and Ge is first crystallized in the film, and the complex oxide material is crystallized on the surface of the layered catalytic compound by effectively utilizing the catalytic action of the layered catalytic compound. Specifically, in the present invention, activation energy required for the crystallization of the complex oxide is reduced by using the layered catalytic compound, whereby the crystallization temperature is lowered. By lowering the crystallization temperature, the applied energy can be effective utilized for compensation for oxygen deficiency and crystal growth.

Since the constituent elements of the layered catalytic compound of the present invention replace the A and B sites of the oxygen octahedron therewith when the elements have finished the function as a catalyst, the layered catalytic compound does not essentially allow the layered catalytic compound structure to remain. As a result, since the layered catalytic compound is not formed to separate the film in the direction of the thickness, a decrease in ferroelectric characteristics and electrical characteristics can be prevented.

In the manufacturing method of the present invention, a sol-gel raw material may be used for at least one of the complex oxide material and the paraelectric material. At least one of the complex oxide material and the paraelectric material may be formed by using a complex polymerization method.

In the manufacturing method of the present invention, the film in which the complex oxide material and the paraelectric material are present in a mixed state is formed by any of a solid phase method, coating method, LSMCD method, MOCVD method, and sputtering method. As the coating method, spin coating or the like may be used. At least one of the complex oxide material and the paraelectric material may be provided on a substrate by using a supercritical fluid.

The complex oxide material having an oxygen octahedral structure is at least one material selected from a perovskite material, bismuth-layer structured oxide, superconducting oxide, and tungsten bronze structured oxide, and the paraelectric material is a layered catalytic compound which includes Si in the constituent elements or a layered catalytic compound which includes Si and Ge in the constituent elements.

The complex oxide material having an oxygen octahedral structure may be at least one of a perovskite and bismuth layer structured oxide shown by $ABO_3$ or $(Bi_2O_2)^{2+}(A_{m-1}B_mO_{3m+1})^{2-}$ (wherein A represents at least one element selected from the group consisting of Li, Na, K, Rb, Pb, Ca, Sr, Ba, Bi, La, and Hf, B represents at least one element selected from the group consisting of Ru, Fe, Ti, Zr, Nb, Ta, V, W, and Mo, and m is a natural number of 5 or less), a superconducting oxide shown by $LanBa_2Cu_3O_7$, $Trm_2Ba_2Ca_{n-1}Cu_nO_{2n+4}$, or $TrmBa_2Ca_{n-1}Cu_nO_{2n+3}$ (wherein Lan represents at least one element selected from the group consisting of Y, La, Ce, Pr, Nd, Pm, Sm, Eu, Gd, Th, Dy, Ho, Er, Tm, Yb, and Lu, Trm represents at least one element selected from the group consisting of Bi, Tl, and Hg, and m is a natural number from 1 to 5), and a tungsten bronze structured oxide shown by $A_{0.5}BO_3$ (tetragonal bronze structure) or $A_{0.3}BO_3$ (hexagonal bronze structure) (wherein A represents at least one element selected from the group consisting of Li, Na, K, Rb, Cs, Pb, Ca, Sr, Ba, Bi, and La, and B represents at least one element selected from the group consisting of Ru, Fe, Ti, Zr, Nb, Ta, V, W, and Mo).

The paraelectric material may be a paraelectric material which includes at least one compound selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$, and $V_2O_5$, and $SiO_2$ or $SiO_2$ and $GeO_2$.

The paraelectric material may be a layered compound having an oxygen tetrahedral structure which includes at least one compound selected from the group consisting of $CaSiO_3$, $BaSiO_3$, $PbSiO_3$, $ZnSiO_3$, $MgSiO_3$, $B_2SiO_5$, $Al_2SiO_5$, $Y_2SiO_5$, $La_2SiO_5$, $Cr_2SiO_5$, $Bi_2SiO_5$, $Ga_2SiO_5$, $ZrSiO_4$, $TiSiO_4$, $HfSiO_4$, $NbSiO_4$, $MoSiO_5$, $WSiO_5$, and $V_2SiO_7$, or a layered compound having an oxygen tetrahedral structure which includes at least one compound selected from the group consisting of $CaSiO_3$, $BaSiO_3$, $PbSiO_3$, $ZnSiO_3$, $MgSiO_3$, $B_2SiO_5$, $Al_2SiO_5$, $Y_2SiO_5$, $La_2SiO_5$, $Cr_2SiO_5$, $Bi_2SiO_5$, $Ga_2SiO_5$, $ZrSiO_4$, $TiSiO_4$, $HfSiO_4$, $NbSiO_4$, $MoSiO_5$, $WSiO_5$, and $V_2SiO_7$, and at least one compound selected from the group consisting of $CaGeO_3$, $BaGeO_3$, $PbGeO_3$, $ZnGeO_3$, $MgGeO_3$, $B_2GeO_5$, $Al_2GeO_5$, $Y_2GeO_5$, $La_2GeO_5$, $Cr_2GeO_5$, $Bi_2GeO_5$, $Ga_2GeO_5$, $ZrGeO_4$, $TiGeO_4$, $HfGeO_4$, $NbGeO_4$, $MoGeO_5$, $WGeO_5$, and $V_2GeO_7$.

An oxide material in which the B site of the perovskite, bismuth-layer structured oxide, superconducting oxide, or tungsten bronze structured compound which makes up the complex oxide material is replaced with Si or Si and Ge may be formed in advance by using a complex polymerization method.

A DLC (diamond-like carbon) film may be formed on a substrate, and the film in which the complex oxide material and the paraelectric material are present in a mixed state may be formed on the DLC film.

A dielectric capacitor according to the present invention comprises a lower electrode, a film of the ceramic of the present invention which is formed on the lower electrode, and an upper electrode formed on the ceramic film.

In this dielectric capacitor, at least part of the ceramic may have a column-shaped structure which is continuous between the upper electrode and the lower electrode. The diameter of the column-shaped structure may be 1 to 50 nm.

As examples of the substrate which can be used for the oxide ferroelectric material, thin-film fabrication technology, and application elements of the present invention, a semiconductor substrate such as an element semiconductor such as silicon and germanium and a compound semiconductor such as GaAs and ZnSe, a metal substrate such as Pt, an insulating substrate such as a sapphire substrate, an MgO substrate, $SrTiO_3$, $BaTiO_3$, and a glass substrate, and the like can be given. Of these, a silicon substrate is preferable, and a single crystal silicon substrate is still more preferable.

An electrode may be formed on the substrate. There are no specific limitations to the material for the electrode insofar as the material is a conductive material. The electrode may be formed by using a metal such as Pt, Ir, Au, Al, or Ru, an oxide conductor such as $IrO_2$ and $RuO_2$, a nitride conductor such as TiN and TaN, or the like. The thickness of the electrode is about 100 to 200 nm, for example.

Intermediate layers such as an insulating layer and an adhesive layer may be formed between the electrode and the substrate. The insulating layer may be formed using $SiO_2$, $Si_3N_4$, or the like. There are no specific limitations to the material for the adhesive layer insofar as the adhesive layer can secure bonding strength between the substrate and the electrode or between the insulating layer and the electrode. For example, a high-melting-point metal such as tantalum or titanium may be used. These intermediate layers may be formed by using various methods such as a thermal oxidation method, CVD method, sputtering method, vacuum deposition method, or MOCVD method.

The ceramic of the present invention may be applied to a dielectric capacitor, a semiconductor device, and various types of other devices.

FIG. 1 is a cross-sectional view showing a high-dielectric/ferroelectric capacitor (hereinafter called "ferroelectric capacitor" or "high-dielectric capacitor") which is manufactured by the manufacturing method of the present invention and is used for evaluation of electrical characteristics as described later. In this dielectric capacitor, a silicon thermal oxide film 2 is formed on the surface of an n-type silicon substrate 1 as an interlayer dielectric. A Ti film 3 as an adhesive layer, a Pt lower electrode 4, a ferroelectric film 5 (ceramic) formed of a solid solution of barium strontium titanate which is a perovskite-type ferroelectric material and $TiSiO_4$ and $BaGeO_3$ which are paraelectric materials, and a Pt upper electrode 6 are formed on the silicon thermal oxide film 2 in that order.

Figure 37:
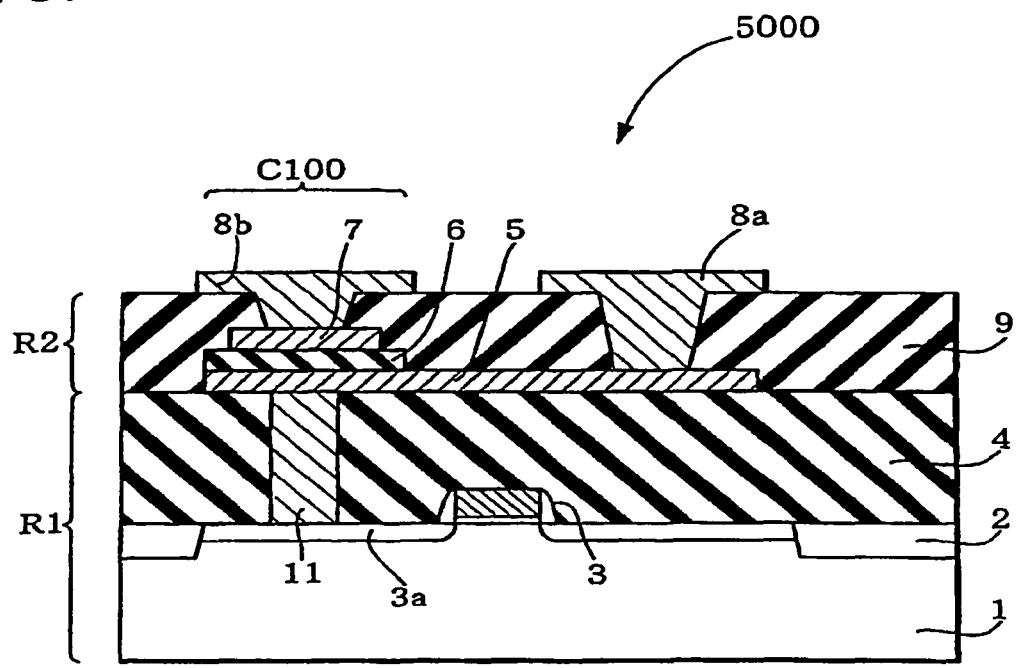
FIG. 37 is a cross-sectional view schematically showing a ferroelectric memory device.

FIG. 37 is a cross-sectional view schematically showing a ferroelectric memory device to which the dielectric capacitor of the present invention is applied.

A ferroelectric memory device 5000 includes a CMOS region R1 and a capacitor region R2 formed on the CMOS region R1. The CMOS region R1 includes a semiconductor substrate 1, an element isolation region 2 and a MOS transistor 3 which are formed on the semiconductor substrate 1, and an interlayer dielectric 4. The capacitor region R2 includes a capacitor C100 consisting of a lower electrode 5, a ferroelectric film 6, and an upper electrode 7, an interconnect layer 8a connected with the lower electrode 5, an interconnect layer 8b connected with the upper electrode 7, and an insulating layer 9. The ferroelectric film 6 of the capacitor C100 is formed by using the method of manufacturing the ceramic of the present invention. An impurity diffusion layer 3a of the MOS transistor 3 and the lower electrode 5 which makes up the capacitor are connected by a contact layer 11 formed of polysilicon or tungsten.

Examples of a method of manufacturing a multilayer ceramic film according to the embodiment are described below.

Example of Manufacture of First Multilayer Ceramic Film

An example of the manufacture of a first multilayer ceramic film is described below. FIG. 39 is a cross-sectional view schematically showing the manufacturing process for the first multilayer ceramic film.

Figure 39A:
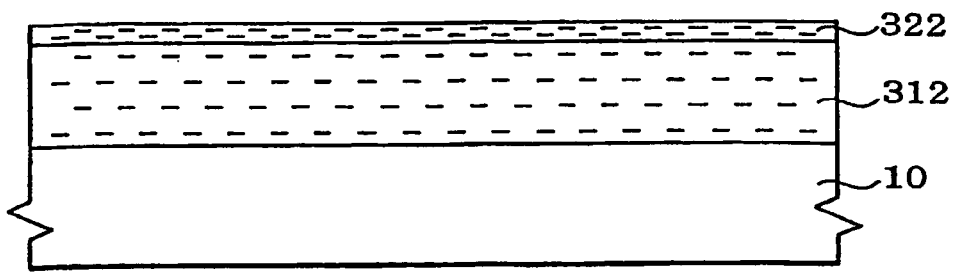
FIGS. 39A to 39C are conceptual views schematically showing a manufacturing process for a first multilayer ceramic film.
Figure 39A:

As shown in FIG. 39A, a main liquid layer 312 for producing a ferroelectric is formed on the substrate 10 by using a coating method. As the material for the main liquid layer 312, the first raw material liquid in the second embodiment and the third raw material liquid in the third embodiment can be given.

A secondary liquid layer 322 for producing either a ferroelectric or a paraelectric is formed on the main liquid layer 312. As the material for the secondary liquid layer 322, a material having a crystallization temperature lower than that of the material for the main liquid layer 312 is selected. In addition, a material which produces an oxide having no layered structure after crystallization is selected as the material for the secondary liquid layer 322. The material for the secondary liquid layer 322 differs depending upon the material for the main liquid layer 312. In the case where an SBT-type ferroelectric is formed by crystallizing the main liquid layer 312, the material for the secondary liquid layer 322a is a BiGeO-type material, BiSiO-type material, or SrGeO-type material, for example.

Figure 39B:
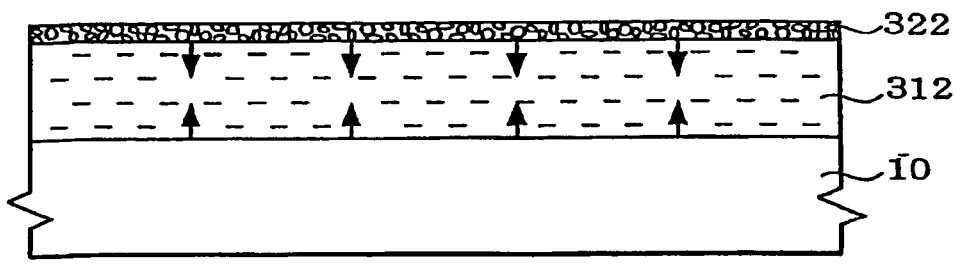
Figure 39B:
Figure 39C:
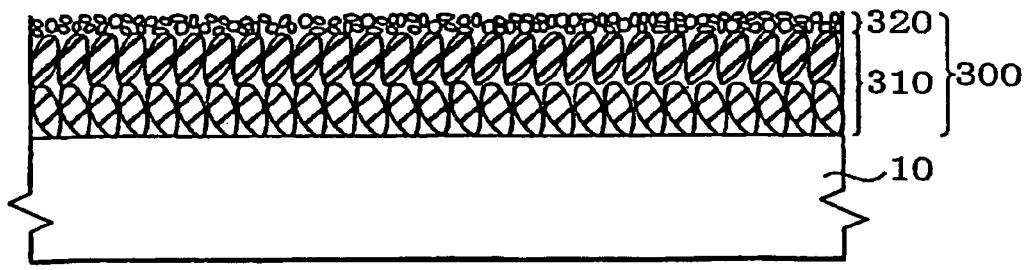

As shown in FIG. 39C, the main liquid layer 312 and the secondary liquid layer 322 are crystallized by performing a heat treatment, whereby a ceramic film 300 consisting of a main crystal layer 310 and a secondary crystal layer 320 is formed.

According to the example of the manufacture of the first multilayer ceramic film, the following effects are obtained.

A material having a crystallization temperature lower than that of the main liquid layer 312 is selected as the material for the secondary liquid layer 322. Therefore, the secondary liquid layer 322 is crystallized before the main liquid layer 312 at an initial stage of crystallization, as shown in FIG. 39B. As a result, crystals produced in the secondary liquid layer 322 function as seeds during the crystallization of the main liquid layer 312. Therefore, crystallization of the main liquid layer 312 proceeds in the direction from the secondary liquid layer 322 and from the substrate 10. This enables the grain size of crystals produced in the main liquid layer 312 to be decreased.

As the material for the secondary liquid layer 322, a material which produces an oxide having no layered structure after crystallization is selected. Therefore, crystals are isotropically grown in the secondary liquid layer 322. As a result, a secondary crystal layer 320 with a flat surface is formed, whereby the surface morphology of the ceramic film 300 can be improved.

Figure 40A:
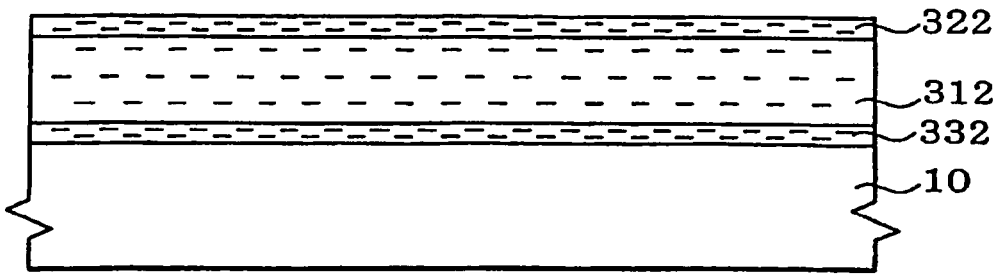
FIGS. 40A to 40C are conceptual views schematically showing a manufacturing process for a second multilayer ceramic film.
Figure 40A:
Figure 40B:
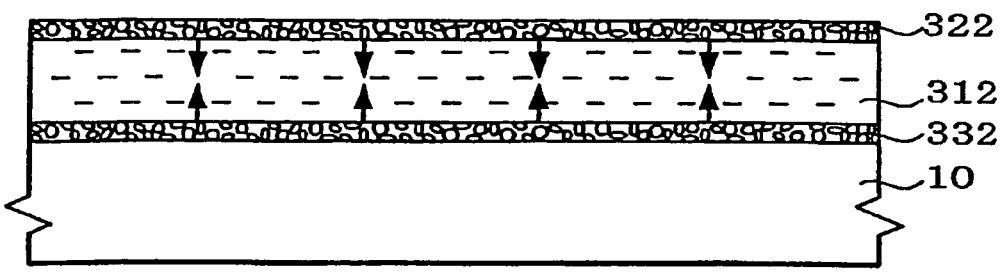
Figure 40B:
Figure 40C:
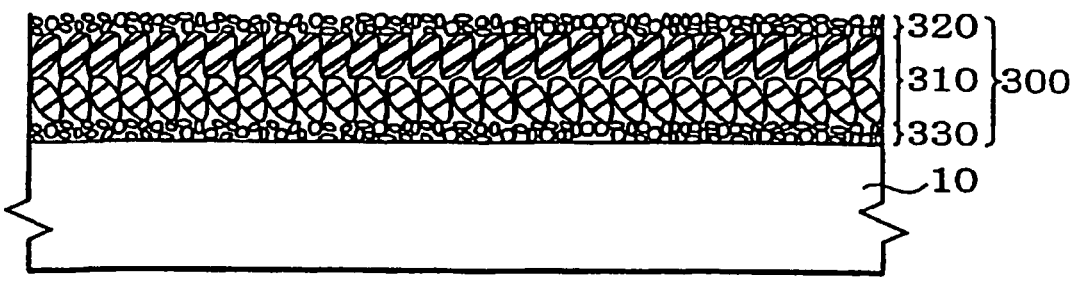

The ceramic film 300 consisting of the main crystal layer 310 and secondary crystal layers 320 and 330 may be formed by allowing a secondary liquid layer 332 to be interposed between the substrate 10 and the main liquid layer 312, as shown in FIG. 40A.

Example of Manufacture of Second Multilayer Ceramic Film

Figure 41A:
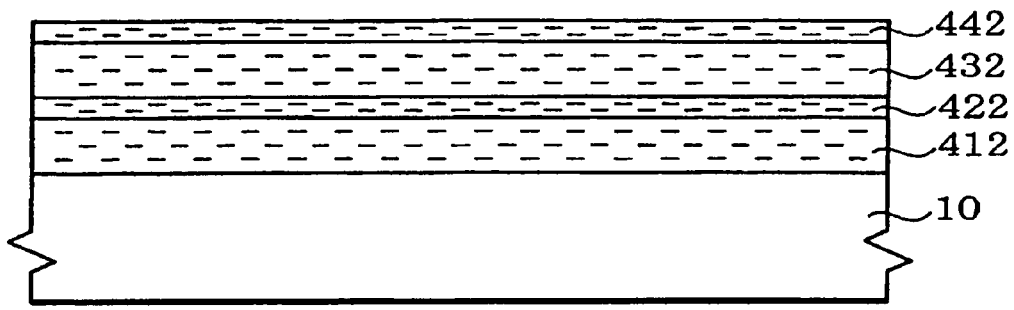
FIGS. 41A to 41C are conceptual views schematically showing a manufacturing process for a third multilayer ceramic film.
Figure 41B:
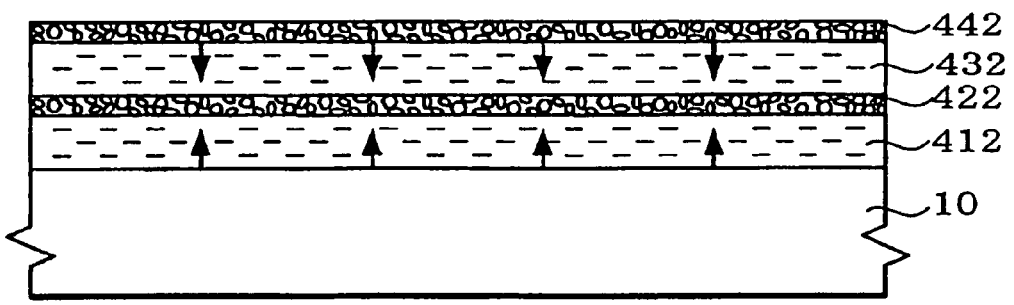
Figure 41C:
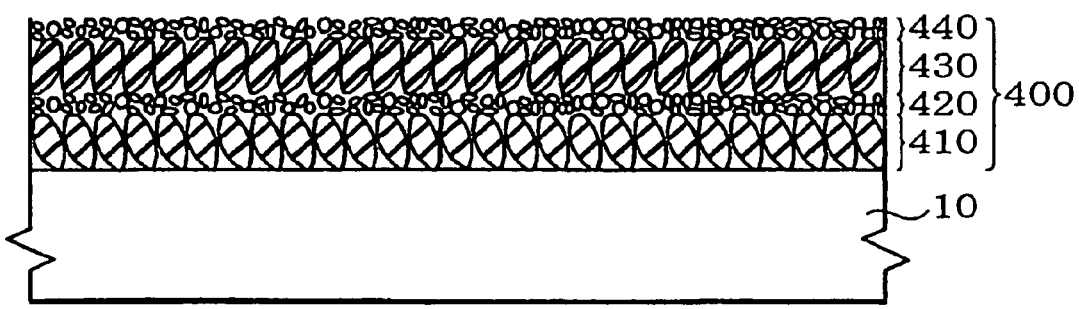

An example of the manufacture of a second multilayer ceramic film is described below. FIG. 41 is a cross-sectional view schematically showing the manufacturing process for the second multilayer ceramic film.

The example of the manufacture of the second multilayer ceramic film differs from the example of the manufacture of the first multilayer ceramic film in that a secondary liquid layer 422 is interposed between main liquid layers 412 and 432.

Specifically, the main liquid layer 412, secondary liquid layer 422, main liquid layer 432, and secondary liquid layer 442 are layered on the substrate 10 in that order. A ceramic film 400 consisting of main crystal layers 410 and 430 and secondary crystal layers 420 and 440 are formed by crystallizing these layers.

As the material for the secondary liquid layers 422 and 442, a material having a crystallization temperature lower than those of the main liquid layers 412 and 432 is selected in the same manner as in the example of the manufacture of the first multilayer ceramic film.

Crystals produced in the secondary liquid layer 422 function as a stopper for preventing crystal growth in the main liquid layers 412 and 432 by allowing the secondary liquid layer 422 to be interposed between the main liquid layers 412 and 432. Therefore, the grain size of crystals in the main crystal layers 410 and 430 formed on opposite sides of the secondary crystal layer 420 can be decreased.

Example of Manufacture of Third Multilayer Ceramic Film

Figure 42A:
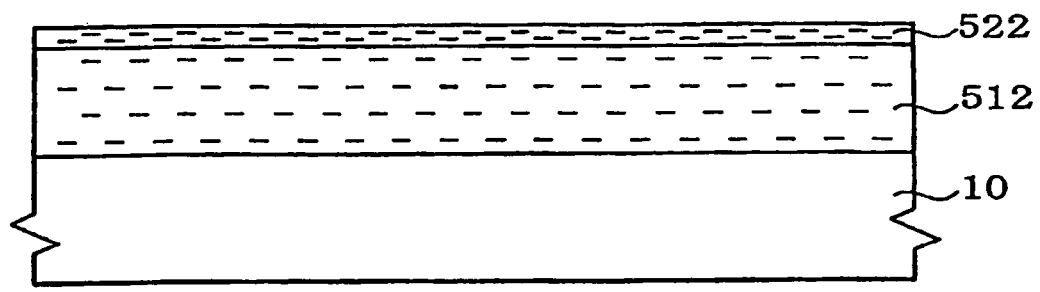
FIGS. 42A and 42B are conceptual views schematically showing a manufacturing process for a fourth multilayer ceramic film.
Figure 42A:
Figure 42B:
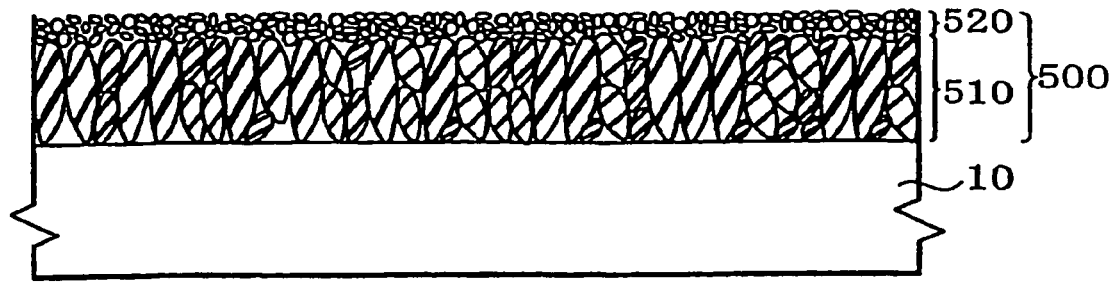

An example of the manufacture of a third multilayer ceramic film is described below. FIG. 42 is a cross-sectional view schematically showing the manufacturing process for the third multilayer ceramic film.

The example of the manufacture of the third multilayer ceramic film differs from the example of the manufacture of the first multilayer ceramic film in that a material for a main liquid layer 512 has a crystallization temperature lower than that of the material for a secondary liquid layer 522.

As the material for the main liquid layer 512, the first raw material liquid in the second embodiment and the third raw material liquid in the third embodiment can be given. In the case where the material for the main liquid layer 512 produces a PZT-type ferroelectric, the material for the secondary liquid layer 522 may be a PbWO-type material or a PbMoO-type material.

A ceramic film having improved surface morphology can be formed by crystallizing the main liquid layer 512 and the secondary liquid layer 522. The reasons therefor are as follows. The material for the main liquid layer 512 has a crystallization temperature lower than that of the material for the secondary liquid layer 522. Therefore, crystallization of the secondary liquid layer 522 proceeds after the crystallization of the main liquid layer 512, whereby the crystals produced from the secondary liquid layer 522 cover a main crystal layer 510 produced from the main liquid layer 512. Since the crystals produced from the secondary liquid layer 522 do not have a layered structure, crystals produced from the secondary liquid layer 522 are isotropically grown. Therefore, a secondary crystal layer 520 with a flat surface is formed. As a result, unevenness of the surface of a ceramic film 500 is decreased, whereby the surface morphology of the ceramic film 500 can be improved.

In the examples of the manufacture of the first to third multilayer ceramic films, crystal grains produced from the main liquid layer and crystal grains produced from the secondary liquid layer may be diffused into different crystal layers. Moreover, a constituent metal element of the main liquid layer may be diffused into the secondary liquid layer, or a constituent metal element of the secondary liquid layer may be diffused into the main liquid layer. Therefore, there may be a case where the interface between the main crystal layer produced from the main liquid layer and the secondary crystal layer produced from the secondary liquid layer is not distinguishable.

Generally, the crystallization temperature has a correlation with the melting point. Specifically, in the case where one of the crystals has a crystallization temperature higher than that of the other crystal, the crystal having a higher crystallization temperature generally has a melting point higher than that of the other crystal.

Semiconductor Device

A semiconductor device to which a ceramic film obtained by using the method of manufacturing a ceramic film of the present invention is applied is described below. This embodiment illustrates a ferroelectric memory device as an example of the semiconductor device. FIG. 37 is a cross-sectional view schematically showing a ferroelectric memory device.

A ferroelectric memory device 5000 includes a CMOS region R1, and a capacitor region R2 formed on the CMOS region R1. The CMOS region R1 includes a semiconductor substrate 1, an element isolation region 2 and a MOS transistor 3 which are formed on the semiconductor substrate 1, and an interlayer dielectric 4. The capacitor region R2 includes a capacitor C100 consisting of a lower electrode 5, a ferroelectric film 6, and an upper electrode 7, an interconnect layer 8*a* connected with the lower electrode 5, an interconnect layer 8*b* connected with the upper electrode 7, and an insulating layer 9. The ferroelectric film 6 in the capacitor C100 is formed by using the method of manufacturing a ceramic film of the present invention. An impurity diffusion layer 3*a* of the MOS transistor 3 and the lower electrode 5 which makes up the capacitor are connected by a contact layer 11 formed of polysilicon or tungsten.

In this embodiment, the ferroelectric film 6 of the ferroelectric memory device 5000 is formed of the ceramic of the present invention. Therefore, the ferroelectric film 6 has improved surface morphology. As a result, the thickness of the ferroelectric film 6 can be decreased to such an extent that the surface morphology of the ferroelectric film 6 is improved. Therefore, according to the ferroelectric memory device 5000, a higher degree of integration can be achieved.

A semiconductor device to which the ceramic of the present invention can be applied is not limited to the ferroelectric memory. The ceramic of the present invention may be applied to various types of semiconductor devices such as a DRAM, MIS-type transistor, or MFS-type transistor. In more detail, the ceramic of the present invention may be applied to a dielectric film of a capacitor for a DRAM or a gate insulating film of an MIS-type or MFS-type transistor.

The ceramic of the present invention may be applied not only to semiconductor devices, but also to other applications such as a piezoelectric for piezoelectric devices used for actuators, optical modulators, or ultrasonic sensors.

The present invention may have the following features.

First Ceramic Raw Material Liquid

The first ceramic raw material liquid is used by mixing the first raw material liquid and the second raw material liquid. The first ceramic raw material liquid may be a raw material liquid which produces a ceramic film by pyrolysis. The first raw material liquid and the second raw material liquid produce different types of materials. The first raw material liquid and the second raw material liquid may be 1) a liquid in which a metal organic compound (metal alkoxide, metal carboxylate, for example), or a metal inorganic compound (metal nitrate, metal chloride, for example) is dissolved in a solvent (water, alcohol, ester, aliphatic hydrocarbon, aromatic hydrocarbon, ketone, ether, mixture of these, for example), 2) a liquid obtained by subjecting a metal compound to hydrolysis, condensation, and the like in a solvent, or 3) a sol-gel liquid obtained by hydrolysis of a metal alkoxide, for example.

The first raw material liquid and the second raw material liquid are described below in detail.

The first raw material liquid is a raw material liquid for producing a ferroelectric having a Bi-type layered perovskite structure. As examples of a ferroelectric having a Bi-type layered perovskite structure, SrBiTaO-type ferroelectrics ($SrBi_2Ta_2O_9$, for example), BiLaTiO-type ferroelectrics ($Bi_{3.25}La_{0.75}Ti_3O_{12}$, for example), and BiTiO-type ferroelectrics ($Bi_4Ti_3O_{12}$, for example) can be given. The first raw material liquid includes a metal element which makes up a ferroelectric. The amount of the constituent metal element for a ferroelectric included in the first raw material liquid is determined taking into consideration the amount of the desired ferroelectric and the ratio of the number of atoms of the constituent metal elements in the desired ferroelectric.

As specific examples of the first raw material liquid, in the case of producing an SrBiTaO-type ferroelectric, a liquid in which solutions of an alkoxide of strontium, an alkoxide of bismuth, and an alkoxide of tantalum are mixed in 2-methoxyethanol can be given. The concentrations of the alkoxide of strontium, alkoxide of bismuth, and alkoxide of tantalum in the first raw material liquid may be 0.05 mol/l, 0.1 mol/l, and 1.0 mol/l, respectively. Specifically, the concentrations may be set so that 0.05 mol of an $SrBi_2Ta_2O_9$ ferroelectric is produced per liter of the first raw material liquid.

The second raw material liquid is a raw material liquid for producing an ABO-type oxide in which Bi is provided in the A site. If Bi is not provided in the A site, elements other than Bi may be positioned at the site of the Bi-type layered perovskite structure at which Bi should be positioned, whereby the characteristics of the ferroelectric film may be adversely affected. As examples of the ABO-type oxide in which Bi is provided in the A site, BiGeO-type oxides ($Bi_4Ge_3O_{12}$, for example), BiMoO-type oxides ($Bi_2MoO_6$), BiVO-type oxides ($Bi_2VO_6$), BiCrO-type oxides ($Bi_2CrO_6$), BiSiO-type oxides ($Bi_4Si_3O_{12}$), and BiWO-type oxides ($Bi_4W_3O_{12}$) can be given. The crystallization temperature of the crystals produced from the second raw material liquid can be changed by changing an element in the B site of the ABO-type oxide. The ABO-type oxide may be either a ferroelectric or a paraelectric. The above oxides may be used individually or in combination of two or more.

The second raw material liquid includes a metal element which makes up the ABO-type oxide. The amount of the constituent metal element for the ABO-type oxide included in the second raw material liquid is determined taking into consideration the amount of the desired ABO-type oxide and the ratio of the number of atoms of the constituent metal elements in the desired ABO-type oxide.

As specific examples of the second raw material liquid, in the case of a BiGeO-type oxide, a liquid in which solutions of an alkoxide of bismuth and an alkoxide of germanium are mixed in 2-methoxyethanol can be given. The concentrations of the alkoxide of bismuth and alkoxide of germanium in the second raw material liquid may be 0.20 mol/l and 0.15 mol/l, respectively. Specifically, the concentrations of the alkoxide of bismuth and alkoxide of germanium may be set so that 0.05 mol of a $Bi_4Ge_3O_{12}$ oxide is produced per liter of the second raw material liquid.

The first raw material liquid and the second raw material liquid are preferably mixed so that the molar ratio of the ferroelectric produced from the first raw material liquid to the ABO-type oxide produced from the second raw material liquid is from 100:20 to 100:100.

Example of Manufacture of Ceramic Film

A ceramic film may be formed by using the ceramic raw material liquid of this embodiment as follows, for example.

(a) A substrate is subjected to a heat treatment. This heat treatment is performed to remove moisture present on the surface of the substrate. The heat treatment temperature is 180° C., for example.

b) The ceramic raw material liquid is applied to the substrate, thereby forming a ceramic raw material body layer. As the formation method, spin coating, dipping, and LSMCD can be given.

(c) A solvent in the ceramic raw material body layer is evaporated by performing a drying heat treatment. The solvent may be evaporated in a nitrogen atmosphere. The temperature of drying heat treatment is 160° C., for example.

(d) The ceramic raw material body layer is subjected to a cleaning heat treatment. This heat treatment causes organic substances present in the ceramic raw material body layer to be decomposed. The organic substances may be decomposed in a nitrogen atmosphere. The heat treatment temperature is 260° C., for example.

(e) The ceramic raw material body layer is presintered. Crystal nuclei are formed during presintering. Presintering may be performed in an oxygen atmosphere by RTA, for example.

(f) The ceramic raw material body layer is sintered. Sintering may be performed in an oxygen atmosphere by FA, for example.

A cycle consisting of the steps (a) to (e) may be repeated two or more times.

Effects obtained by depositing a ceramic film by using the ceramic raw material liquid according to this embodiment are described below.

(1) In the case of forming a ferroelectric (SBT) film by sintering the ceramic raw material liquid consisting only of the first raw material liquid, desired characteristics (remanent polarization, for example) required for the ferroelectric film cannot be obtained at a sintering temperature of about 700° C.

However, in the case of forming a ceramic film by sintering the first ceramic raw material liquid in a state in which the first raw material liquid and the second raw material liquid are mixed, desired characteristics required for the ferroelectric film can be obtained even at a sintering temperature of about 500° C., as described later. According to this embodiment, a ferroelectric film having the desired characteristics can be formed at a lower temperature.

(2) The first raw material liquid and the second raw material liquid produce different types of materials. Therefore, a crystallization temperature at which the first raw material liquid is crystallized differs from a crystallization temperature at which the second raw material liquid is crystallized, for example. As a result, one of the raw material liquids can be crystallized prior to the other raw material liquid. This enables formation of a ceramic film with improved surface morphology.

The above embodiment may have the following features.

(1) A ceramic film may be formed by repeating the above manufacturing steps for a ceramic film two or more times. A ceramic film may be formed by combining the above manufacturing steps for a ceramic film and manufacturing steps for a ceramic film using a conventional ceramic raw material.

Figure 38:
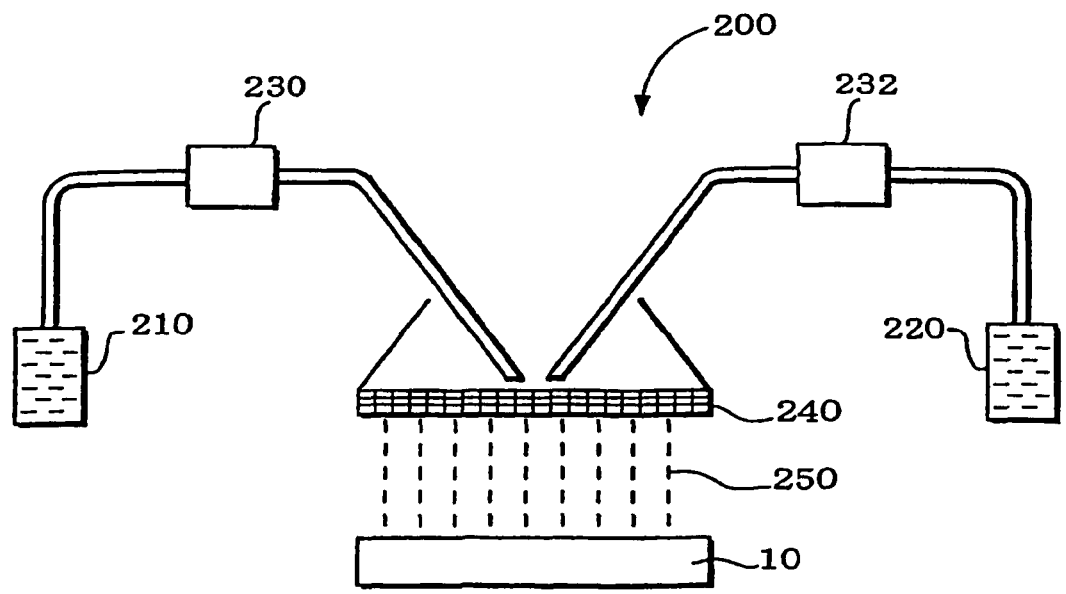
FIG. 38 is a cross-sectional view schematically showing an apparatus for forming a raw material body on a substrate by using an LSMCD method.

(2) As the method for forming the raw material body on the substrate by using the LSMCD method, a method described below can be given. FIG. 38 is a cross-sectional view schematically showing an apparatus 200 for forming the raw material body on the substrate by using the LSMCD method.

The first raw material liquid 210 is sent to a mesh 240 through an atomizer 230. The first raw material liquid 210 passing through the mesh 240 forms a mist 250 and is supplied to the substrate 10. The second raw material liquid 220 is sent to the mesh 240 through an atomizer 232. The second raw material liquid 220 passing through the mesh 240 forms the mist 250 and is supplied to the substrate 10. The mist 250 is deposited on the substrate 10, whereby the raw material body is formed. The diameter of droplets of the mist 250 is 10 to 200 nm, for example.

The first raw material liquid 210 and the second raw material liquid 220 may be supplied to the substrate 10 at the same time. Or, the first raw material liquid 210 and the second raw material liquid 220 may be supplied alternately.

In the case of supplying the first raw material liquid 210 and the second raw material liquid 220 to the substrate 10 at the same time, the resulting raw material body has a structure in which a first mist produced from the first raw material liquid 210 and a second mist produced from the second raw material liquid 220 are present in a mixed state.

The present invention may have the following features.

Second Ceramic Raw Material Liquid

A second ceramic raw material liquid is used by mixing a third raw material liquid and a fourth raw material liquid. The second ceramic raw material liquid may be a raw material liquid which produces a ceramic film by pyrolysis. The third raw material liquid and the fourth raw material liquid produce different types of materials. The third raw material liquid and the fourth raw material liquid may be 1) a liquid in which a metal organic compound (metal alkoxide, metal carboxylate, for example) or a metal inorganic compound (metal nitrate, metal chloride, for example) is dissolved in a solvent (water, alcohol, ester, aliphatic hydrocarbon, aromatic hydrocarbon, ketone, ether, mixture of these, for example), 2) a liquid obtained by subjecting a metal compound to hydrolysis, condensation, and the like in a solvent, or 3) a sol-gel liquid obtained by hydrolysis of a metal alkoxide, for example.

The third raw material liquid and the fourth raw material liquid are described below in detail.

The third raw material liquid is a raw material liquid for producing a PZT-type ferroelectric. As examples of PZT-type ferroelectrics, PbZrTiO-type ferroelectrics ($PbZr_yTi_{1-1}O_3$, for example) and PbLaZrTiO-type ferroelectrics ($Pb_{1-x}La_xZr_yTi_{1-y}O_3$ for example) can be given. The third raw material liquid includes metal elements which make up a ferroelectric. The amount of constituent metal elements for a ferroelectric in the third raw material liquid is determined taking into consideration the amount of desired ferroelectric and the ratio of the number of atoms of the constituent metal elements in the desired ferroelectric.

As specific examples of the third raw material liquid, taking a PbZrTiO-type ferroelectric as an example, a liquid in which lead acetate trihydrate, zirconium butoxide, and titanium isopropoxide are mixed in 1-methoxy-2-propanol can be given. The amount of lead acetate trihydrate, zirconium butoxide, and titanium isopropoxide is determined taking into consideration the ratio of the number of atoms of the constituent metal elements in the desired ferroelectric and the amount of the desired ferroelectric.

The fourth raw material liquid is a raw material liquid for producing an ABO-type oxide in which Pb is provided in the A site. If Pb is not provided in the A site, elements other than Pb may be positioned at the site of the PZT-type oxide at which Pb should be positioned, whereby the characteristics of the ferroelectric film may be adversely affected. As examples of the ABO-type oxide in which Pb is provided in the A site, PbGeO-type oxides ($Pb_5Ge_3O_{11}$), PbMoO-type oxides ($Pb_2MoO_5$), PbVO-type oxides ($Pb_2VO_5$), PbCrO-type oxides ($Pb_2CrO_5$), PbSiO-type oxides ($Pb_5Si_3O_{11}$), PbWO-type oxides ($Pb_2WO_5$), PbSnO-type oxides ($PbSnO_3$), and PbGeSiO-type oxides ($Pb_5Ge_2SiO_{11}$) can be given. These oxides may be used individually or in combination of two or more. The crystallization temperature of the crystals produced from the second raw material liquid can be changed by changing an element in the B site of the ABO-type oxide. The ABO-type oxide may be either a ferroelectric or a paraelectric.

As specific examples of the fourth raw material liquid, taking a PbGeO-type oxide as an example, a liquid in which germanium ethoxide and lead butoxide are mixed in 1-methoxy-2-propanol can be given. The amount of germanium ethoxide and lead butoxide is determined taking into consideration the ratio of the number of atoms of the constituent metal elements in a desired oxide and the amount of the desired oxide.

The third raw material liquid and the fourth raw material liquid are preferably mixed so that the molar ratio of the ferroelectric obtained from the third raw material liquid to the ABO-type oxide obtained from the fourth raw material liquid is from 100:20 to 100:100.

A ceramic film can be formed by using the second ceramic raw material liquid in the same manner as in the case of using the first ceramic raw material liquid. In this embodiment, effects the same as those of the first ceramic raw material liquid can be obtained.

The present invention is described below by examples.

Example 1

In this example, a $Bi_4Ti_3O_{12}$ (BIT) film, a $Bi_{3.3}La_{0.7}Si_{0.7}Ti_{2.25}O_{12}$ (BLST) film, and a $Bi_{3.3}La_{0.7}Si_{0.35}Ge_{0.35}Ti_{2.25}O_{12}$ (BLSGT) film formed on a Pt electrode were examined. In this example, a pressure post-annealing step was not performed.

A sol-gel solution for forming a $(Bi,La)_4(Si,Ge,Ti)_3O_{12}$ ferroelectric was prepared by mixing a sol-gel solution for forming BIT and sol-gel solutions for forming $La_2SiO_5$ and $La_2GeO_5$. $La_2SiO_5$ (LSO) and $La_2GeO_5$ (LGO) are layered catalytic oxides.

A sol-gel solution for forming BLST is a solution in which 0.2 mol of LSO was added to 1 mol of the BIT sol-gel solution. A sol-gel solution for forming BLSGT is a solution in which 0.1 mol of LSO and 0.1 mol of LGO were added to 1 mol of the BIT sol-gel solution.

As a substrate, an Si substrate coated with Pt (Pt/Si substrate) was used. Thin films with a thickness of 100 nm were formed using the sol-gel solutions for forming a ferroelectric prepared by the above procedure by using spin coating as the deposition method under the following conditions. Crystallization was performed at 550° C., 600° C., or 650° C. for 20 minutes in oxygen at 1 atm.

Formation conditions for ferroelectric thin film:
(a) Spin coating (500 rpm for 5 sec., 4000 rpm for 20 sec.)
(b) Drying (150° C. for 2 min. in air)
(c) Presintering (400° C. for 5 min. in air)
(d) Sintering (crystallization) (550° C., 600° C., 650° C. for 20 min. by RTA in $O_2$ at 1 atm)

After sequentially repeating the steps (a), (b), and (c) four times, the step (d) was performed.

Figure 2:
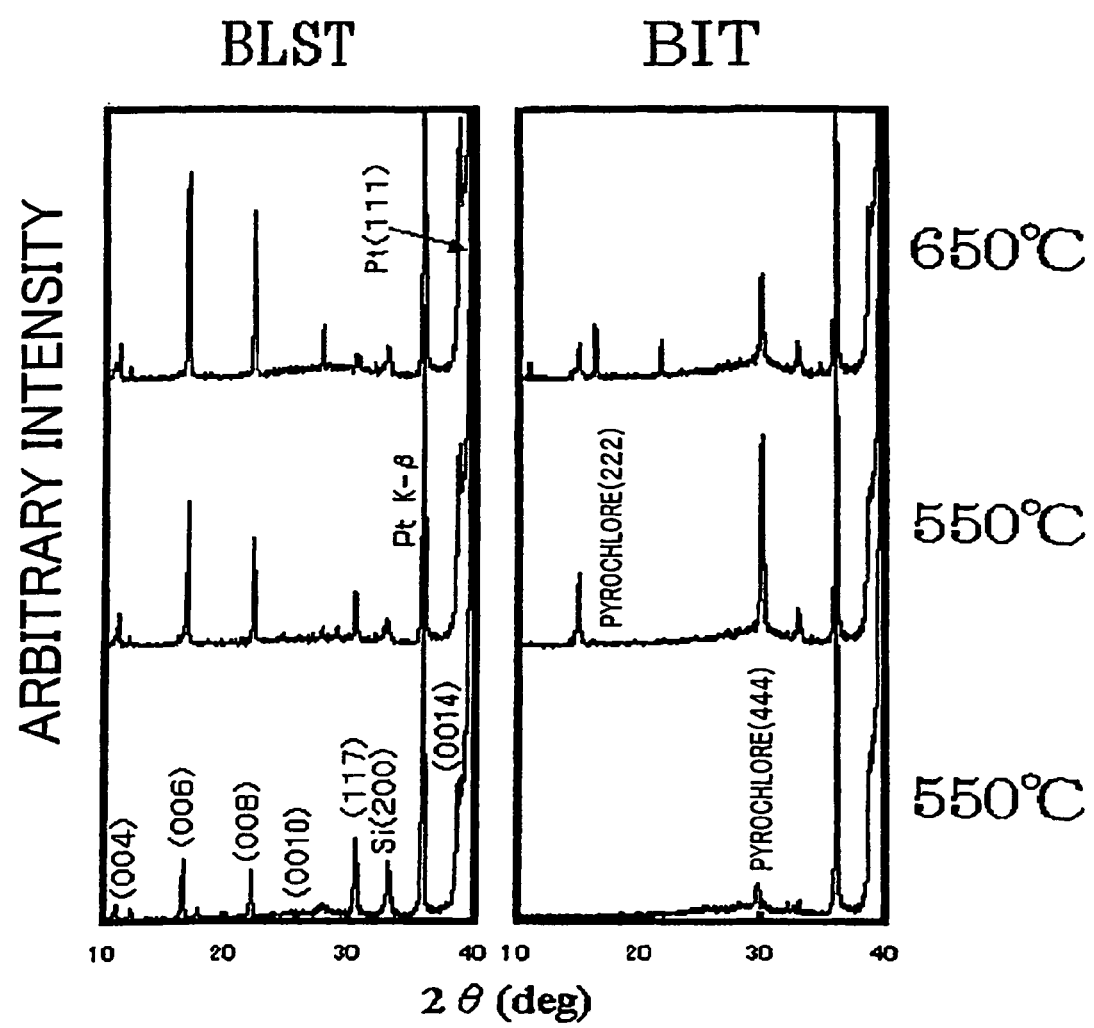
FIG. 2 is a view showing an XRD pattern of a ferroelectric BIT containing Si of the present invention.
Figure 50:
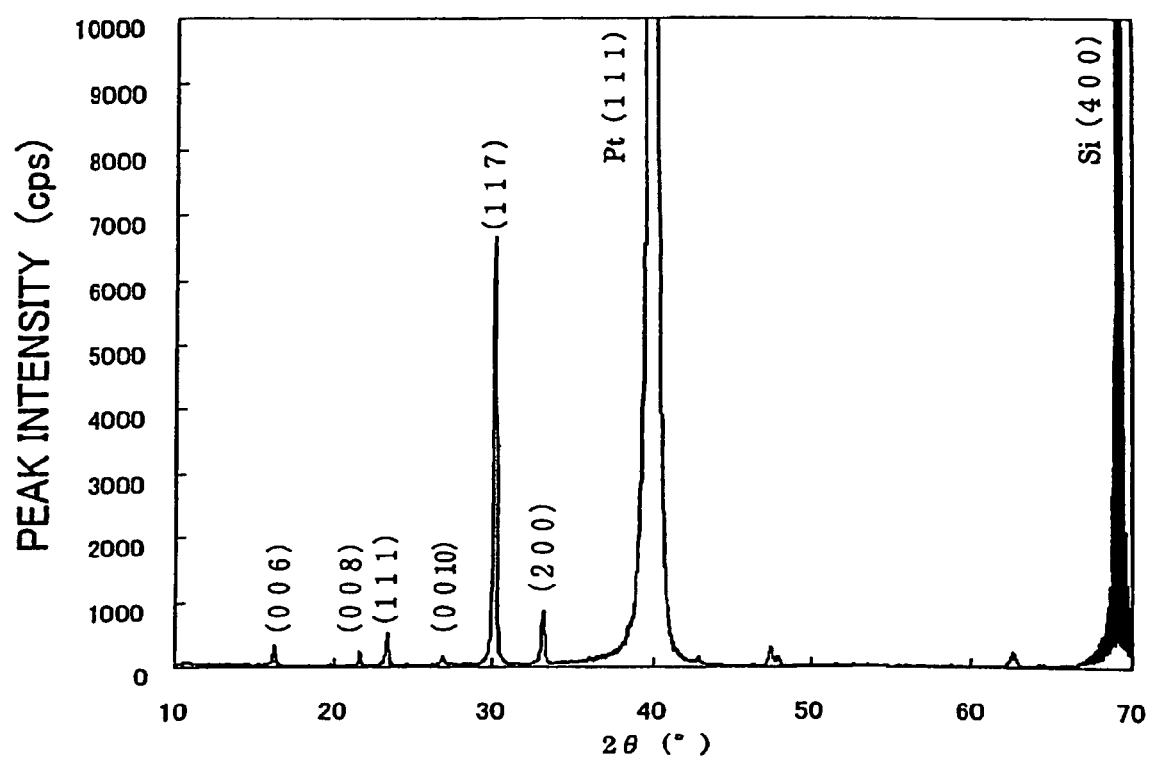
FIG. 50 is a view showing an XRD pattern of a ferroelectric BIT containing Si and Ge of the present invention.

FIG. 2 shows XRD patterns of the ferroelectric thin films obtained in this example. As shown in FIG. 2, $Bi_4Ti_3O_{12}$ was crystallized to only a small extent since a paraelectric pyrochlore phase was present even at 650° C. However, BLST and BLSGT were crystallized since the peaks of the catalytic oxide disappeared. BLST was a randomly orientated film consisting of (117) and (001), as shown in FIG. 2. BLSGT was a randomly orientated film including a large amount of (117) components, as shown in FIG. 50.

A Pt upper electrode was formed on the thin films to obtain ferroelectric capacitors. Ferroelectric characteristics of these samples were evaluated.

Figure 3:
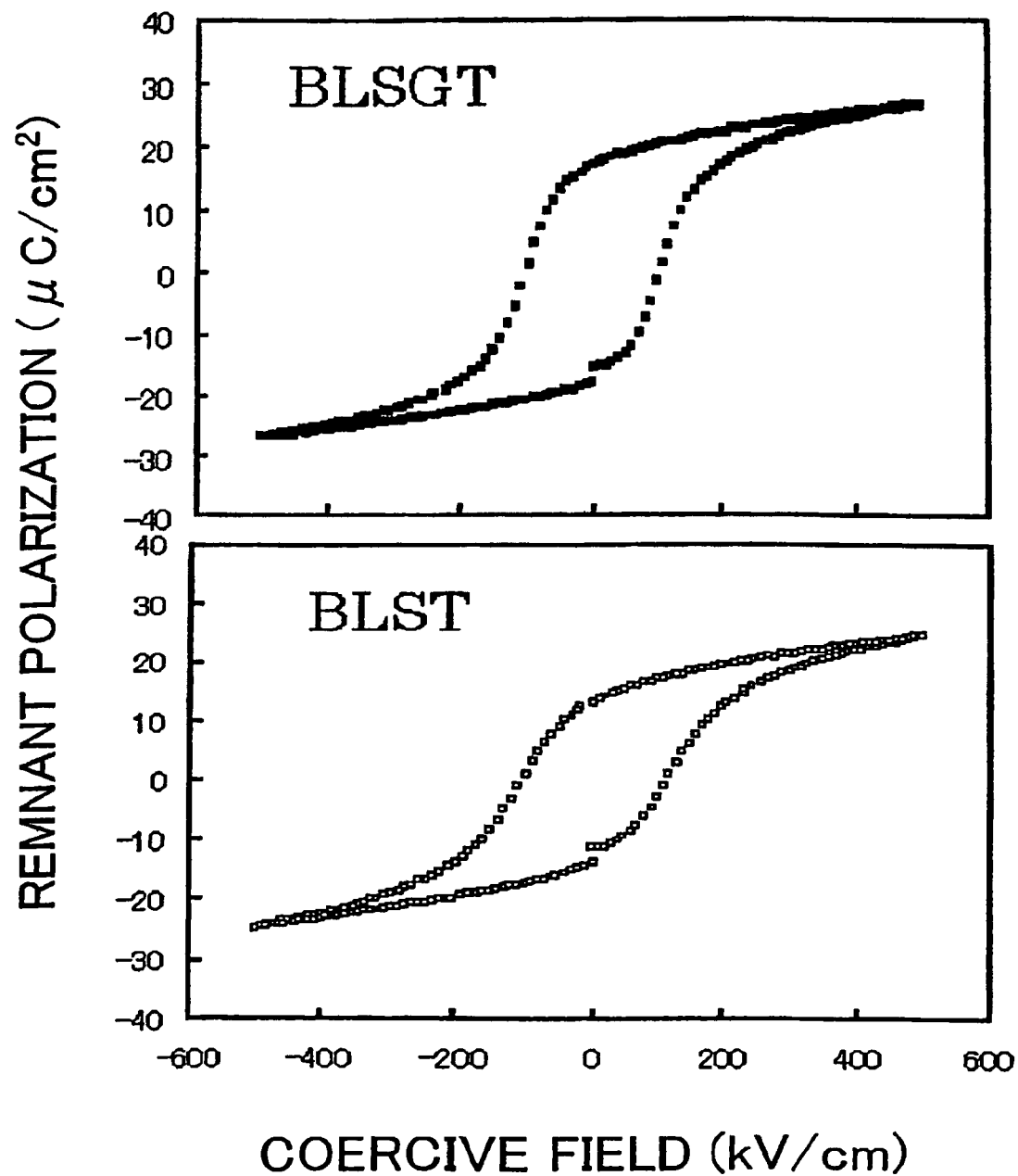
FIG. 3 is a view showing D-E hysteresis characteristics of a ferroelectric BIT including Si or Si and Ge of the present invention.

FIG. 3 shows results for the evaluation of D-E hysteresis characteristics of each sample. BIT did not exhibit ferroelectricity since the crystallization progressed to only a small extent. BLST and BLSGT showed a hysteresis peculiar to the ferroelectric. As shown in FIG. 3, BLST and BLSGT had a polarization Pr of 13 to 18 $\mu C/cm^2$. However, BLST showed an insufficient hysteresis shape (squareness) in comparison with BLSGT. Therefore, it was confirmed that superior hysteresis characteristics were obtained by using LSO and LGO as the catalytic oxides in comparison with the case of using only LSO.

Figure 43:
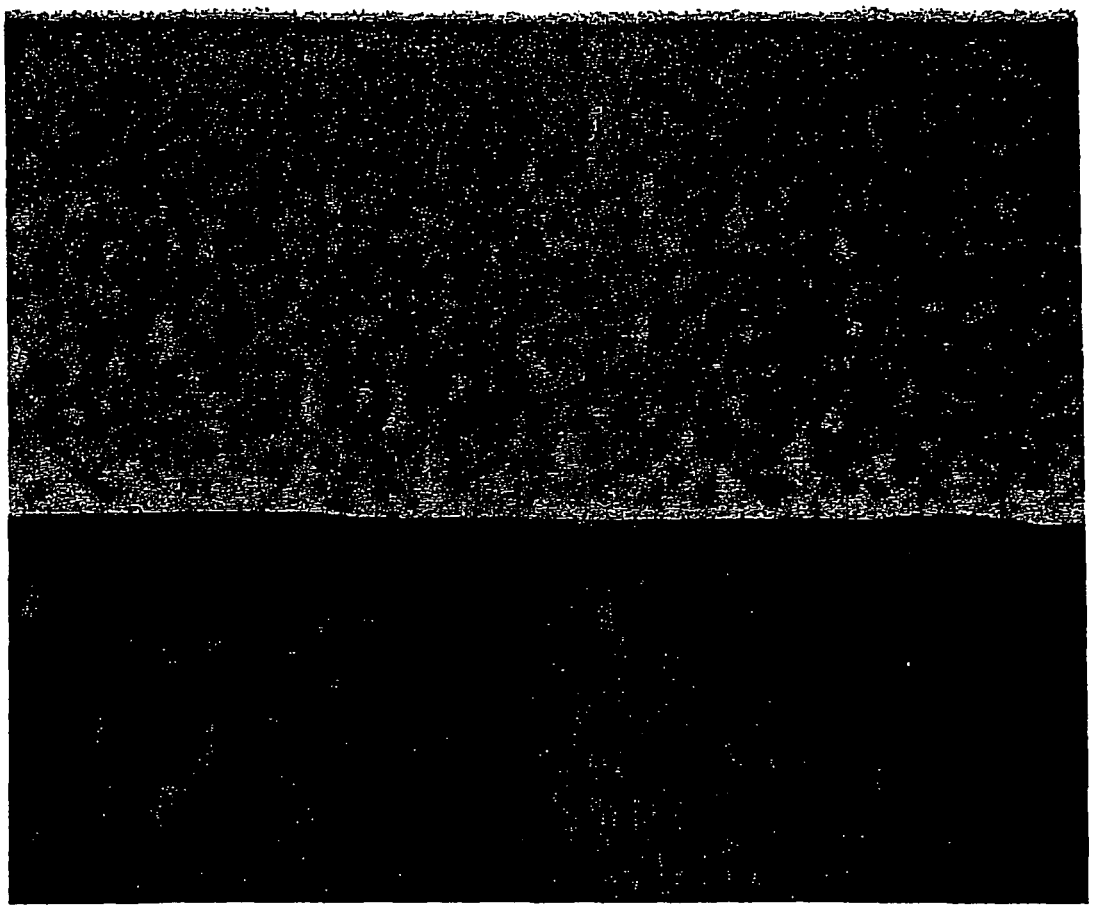
FIG. 43 is a view showing a TEM image of an oxide ferroelectric thin film of the present invention after presintering.

FIG. 43 shows a TEM photograph when completing presintering after applying two layers by using the sol-gel solution for forming a BLSGT ferroelectric. A great change was observed in the film at this time. Only $La_2SiO_5$ and $La_2GeO_5$ were crystallized at this stage. In FIG. 43, the crystallized areas are indicated in white. The crystallized areas were mainly present at the interface between the layers, in particular, at the interface with the Pt electrode.

Figure 44:
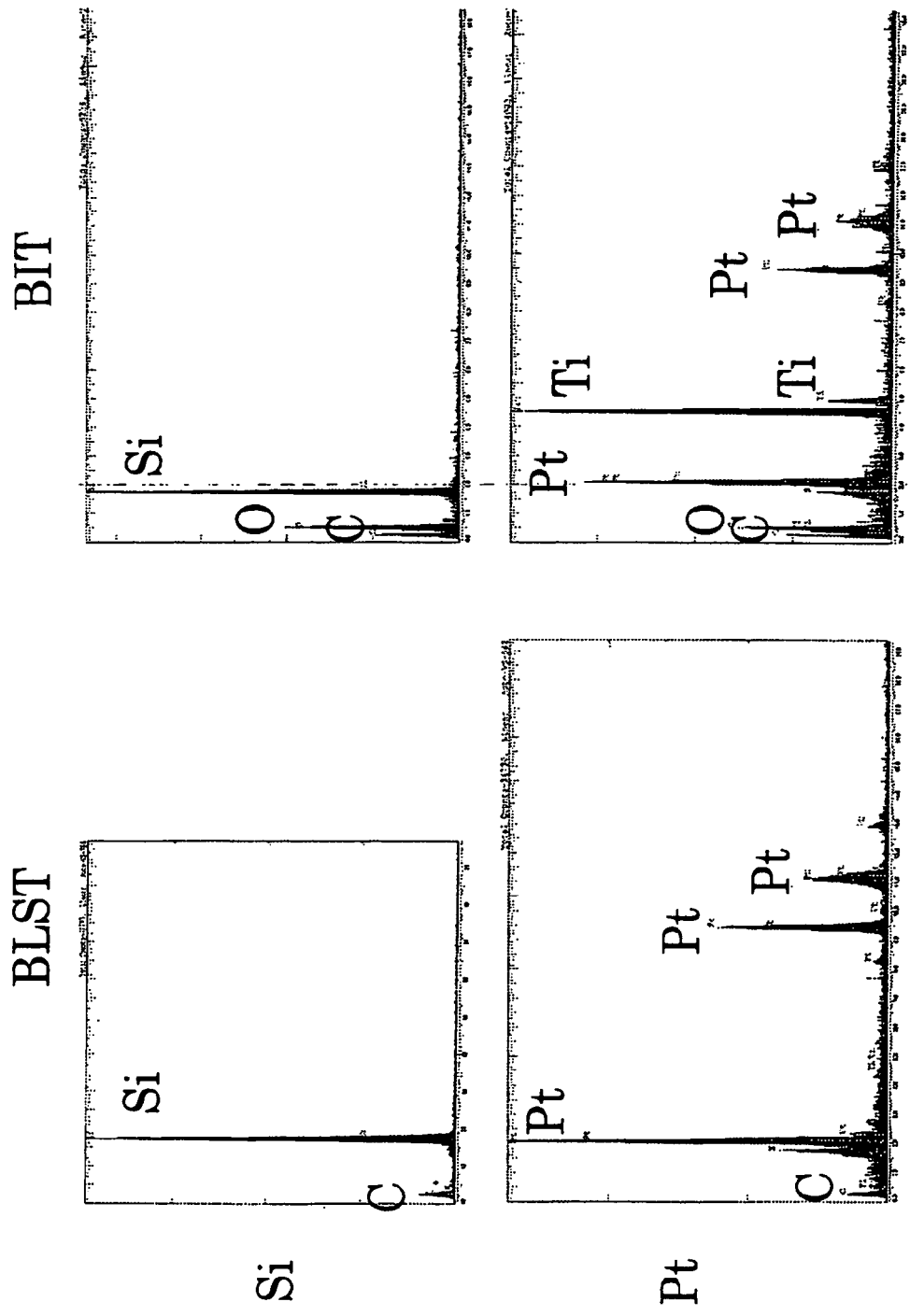
FIG. 44 is a view showing EDX composition analysis results at a lower Pt electrode grain boundary and in an Si substrate of an oxide ferroelectric BLST capacitor of the present invention and a conventional ferroelectric BIT capacitor.

FIG. 44 shows results for the measurement of the composition in the lower Pt electrode and the Si substrate (at a depth of 100 μm from the interface with the $SiO_2$ thermal oxide film) for BLST and a conventional BIT thin film when sintering at 650° C. after applying four layers. In the case of BLST, elements other than Pt and Si were not detected in the lower Pt electrode and the Si substrate. In the case of conventional BIT, a large amount of Ti and O (oxygen) were detected in Pt. The same results were obtained for BLSGT.

These results suggest that the ferroelectric obtained by the present invention was rarely interdiffused into the Pt electrode and the Si substrate. This suggests that a large amount of layered catalytic oxide was present at the interface with the Pt electrode and functioned as a diffusion preventive film.

Example 2

Figure 4:
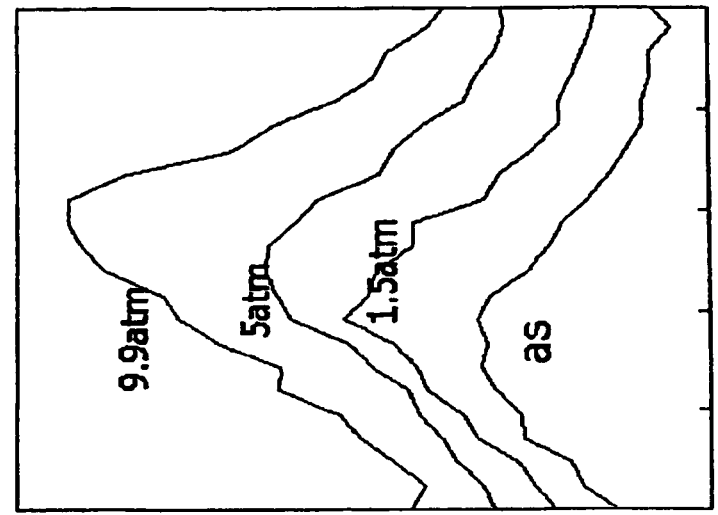
FIG. 4 is a view showing XRD patterns after subjecting a ferroelectric capacitor using the ferroelectric BIT including Si or Si and Ge of the present invention to pressure annealing at 500° C. for 30 min. while changing the oxygen partial pressure from 2 to 9.9 atm.
Figure 4:
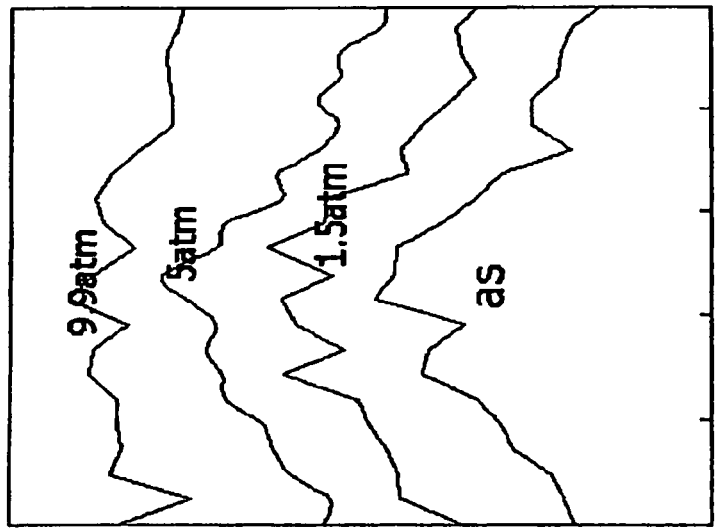
Figure 5:
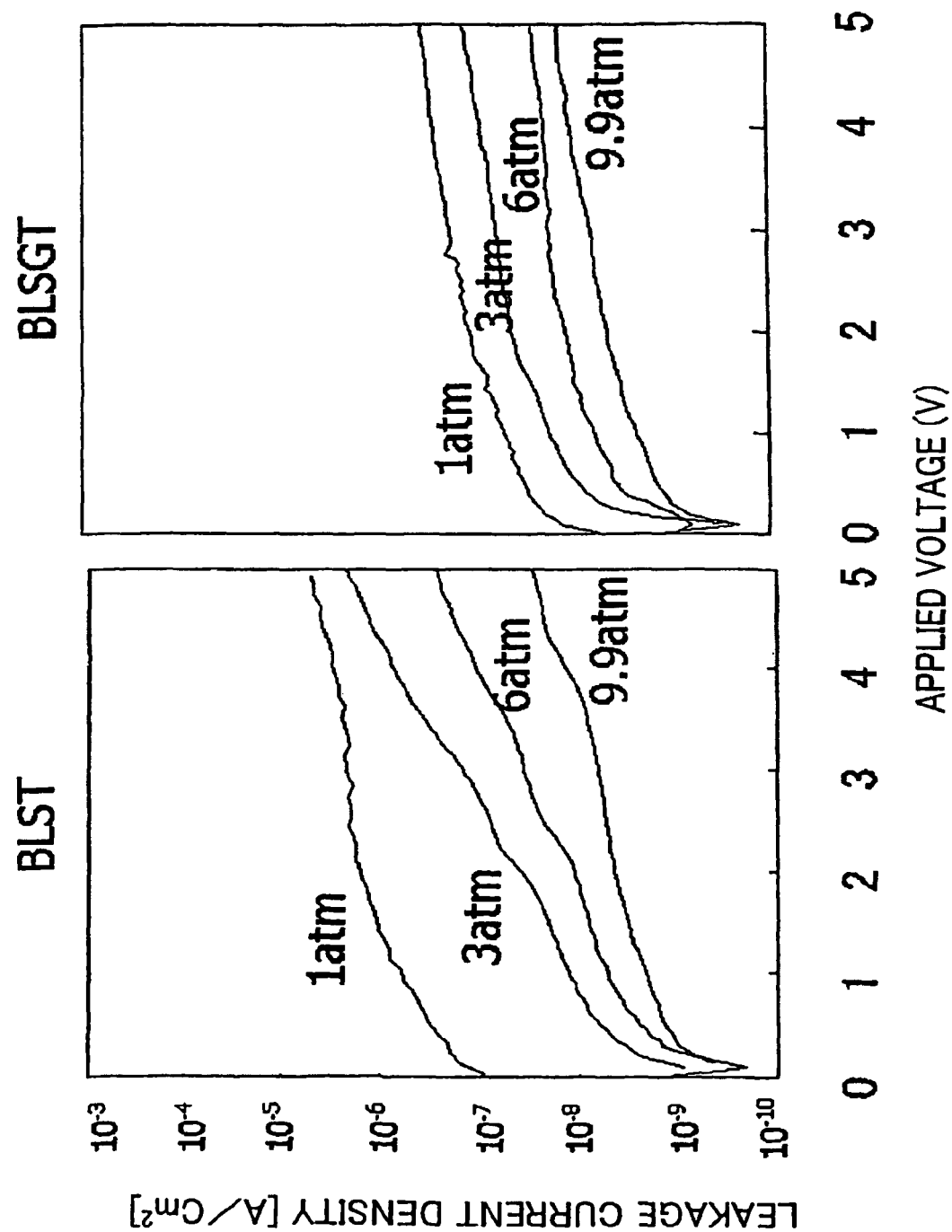
FIG. 5 is a view showing leakage characteristics after subjecting the ferroelectric capacitor using the ferroelectric BIT including Si or Si and Ge of the present invention to pressure annealing at 500° C. for 30 min. while changing the oxygen partial pressure from 2 to 9.9 atm.

Each capacitor obtained in Example 1 was subjected to pressure annealing at 500° C. for 30 min. at an oxygen partial pressure of 1 atm. or more. XRD patterns and leakage characteristics of these capacitors were evaluated. FIGS. 4 and 5 show results for the XRD patterns and leakage current density. In the evaluation of the XRD pattern, the pressure of pressure annealing was set at 1.5 atm., 5 atm., and 9.9 atm. In the evaluation of leakage current density, the pressure was set at 1 atm. (without applying pressure), 3 atm., 6 atm., and 9.9 atm.

As is clear from the XRD patterns shown in FIG. 4, BIT showed a tendency in which the XRD peak became broad by applying a pressure. The XRD peak of BLST shifted to the higher angle side as the pressure was increased, and the XRD peak intensity was increased. The same tendency as BLST was confirmed for BLSGT. Occurrence of a phenomenon in which the XRD peak shifted to the higher angle side and the XRD peak intensity was increased suggests that an oxygen deficiency portion in the perovskite lattice was oxidized and compensated for the lattice defect to cause an increase in bond strength between each atom, whereby the bond distance was decreased. Specifically, the XRD peak shifts to the higher angle side due to a decrease in the bonding distance, and the XRD peak intensity is increased due to improvement of crystallinity.

As shown in FIG. 5, in the case of performing pressure annealing by sintering at atmospheric pressure, the leakage current density of BLST and BLSGT was respectively $10^{-7}$ A/cm$^2$ and $10^{-8}$ A/cm$^2$. In the case of performing pressure annealing at 9.9 atm., the ferroelectric capacitors had a leakage current density of $10^{-9}$ A/cm$^2$ and showed almost the same leakage characteristics. From these results, it was confirmed that the leakage characteristics of BLST are remarkably improved by pressure annealing. In a BIT capacitor formed for comparison, improvement of leakage characteristics was not observed after applying pressure.

Figure 6:
FIG. 6 is a view showing surface morphology of conventional BIT and a BLST thin film of the present invention before and after pressure annealing.
Figure 6:
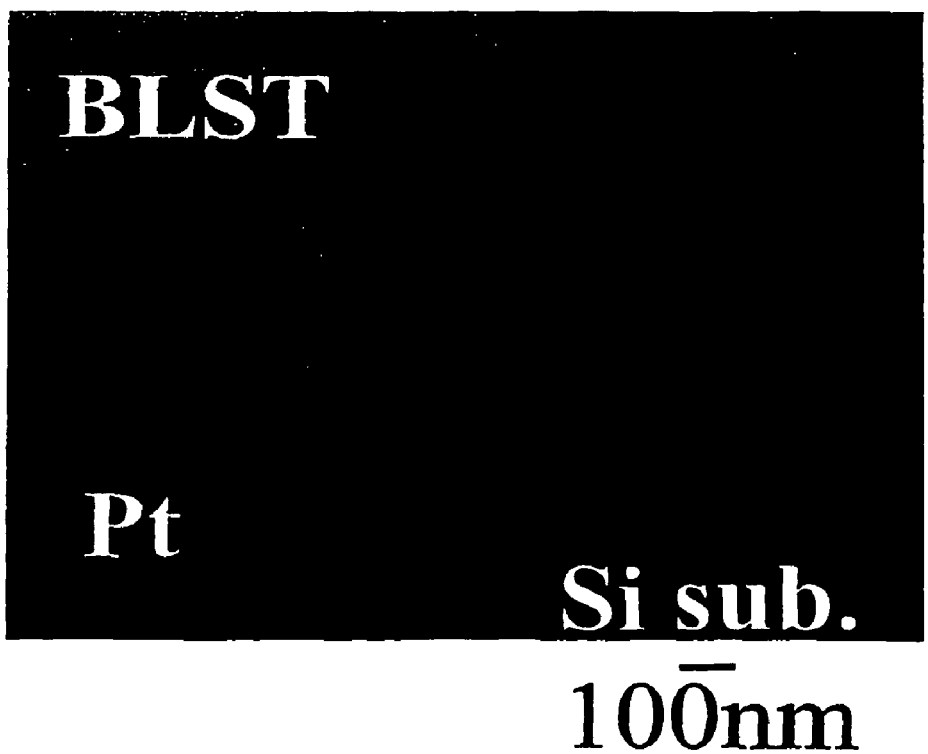
Figure 7:
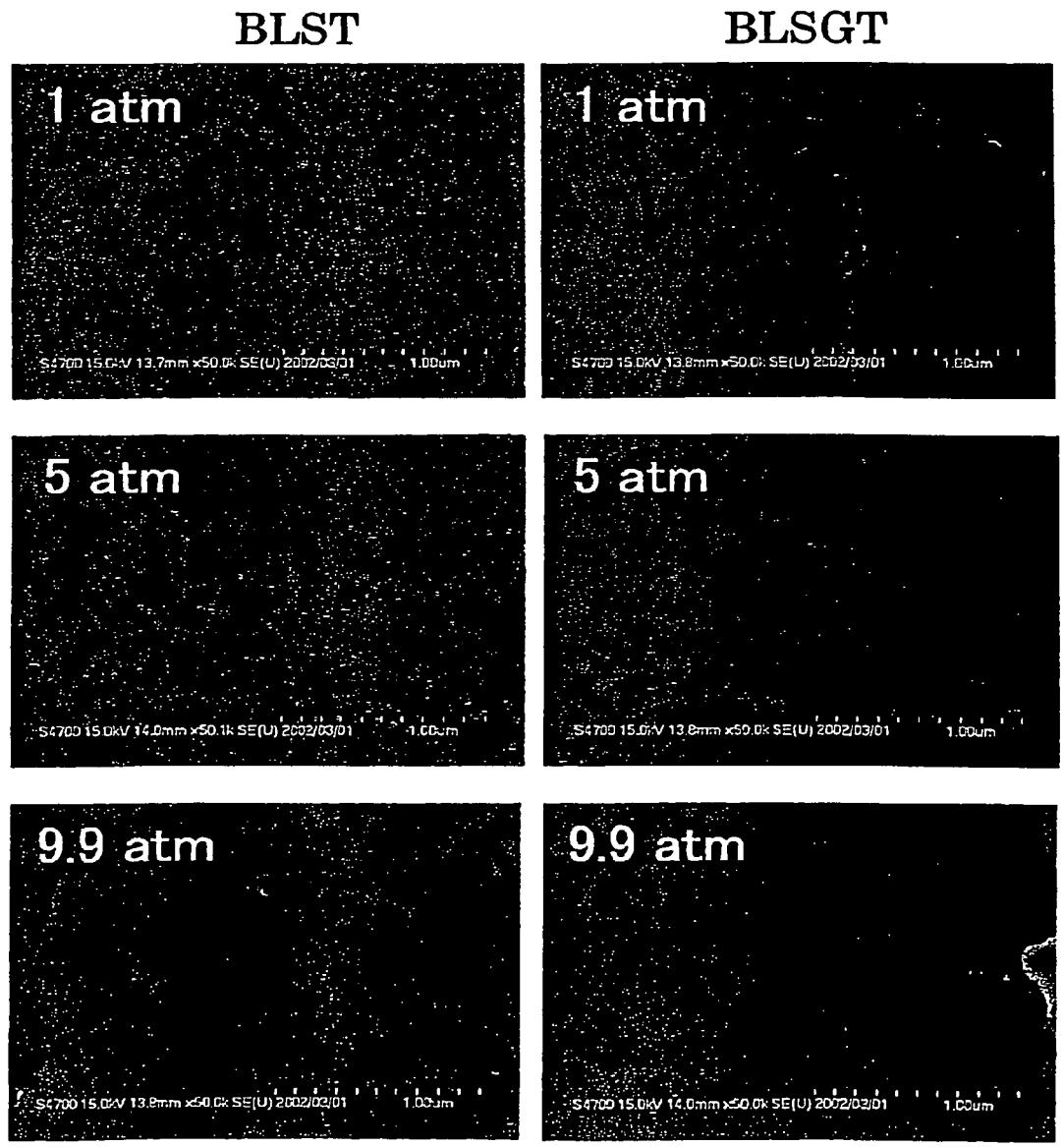
FIG. 7 is a view showing surface morphology of the BLST thin film and BLSGT thin film of the present invention before and after pressure annealing.

FIGS. 6 and 7 show results for comparison of the surface morphology before and after pressure annealing observed using a microscope. There was a large difference between BIT and BLST/BLSGT formed by using the method of the present invention. BLST and BLSGT of the present invention had a very dense, flat, and smooth surface morphology.

In the case of BLST, since the crystal grain size was uneven and generally small after crystallization at atmospheric pressure as shown in FIG. 7, it is clear that the degree of crystal growth was lower than that of BLGST. However, grain growth was promoted by pressure annealing, whereby both BLST and BLSGT were changed into dense, flat, and smooth thin films formed of large grains.

Figure 8:
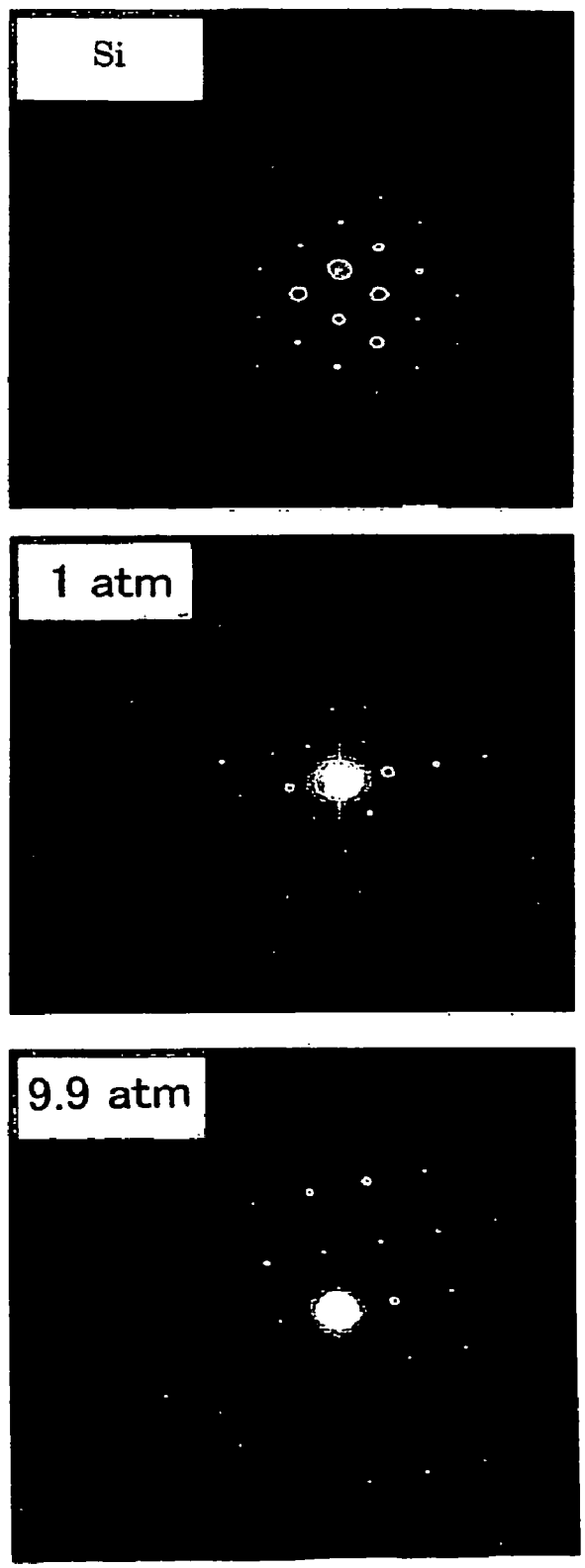
FIG. 8 is a view showing electron diffraction patterns of BLST before and after pressure annealing.

From the electron diffraction patterns of BLST before and after pressure annealing, it was found that crystals were almost a single crystal after grain growth by pressure annealing (FIG. 8).

Figure 9:
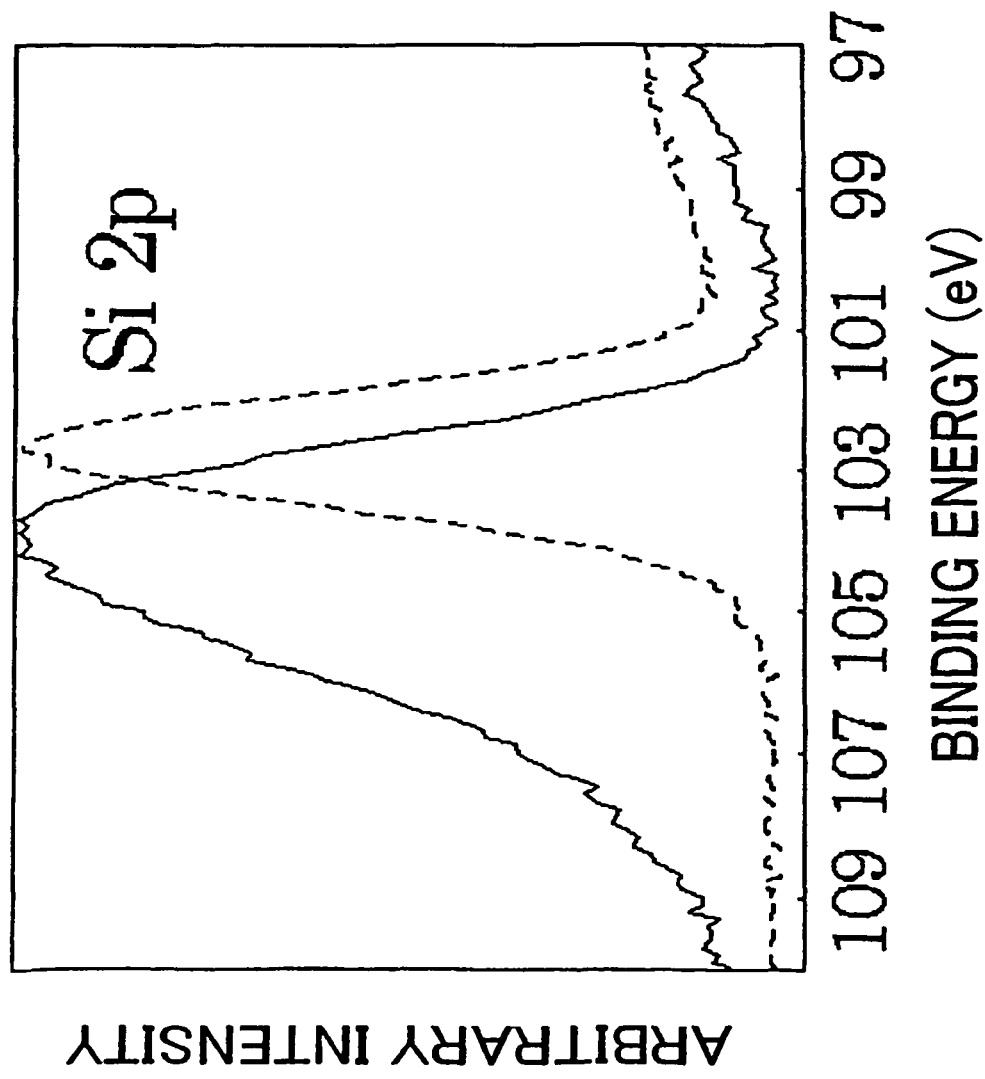
FIG. 9 is a view showing XPS diffraction patterns of BLST before and after pressure annealing.

The coordination number of Si added to BLST was examined by XPS. The results are shown in FIG. 9. A curve indicated by "a" shows the peak of Si having a coordination number of four in SiO$_2$. A curve indicated by "b" shows the peak of Si in BLST of this example. Since the 2p peak of Si in BLST shifted to the high energy side differing from the peak of Si having a coordination number of four, it was confirmed that the coordination number of Si in BLST was six. This suggests that the B site of the oxygen octahedron in the ferroelectric was replaced with Si. The same results were obtained for BLGST. It was found that the B site of the oxygen octahedron in the ferroelectric was replaced with Si and Ge.

Figure 10:
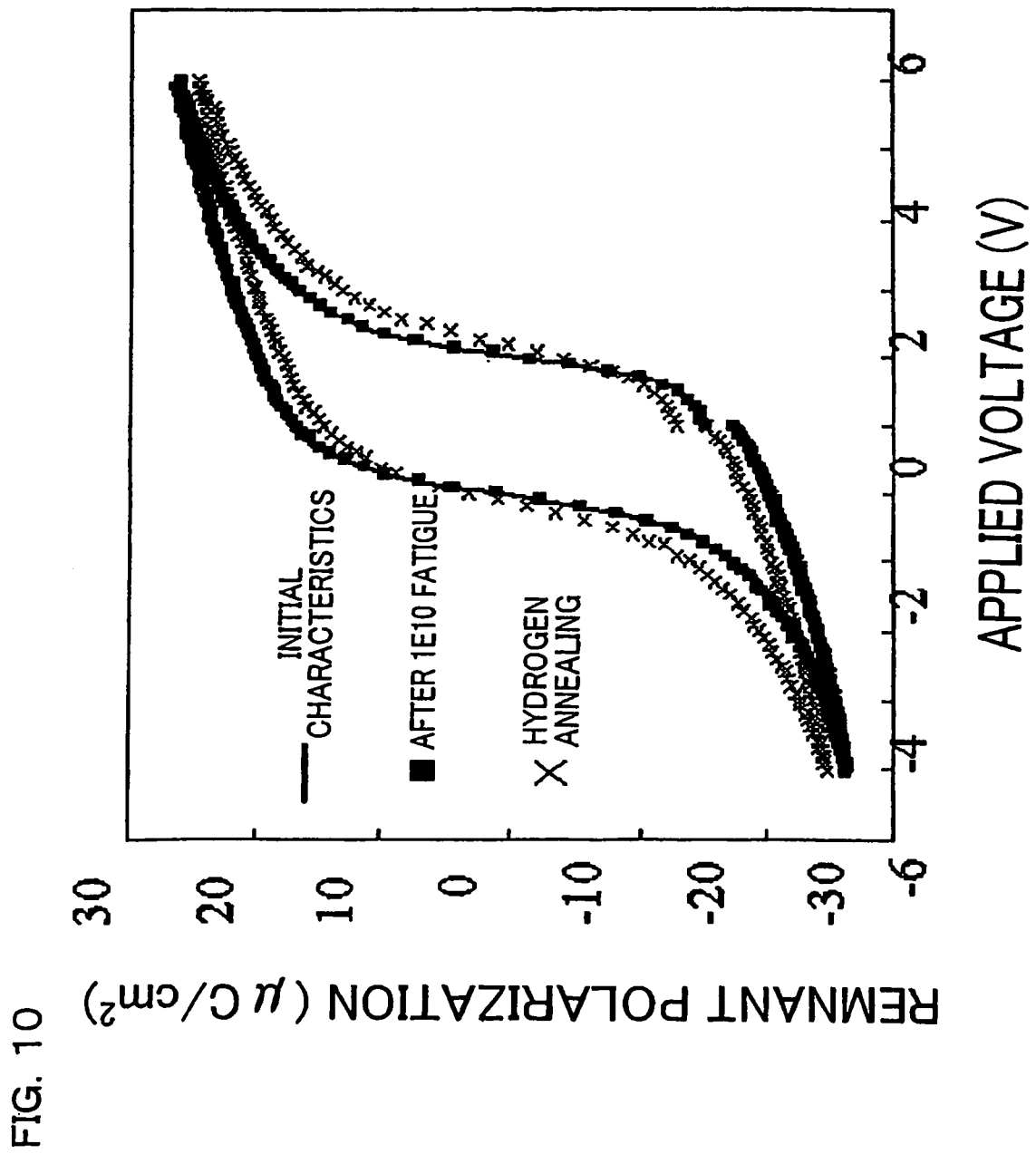
FIG. 10 is a view showing reduction resistance of a BLST capacitor after pressure annealing.

Reduction resistance of the above BLST capacitor was examined. The capacitor was subjected to annealing at 400° C. for 30 min. in nitrogen containing 3% hydrogen. As a result, almost no change was observed as shown in FIG. 10. It is known that ferroelectric crystals are easily reduced by hydrogen ions due to strong ionic bonding properties. However, reduction resistance was remarkably improved by allowing elements having strong covalent bonding properties such as Si and Ge to be introduced into the ferroelectric crystals.

As described above, the crystallization temperature of the ferroelectric thin film of the present invention was decreased by the catalytic effect of a silicate and germanate, which are crystallized at a low temperature. Moreover, it was confirmed that the characteristics were further improved by using Si together with Ge which has an ionic radius greater than that of Si and easily replaces the B site of the oxygen octahedron in the ferroelectric instead of using only Si.

Example 3

In this example, changes in properties when changing the amount of Bi$_2$SiO$_5$ (BSO) from 0.1 mol (R=0.1) to 9 mols (R=9) for 1 mol of a ferroelectric material BIT were examined. The film thickness was 100 nm and the crystallization temperature was 600° C. Pressure annealing was performed at 500° C. for three hours in oxygen at 9.9 atm. Capacitors were obtained in the same manner as in Example 1 except for the above conditions. XRD patterns and D-E hysteresis characteristics of the capacitors were evaluated. The results are shown in FIGS. 11 and 12.

Figure 11:
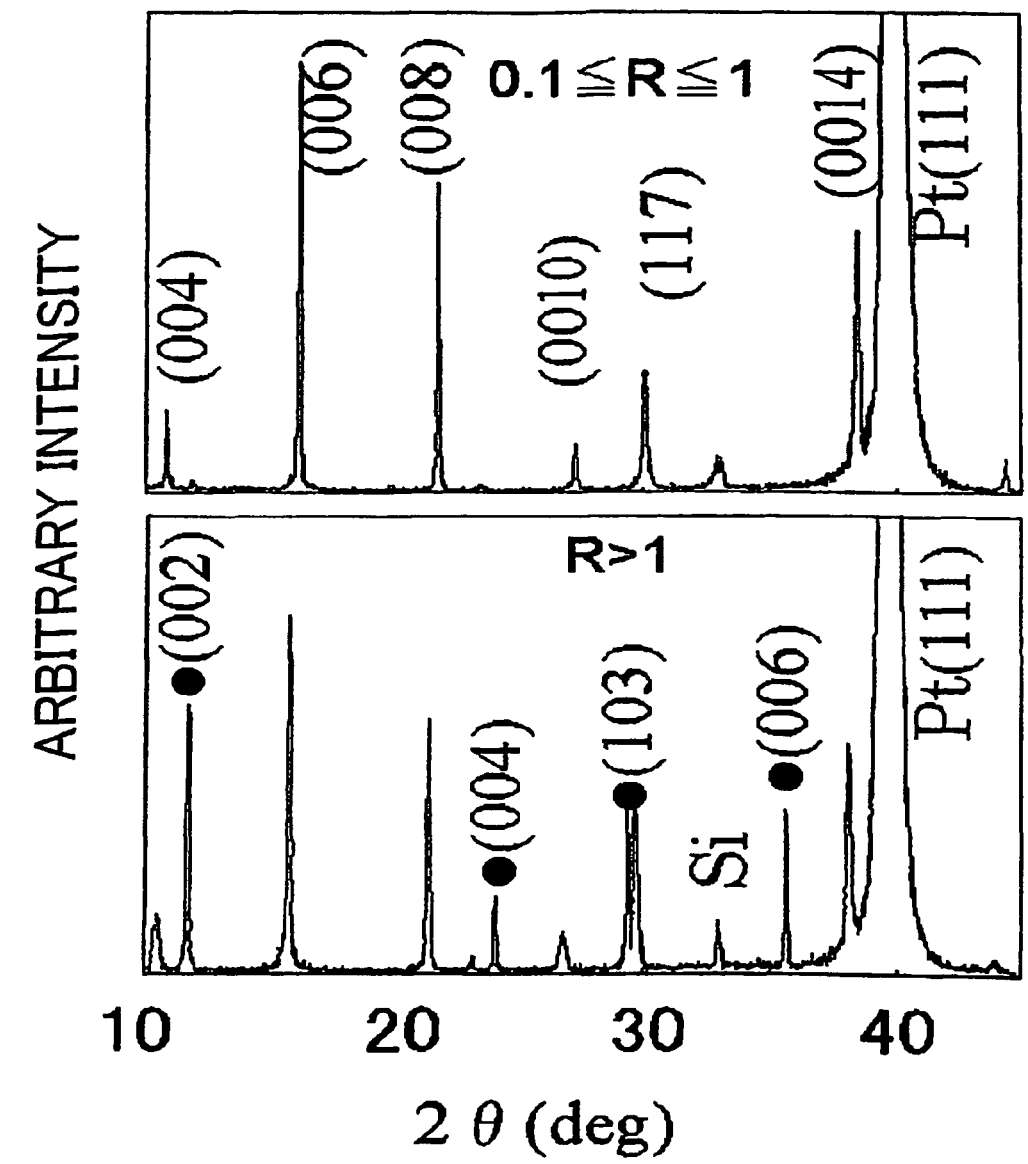
FIG. 11 is a view showing XRD patterns when changing the number of moles of a paraelectric for 1 mol of a ferroelectric.
Figure 12:
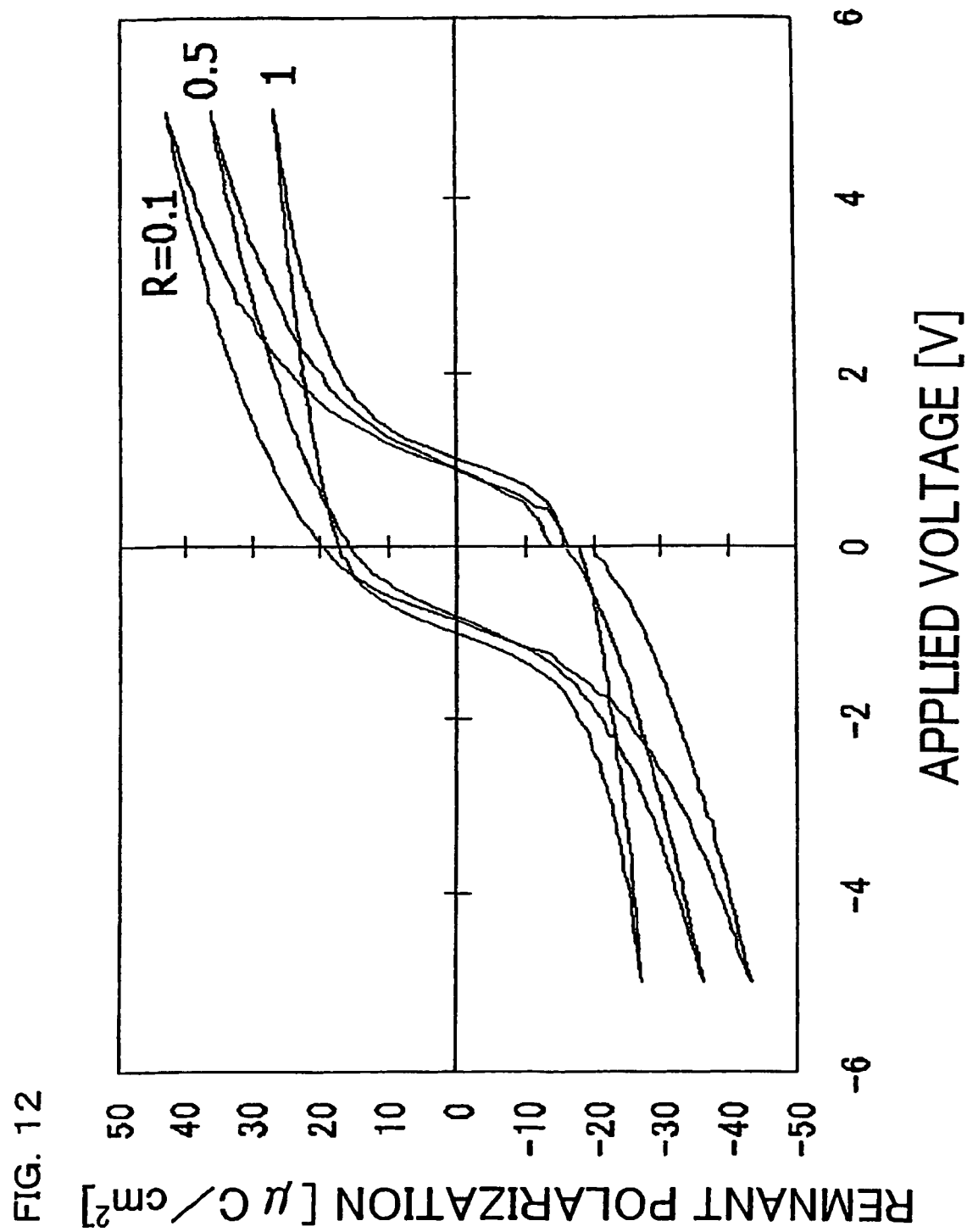
FIG. 12 is a view showing hysteresis characteristics when the number of moles of the paraelectric is in the range of $0.1 \leq R \leq 1$ for 1 mol of the ferroelectric.

As shown in FIG. 11, the peak of BSO was not observed in the XRD pattern in the range of $0.1 \leq R \leq 1$. As shown in FIG. 12, good hysteresis characteristics were obtained in the evaluation of the D-E hysteresis characteristics when R=0.1 to 1. The hysteresis shape was improved as the value for R (molar ratio of catalytic oxide to ferroelectric material) was increased.

Figure 13:
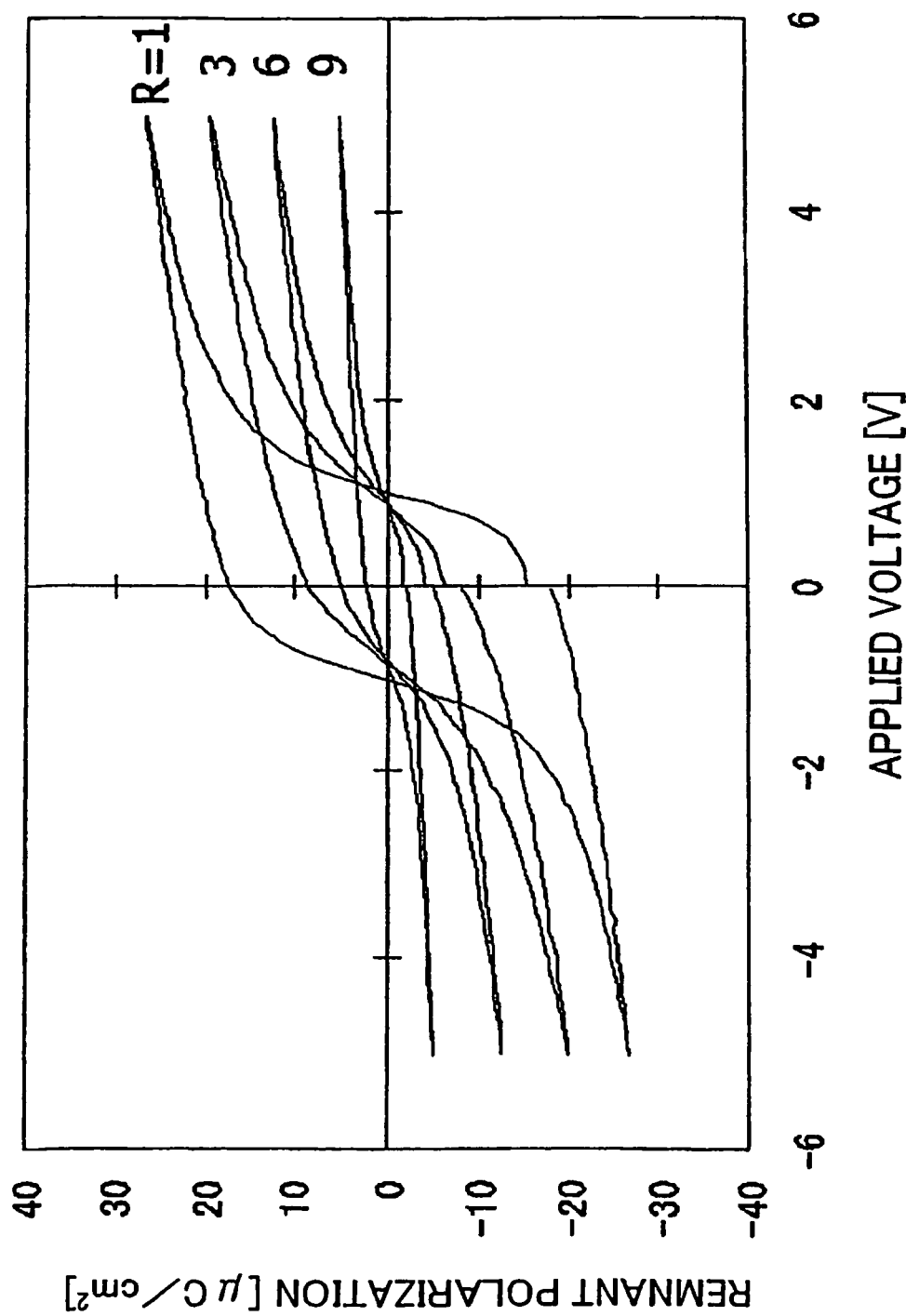
FIG. 13 is a view showing hysteresis characteristics when the number of moles of the paraelectric is in the range of $1 < R \leq 9$ for 1 mol of the ferroelectric.

As shown in FIG. 11, the peaks of BIT and BSO were observed at the same time in the XRD pattern when $1 < R \leq 9$. It was confirmed that the XRD peak intensity of BSO was increased as the value for R was increased. As shown in FIG. 13, in the evaluation of the D-E hysteresis characteristics, the remanent polarization Pr was decreased as the value for R was increased to more than 1. However, squareness of the hysteresis characteristics remained good.

Specifically, BSO and BIT form a solid solution in the range of $0.1 \leq R \leq 1$. In other words, Si in BSO replaces the B site of the oxygen octahedron in BIT. Therefore, the XRD peak of BSO does not exist.

If the value for R exceeds 1, an excess amount of BSO is present in the film in comparison with BIT, whereby excess BSO coexists with the BSO-BIT solid solution. Therefore, the XRD peaks of BSO and BSO-BIT coexist. Since the squareness of the resulting hysteresis remains good, BSO-BIT exists as a column-shaped structure interposed between the upper and lower electrodes. In other words, since the density of the BSO columns is larger than the density of the BSO-BIT columns as the value for R is increased, the ratio of BSO to BSO-BIT is increased. As a result, the remanent polarization Pr is decreased. This suggests that the characteristics of the ferroelectric, in particular, the remanent polarization can optionally be controlled in the present invention by changing the value for R.

Figure 14:
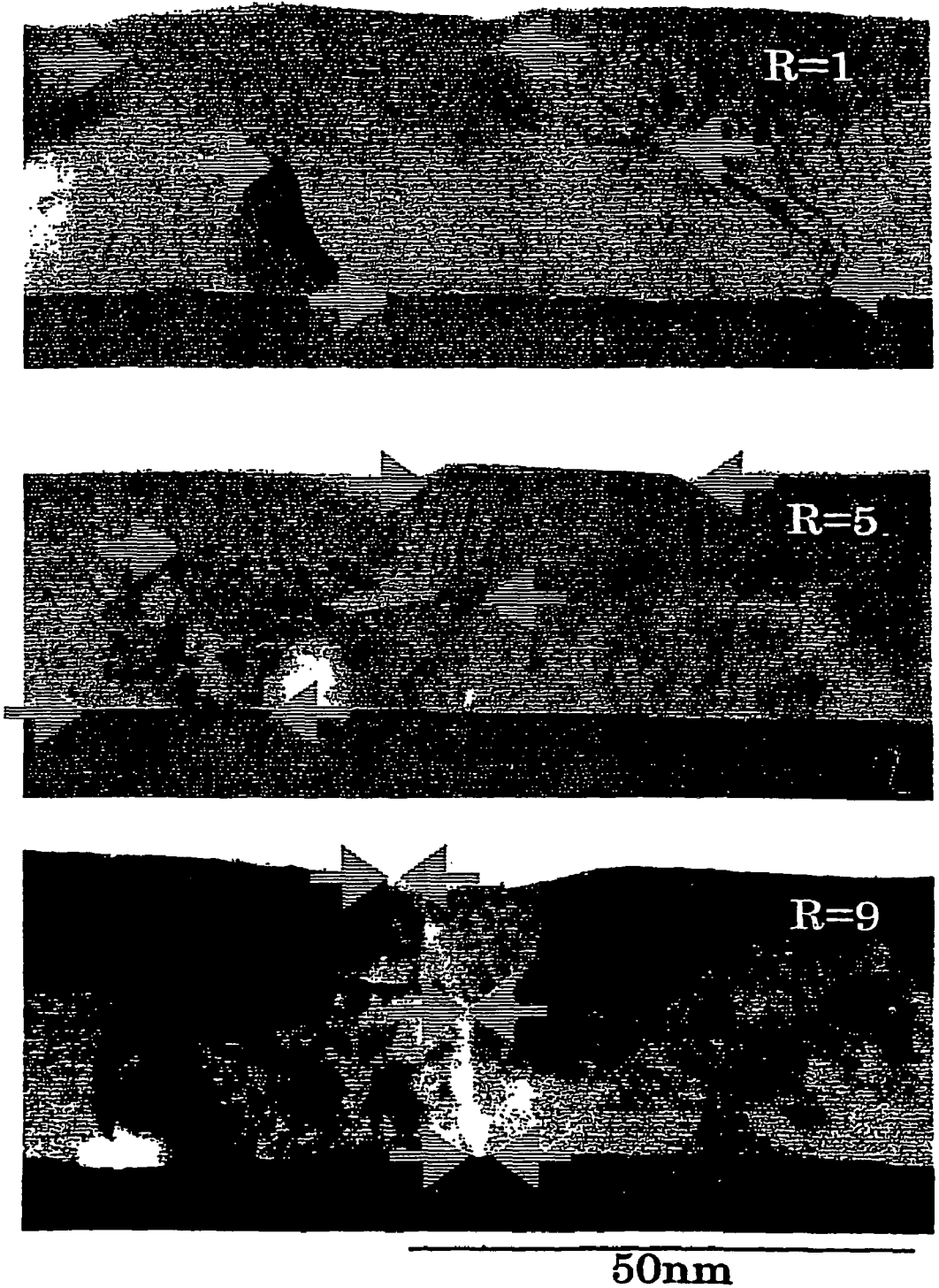
FIG. 14 is a view showing TEM cross-sectional images of a ferroelectric thin film when changing the pressure of pressure annealing.

It is clear that the BSO-BIT solid solution and BSO are in the shape of a column from cross-sectional TEM photographs shown in FIG. 14. The average diameter of the BSO-BIT columns was 50 nm when R=1. The average diameter of the BSO-BIT columns was 20 nm when R=5. The average diameter of the BSO-BIT columns was 1 nm when R=9. A D-E hysteresis was not confirmed when R exceeded 9. Specifically, it is considered that the column-shaped structure could not be formed when R exceeded 9.

Example 4

It is known that a ferroelectric BIT has ferroelectric characteristics in two directions, and the characteristics are strongly anisotropic. The ferroelectric BIT has a saturation polarization Ps of 50 Mc/cm$^2$ in the a-axis direction and 4 Mc/cm$^2$ in the c-axis direction. The ferroelectric BIT is a ferroelectric material for which it is necessary to control the orientation corresponding to the purpose of use.

In this example, an amorphous film of DLC (diamond-like carbon) was formed on a Pt/Si substrate when depositing BIT and $Bi_{3.3}La_{0.7}Si_{0.35}Ge_{0.35}Ti_{2.25}O_{12}$ (BLSGT) of the present invention using BIT as a base in order to control the orientation of the upper BLSGT thin film.

A DLC film with a thickness of 20 nm was formed on the Pt/Si substrate at an RF power of 100 W to obtain a substrate 1. A DLC thin film on the surface of Pt was irradiated with lithium ions from a lithium ion source at an angle of 20° in the vertical direction at an RF power of 7.5 kW and an ionization current of 10 pA for 10 seconds to obtain a substrate 2. A DLC thin film on the surface of Pt was irradiated with lithium ions from the above lithium ion source in the vertical direction at an RF power of 7.5 kW and an ionization current of 10 pA for 10 seconds to obtain a substrate 3.

$Bi_{3.3}La_{0.7}Si_{0.35}Ge_{0.35}Ti_{2.25}O_{12}$ (BLSGT) of the present invention was deposited on the above three types of substrates.

A sol-gel solution was synthesized by the following procedure. A sol-gel solution for forming a $(Bi,La)_4(Si,Ge,Ti)_3O_{12}$ ferroelectric was prepared by mixing a sol-gel solution for forming BIT and sol-gel solutions for forming $La_2SiO_5$ (LSO) and $La_2GeO_5$ (LGO).

A sol-gel solution for forming BLSGT is a solution in which 0.1 mol of LSO and 0.1 mol of LGO were added to 1 mol of the BIT sol-gel solution.

Thin films with a thickness of 100 nm were formed on the above three types of Pt/Si substrates coated with a DLC film by using the sol-gel solution for forming a ferroelectric prepared by the above procedure under the following deposition conditions. Crystallization was performed at 550° C. for 20 minutes in oxygen at 1 atm.

Formation conditions for ferroelectric thin film
  (a) Spin coating (500 rpm for 5 sec., 4000 rpm for 20 sec.)
  (b) Drying (150° C. for 2 min. in air)
  (c) Presintering (400° C. for 5 min. in air)
  (d) Sintering (crystallization) (550° C. for 20 min. by RTA in $O_2$ at 1 atm.)

After sequentially repeating the steps (a), (b), and (c) four times, the step (d) was performed.

Figure 15:
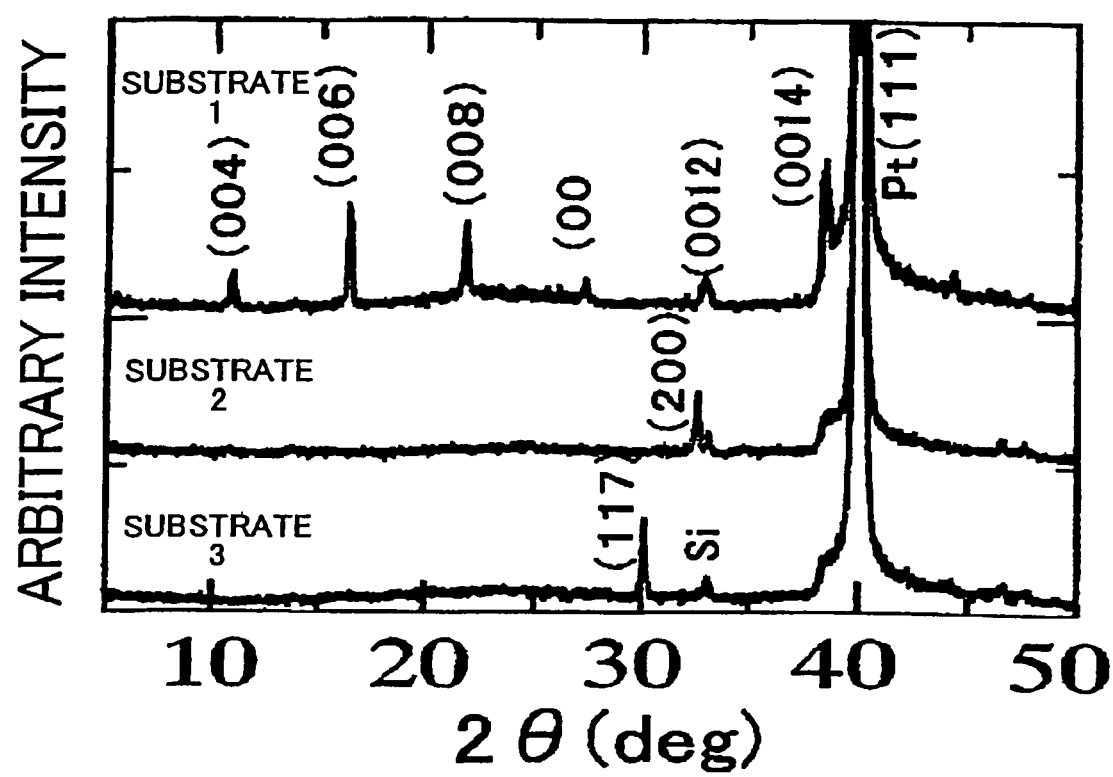
FIG. 15 is a view showing XRD patterns showing a film orientation when using a DLC (diamond-like carbon) buffer layer for the ferroelectric BLSGT thin film of the present invention.

FIG. 15 shows XRD patterns of three types of ferroelectric thin films thus obtained. As shown in FIG. 15, a complete c-axis oriented film was obtained when using the substrate 1, and a complete a-axis oriented film was obtained when using the substrate 2. A complete (117) oriented film was obtained when using the substrate 3. These results suggest that dangling bonds can be formed at an optional density in an optional direction by appropriately cutting the carbon-carbon double bonds of DLC by using a certain means. A ceramic thin film oriented in an optional direction can be formed by forming a ceramic thin film on DLC. In this example, the method for cutting the carbon-carbon double bonds of DLC is not limited to the lithium ion source insofar as the carbon-carbon double bonds are appropriately cut.

The method of the present invention is a thin film formation method using silicate and germanate catalysts. It is known that one of the functions of the catalyst is to reduce the amount of residual carbon. The amount of residual carbon was very small in this example in which DLC was used as a buffer layer. The effect of this method is maximized when used together with the ferroelectric thin film of the present invention.

Example 5

In this example, characteristics of a capacitor in the case of adding layered catalytic compounds other than $La_2SiO_5$ and $La_2GeO_5$ to BIT, $SrBi_2Ta_2O_9$ (SBT), and $PbZr_{0.52}Ti_{0.48}O_3$ (PZT) were examined. As described above, the present invention exhibits a maximum effect by using a silicate and germanate at the same time. In this example, a silicate and germanate were used at a molar ratio of 1:1. As the layered catalytic compound, combinations of $MgSiO_3$ (MSO)+$MgGeO_3$ (MGO), $Al_2SiO_5$ (ASO)+$Al_2GeO_5$ (AGO), $La_2SiO_5$ (LSO)+$La_2GeO_5$ (LGO), $HfSiO_4$ (HSO)+$HfGeO_4$ (HGO), $NbSiO_4$ (NSO)+$NbGeO_4$ (NGO), $MoSiO_5$ (MOSO)+$MoGeO_5$ (MoGO), $WSiO_5$ (WSO)+$V_2GeO_7$ (VGO), and $V_2SiO_7$ (VSO)+$V_2GeO_7$ (VGO) were used.

The amount of each catalytic compound for 1 mol of each ferroelectric material was as follows. The amount of each catalytic compound was 0.8 mol for BIT, 0.66 mol for SBT, and 0.2 mol for PZT. The thickness of the film was 70 nm. The crystallization temperature of BIT, SBT, and PZT was respectively 600° C., 650° C., and 550° C. Capacitors were formed in the same manner as in Example 1 except for the above deposition conditions.

Figure 16A:
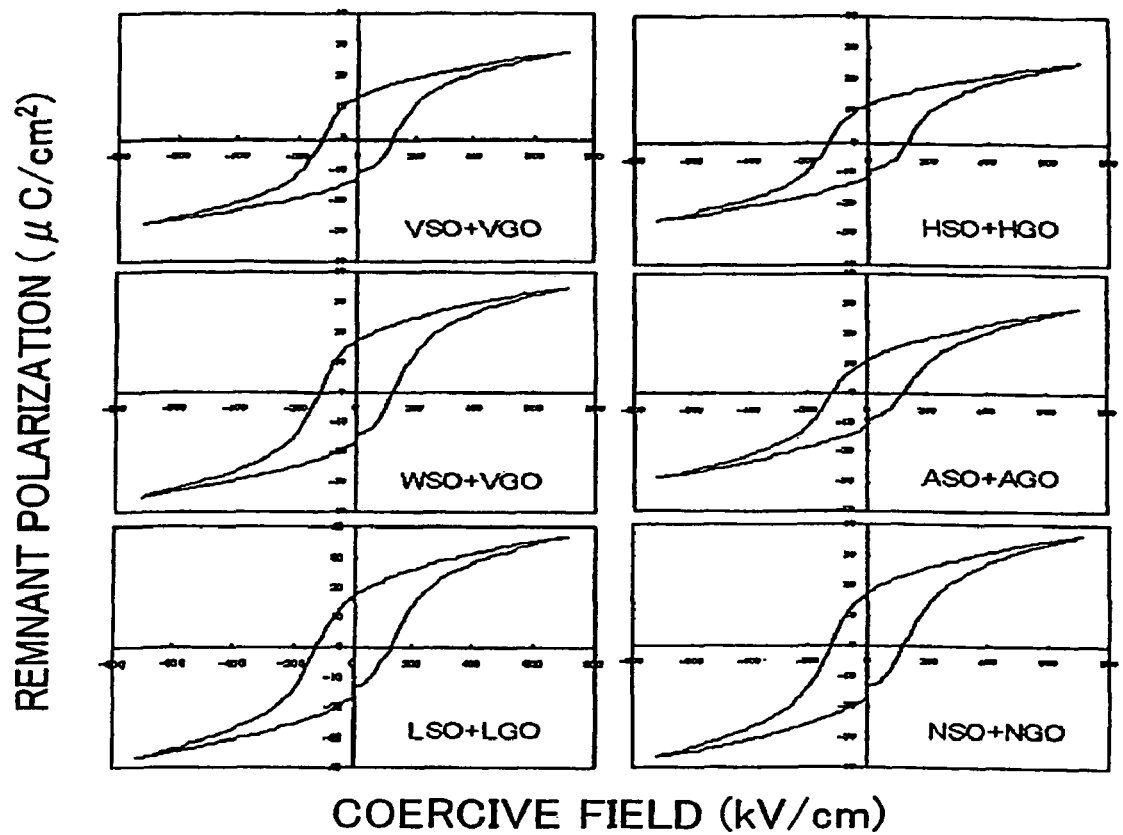
FIG. 16 is a view showing hysteresis characteristics of a ferroelectric capacitor formed by mixing various catalytic compounds with ferroelectric BIT.
Figure 16B:
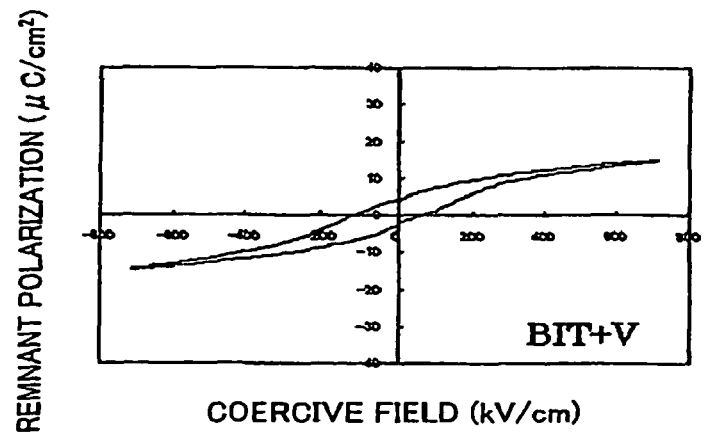
Figure 17:
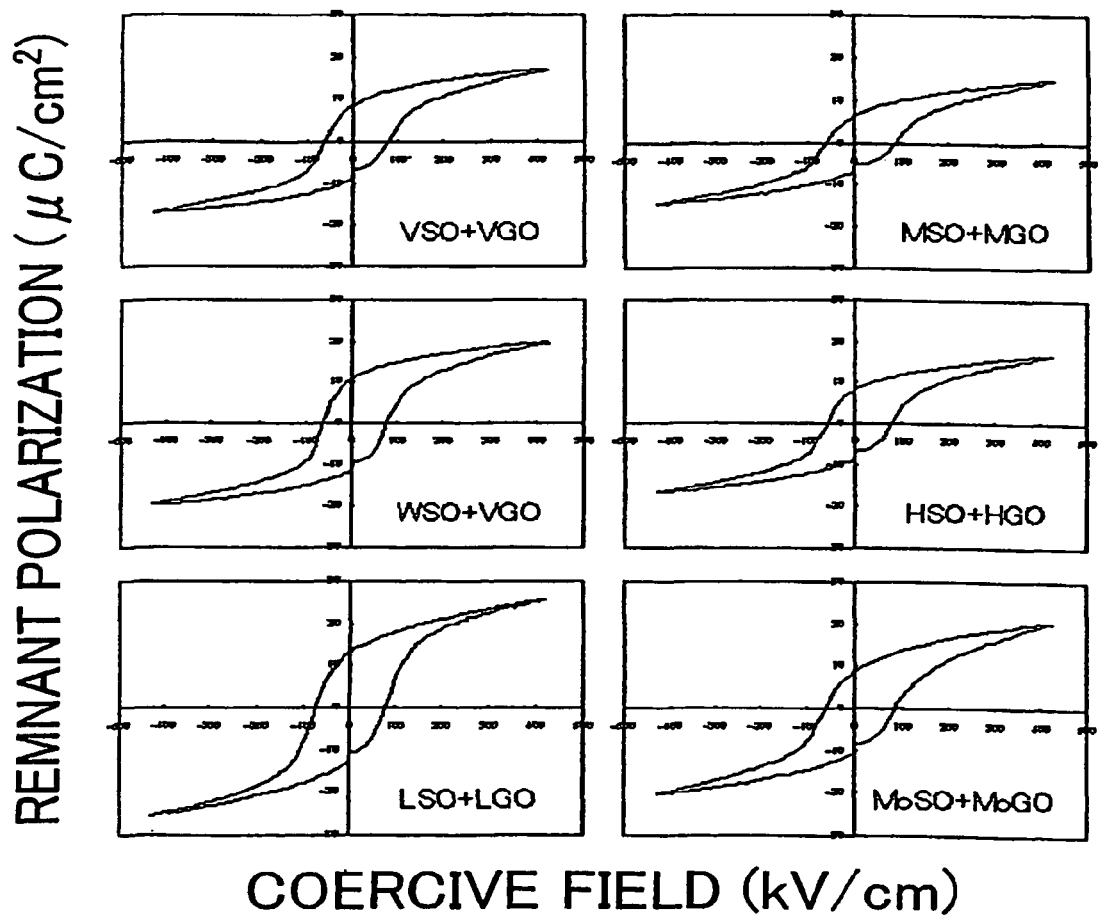
FIG. 17 is a view showing hysteresis characteristics of a ferroelectric capacitor formed by mixing various catalytic compounds with ferroelectric SBT.
Figure 18:
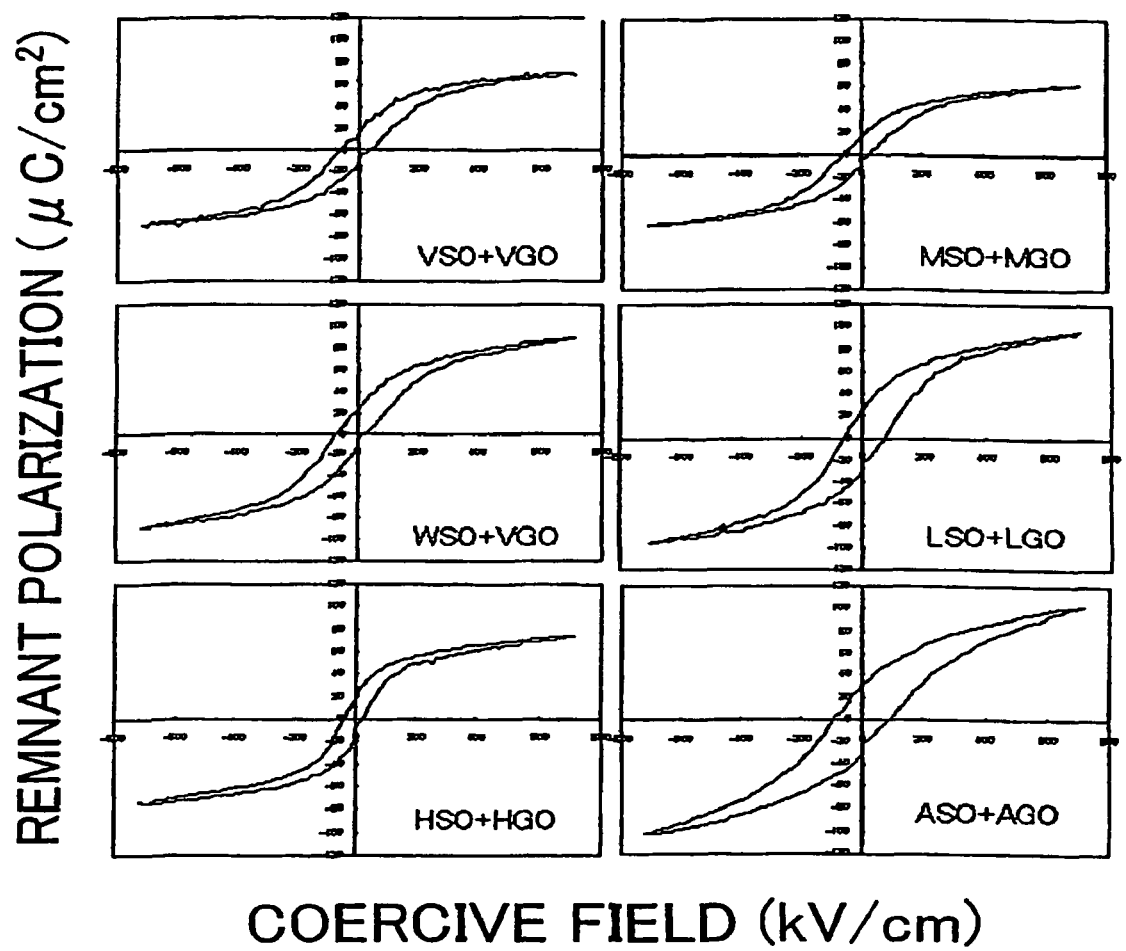
FIG. 18 is a view showing hysteresis characteristics of a ferroelectric capacitor formed by mixing various catalytic compounds with ferroelectric PZT.

The D-E hysteresis characteristics of the resulting samples were good as shown in FIG. 16 (BIT), FIG. 17 (SBT), and FIG. 18 (PZT). Good ferroelectric characteristics were obtained when using the layered catalytic compounds of this example. FIG. 16A shows data for the example of the present invention, and FIG. 16B shows data for a comparative example described later.

In the case of using a Bi-type layered ferroelectric material, it is known in the art that oxygen deficiency can be compensated for by introducing multicharged ions such as V or W into the A site of the oxygen octahedron in bulk formation using a solid phase reaction. However, in the case of using spin coating, oxygen deficiency cannot be compensated for, even if W or V is added to the sol-gel solution differing from the case of using the solid phase reaction. This is because the material can be crystallized at a temperature as high as 1000° C. or more when forming ferroelectric bulk by using the solid phase reaction. However, in the case of forming a thin film by using spin coating, since lower areas including the lower electrode of the element are formed in advance, it is necessary to directly form a ferroelectric film on the lower electrode. Therefore, the ferroelectric film cannot be formed at an excessively high temperature. In this case, the ferroelectric must be formed at 650° C. or less, for example.

As shown in FIG. 16B, good characteristics were not obtained in the comparative example in which the addition of V was attempted by using a sol-gel method. This is considered to be because V was not introduced into the oxygen octahedral lattice and separated as a low dielectric constant layer.

As shown in FIG. 16A, in the case of using the layered catalytic compounds such as $V_2SiO_7$+$V_2GeO_7$ (VSO+VGO) of the present invention, good ferroelectric characteristics equal to bulk values were obtained.

Example 6

In this example, among compounds shown by $(Bi_2O_2)^{2+}(A_{m-1}B_mO_{3m+1})^{2-}$ (wherein A represents at least one element selected from the group consisting of Li, Na, K, Rb, Pb, Ca, Sr, Ba, Bi, La, and Hf, B represents at least one element selected from the group consisting of Ru, Fe, Ti, Zr, Nb, Ta, V, W, and Mo, and m is a natural number of 5 or less), $CaBi_4Ti_4O_{15}$ (m=4) was examined. The thickness of the film was 100 nm, and crystallization was performed at 650° C. for 30 min. Other deposition conditions were the same as in Example 1. After forming a Pt upper electrode by vapor deposition, pressure annealing was performed at 500° C. for 30 min. in oxygen at 1.5 atm in the same manner as in other examples.

Figure 19:
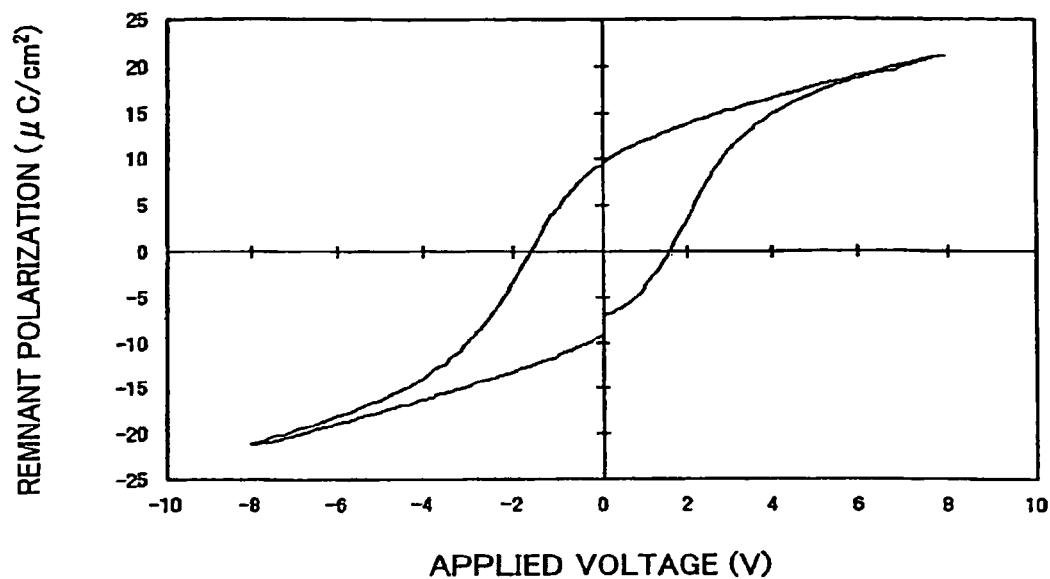
FIG. 19 is a view showing ferroelectric characteristics of a $CaBi_4Ti_3Si_{0.5}Ge_{0.5}O_{15}$ thin film of the present invention.

As the raw material sol-gel solution, a solution in which a sol-gel solution for forming $Bi_4Ti_3O_{12}$ was added to a sol-gel mixed solution of layered catalytic compounds $CaSiO_3$ and $CaGeO_3$ (molar ratio=1:1) at a ratio of 1:1 was used. Specifically, a capacitor having a ferroelectric film consisting of $Bi_4Ti_3O_{12}+0.5CaSiO_3+0.5CaGeO_3=CaBi_4Ti_3Si_{0.5}Ge_{0.5}O_{15}$ was formed. The D-E hysteresis characteristics of this sample were determined. The results are shown in FIG. 19. It has not been reported that good ferroelectric characteristics were obtained for this ferroelectric material. However, it was confirmed that good ferroelectric characteristics shown in FIG. 19 were obtained by using the present invention.

Example 7

In this example, superiority of the present invention was examined for ferroelectric materials having a structure other than the perovskite structure. An $Sr_2(Ta_{0.5}Nb_{0.5})_2O_7$ (STN) thin film having a tungsten bronze structure was formed. This ferroelectric material has a small remanent polarization and expected to be applied to ferroelectric gate transistors. However, a crystallization temperature as high as about 950° C. is usually necessary for this ferroelectric material. This prevents utilization of this material in practice.

The thin film was deposited under the following conditions. As the sol-gel solutions, a sol-gel solution for forming an $SrTaO_3$ high-dielectric thin film, a sol-gel solution for forming an $SrO_2$ oxide, and sol-gel solutions for forming $NbSiO_4$ and $NbGeO_4$ layered catalytic compounds were used.

A solution prepared by mixing $NbSiO_4$ and $NbGeO_4$ (molar ratio=1:1) with a solution prepared by mixing the sol-gel solution for forming an $SrTaO_3$ high-dielectric thin film and the sol-gel solution for forming an $SrO_2$ oxide (ratio: 1:1) at a ratio of 2:1 to prepare a raw material solution for producing $Sr_2(Ta_{0.5}Nb_{0.25}Si_{0.125}Ge_{0.125})_2O_7$. A thin film was formed on a $Pt/Ti/SiO_2/Si$ substrate by spin coating using the above sol-gel solution. The thickness of the film was 50 nm. Crystallization was performed at 650° C. for 60 min. in an oxygen atmosphere. A Pt upper electrode was then formed. However, ferroelectricity was not confirmed.

Figure 20:
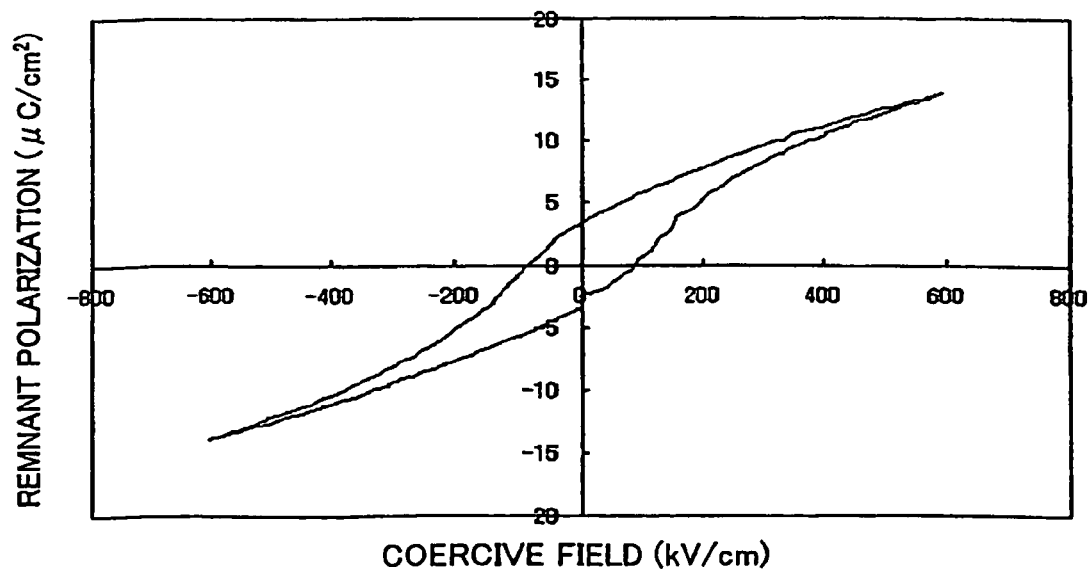
FIG. 20 is a view showing ferroelectric characteristics of an $Sr_2(Ta_{0.5},Nb_{0.25},Si_{0.125},Ge_{0.125})_2O_7$ thin film of the present invention.

Therefore, pressure annealing was performed at 650° C. for three hours in oxygen at 9.9 atm. as post-annealing. As a result, good crystallinity and good ferroelectric characteristics shown in FIG. 20 were confirmed. It is known that this material has a very high crystallization temperature. However, good characteristics were obtained at a practically applicable process temperature by using the mixed catalyst of a silicate and a germanate and pressure annealing in an oxygen atmosphere of the present invention.

Example 8

In this example, formation of a thin film from a $Bi_2Sr_2Ca_2Cu_3O_X$ (Bi2223) superconducting oxide material was examined instead of a ferroelectric. As the layered catalytic compounds, $Bi_2SiO_5$ (BSO) and $Bi_2GeO_5$ (BGO) were used at a molar ratio of 2:1.

A BSO+BGO mixed sol-gel solution at a molar ratio of 2:1 was mixed with a Bi2223 sol-gel solution to prepare a raw material solution. A thin film with a thickness of 50 nm was formed on a $Pt/Ti/SiO_2/Si$ substrate by spin coating using the above sol-gel solution under the following conditions. Crystallization was performed at 700° C. for 1 min. in oxygen. The film was then subjected to pressure annealing at 700° C. for 5 min. in oxygen at 9.9 atm. Crystallinity of the film was confirmed by using X-ray diffraction. The film had very good surface morphology.

Figure 21:
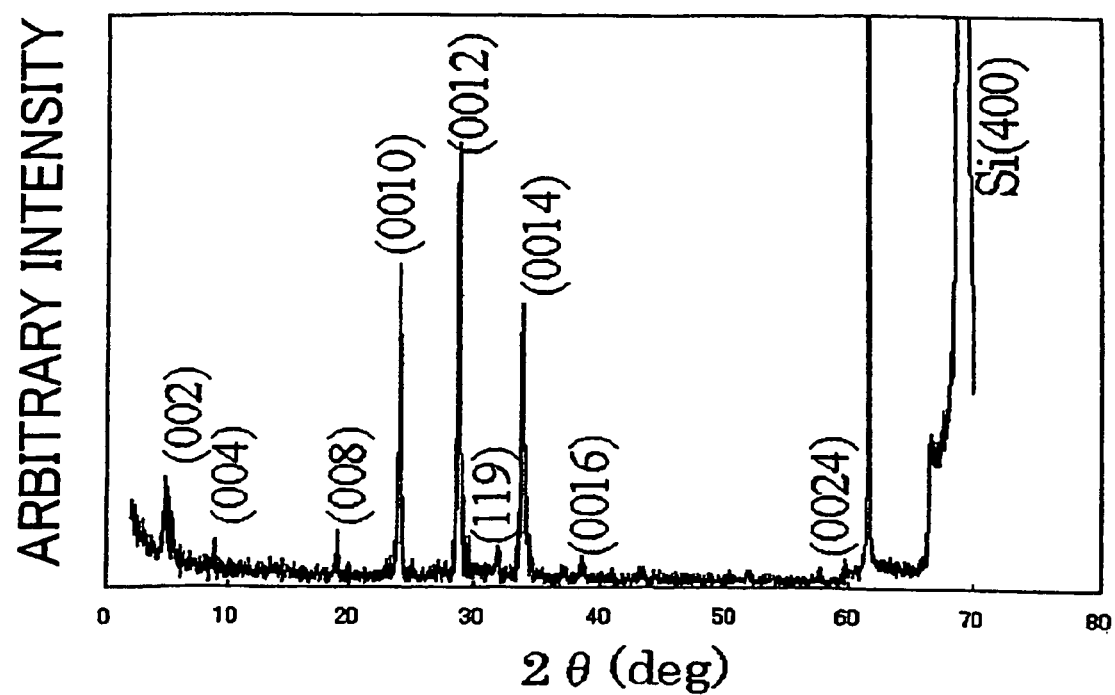
FIG. 21 is a view showing an XRD pattern of a $Bi_2Sr_2Ca_2Cu_3O_x$+BSO+BGO superconducting thin film of the present invention.

As shown in FIG. 21, the resulting thin film with a thickness of 15 nm was a good crystal film consisting of a Bi2223 single phase.

As described above, the present invention can be applied to thin film formation from various types of oxide materials regardless of the crystal system by utilizing not only ferroelectrics but also perovskite-type high dielectrics, Bi-type superconducting material $Bi_2Sr_2Ca_2Cu_3O_X$ (Bi2223), or catalytic substances.

Example 9

In this example, formation of a thin film was examined by mixing a $Ba_{0.5}Sr_{0.5}TiO_3$ (BST) perovskite-type high dielectric material instead of a ferroelectric and $TiSiO_4$ and $BaGeO_3$ paraelectric materials by using the MOCVD method.

BST has been expected to be a gate oxide film material for the next generation DRAM in place of $SiO_2$, and studied for ten years or more. However, since a thin film with a thickness of 20 nm or less is rarely formed from BST while maintaining a high relative dielectric constant, BST has not been put to practical use.

0.25 mol of a $BaSiO_3$ sol-gel solution and 0.25 mol of $TiSiO_4$ were mixed with 1 mol of a BST sol-gel solution to prepare a raw material solution. A thin film with a thickness of 20 nm was formed on a $Pt/Ti/SiO_2/Si$ substrate by using the MOCVD method and an MOCVD apparatus shown in FIG. 22, using the above sol-gel solution under the following conditions.

Figure 22:
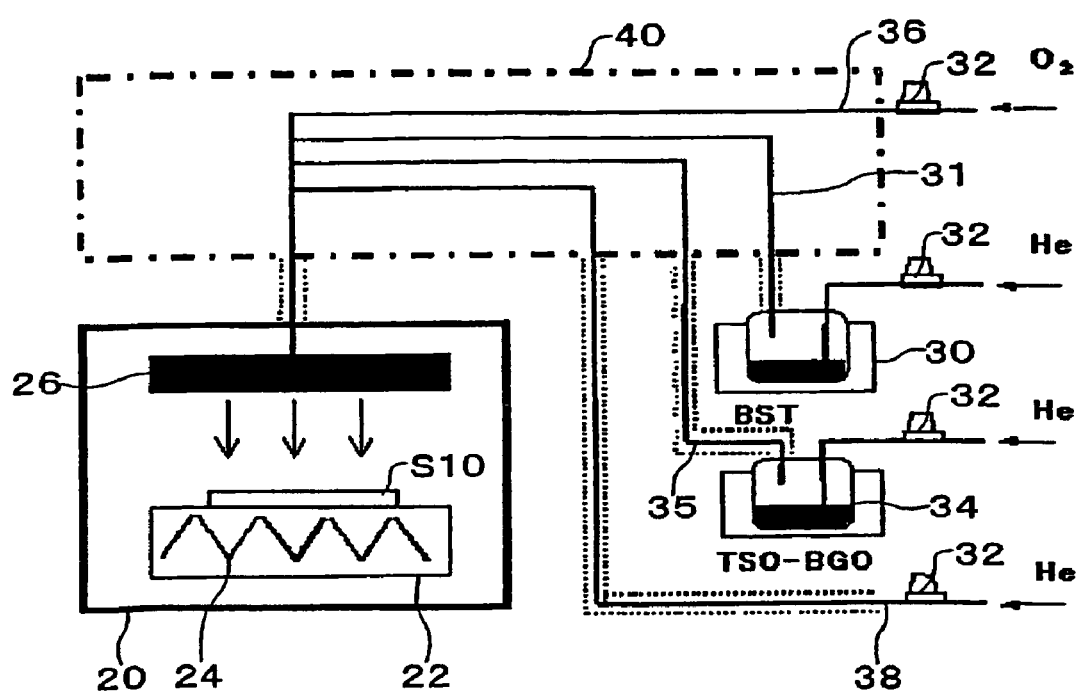
FIG. 22 is a view showing an MOCVD apparatus used for forming a ferroelectric thin film of the present invention.

The MOCVD apparatus shown in FIG. 22 includes a chamber 20 for performing MOCVD. The chamber 20 includes a support stage 22 for placing a substrate S10 on which a film is formed, a heater 24 provided in the support stage 22, and a nozzle 26 for supplying raw material gas toward the substrate S10 on the support stage 22. First and second raw material supply sections 30 and 34 are connected with the nozzle 26 through pipes. A gel raw material for forming BST is placed in the first raw material supply section 30. A gel for forming TSO-BGO is placed in the second raw material supply section 34. The first raw material supply section 30 is connected with the nozzle 26 through a pipe 31. The raw material in the first raw material supply section 30 is supplied to the nozzle 26 by carrier gas using helium. The second raw material supply section 34 is connected with the nozzle 26 through a pipe 35. The raw material in the second raw material supply section 34 is supplied to the nozzle 26 by carrier gas using helium. Oxygen gas is supplied to the nozzle 26 through a pipe 36, and helium gas is supplied to the nozzle 26 through a pipe 38. In this example, the MOCVD apparatus includes a thermostat 40 in order to prevent a decrease in the temperature of gas supplied to chamber 20 from the nozzle 26. The temperature of the gas which is passed through each pipe can be optimized by passing the pipes 31, 35, 36, and 38 through the thermostat 40. The pipes 31, 35, 36, and 38 may be heated by a heater. A numeral 32 shown in FIG. 22 indicate a mass flow controller.

A method of manufacturing a dielectric thin film element examined in this example is described below.

A silicon thermal oxide film with a thickness of 200 nm was formed by thermally oxidizing the surface of an n-type silicon substrate at 1000° C. A Ti film with a thickness of 30 nm and a Pt film with a thickness of 200 nm were formed on the silicon thermal oxide film by sputtering. This substrate was used as a substrate for forming a high-dielectric thin film.

A step of forming a mixed thin film of a barium strontium titanate $Ba_{0.5}Sr_{0.5}TiO_3$ (BST) perovskite-type high-dielectric material of the present invention and titanium silicate $TiSiO_4$ (TSO) and barium germanate $BaGeO_3$ (BGO) paraelectric materials (TSO-BGO-BST) on the substrate by using the above MOCVD apparatus is described below.

In the MOCVD method, an organometallic raw material containing metal elements of an objective oxide is vaporized by using various methods, and the resulting organometallic vapor is pyrolyzed and crystallized together with oxide gas such as oxygen on the substrate heated and held in the deposition chamber by using carrier gas such as argon or helium to obtain the objective oxide thin film. In this example, an organometallic raw material was prepared by a complex polymerization method. It is important to heat the oxide gas in advance using the thermostat so that heat is not removed from the raw material gas.

The complex polymerization method consists of dissolving a metal nitrate in water, forming a metal citrate complex by adding citric acid, for example, and subjecting the metal citrate complex to ester polymerization by adding ethylene glycol to obtain a gel. In this example, gels for forming BST and TSO-BGO were obtained by this method.

In more detail, water-soluble barium acetate, strontium acetate, and ammonium citrate peroxotitanate were used as starting raw materials for forming BST. The above raw materials were dissolved in water. After the addition of citric acid as an organic additive, the mixture was stirred and heated at about 200° C. to obtain a homogenous gel. If a transparent gel is obtained by this process without causing a precipitate to be formed, it is considered that the metal ions in the raw materials were micro-mixed. In this example, occurrence of a precipitate was prevented by setting the ratio of the number of moles of citric acid to the total number of moles of metal ions to 5 or more.

A gel for forming TSO-BGO was obtained by the same procedure. As the starting raw materials, bismuth acetate, ammonium citrate peroxotitanate, silicon acetate, and tetraethyl germanium were used.

After vaporizing the above two types of gels by a bubbling method, the gels were introduced into the chamber together with oxygen gas heated using the thermostat in advance by using He carrier gas to form an oxide thin film on the substrate heated at 400° C. The reaction pressure was 5 Torr. In order to form a mixed thin film of the present invention, a cycle consisting of causing the TSO raw material gas to flow for five seconds, causing the BGO raw material gas to flow for five seconds, and causing the BST raw material gas to flow for five seconds was repeated ten times to obtain a TSO-BGO-BST thin film with a thickness of 20 nm.

A Pt upper electrode (diameter: 100 µmφ, thickness: 100 nm) was formed on the resulting mixed thin film by vapor deposition to form a capacitor. The capacitor was subjected to pressure annealing for three hours in oxygen at 9.9 atm.

Figure 23:
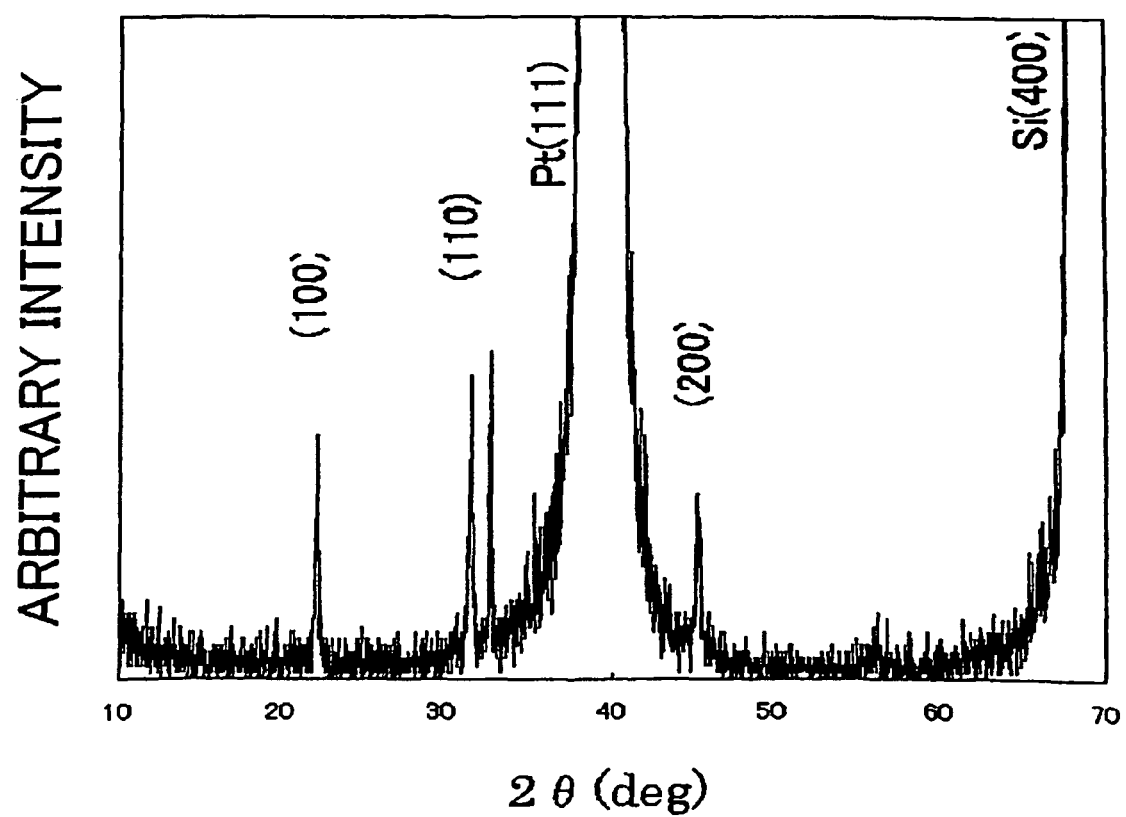
FIG. 23 is a view showing an XRD pattern of a TSO-BGO-BST thin film of the present invention.

FIG. 23 shows an XRD pattern after pressure annealing. Only the crystallization peak of the paraelectric material appeared before applying pressure. After applying pressure, only the reflection peak from BST was detected. This suggests that the constituent elements of the paraelectric were taken into the BST crystals.

Figure 24:
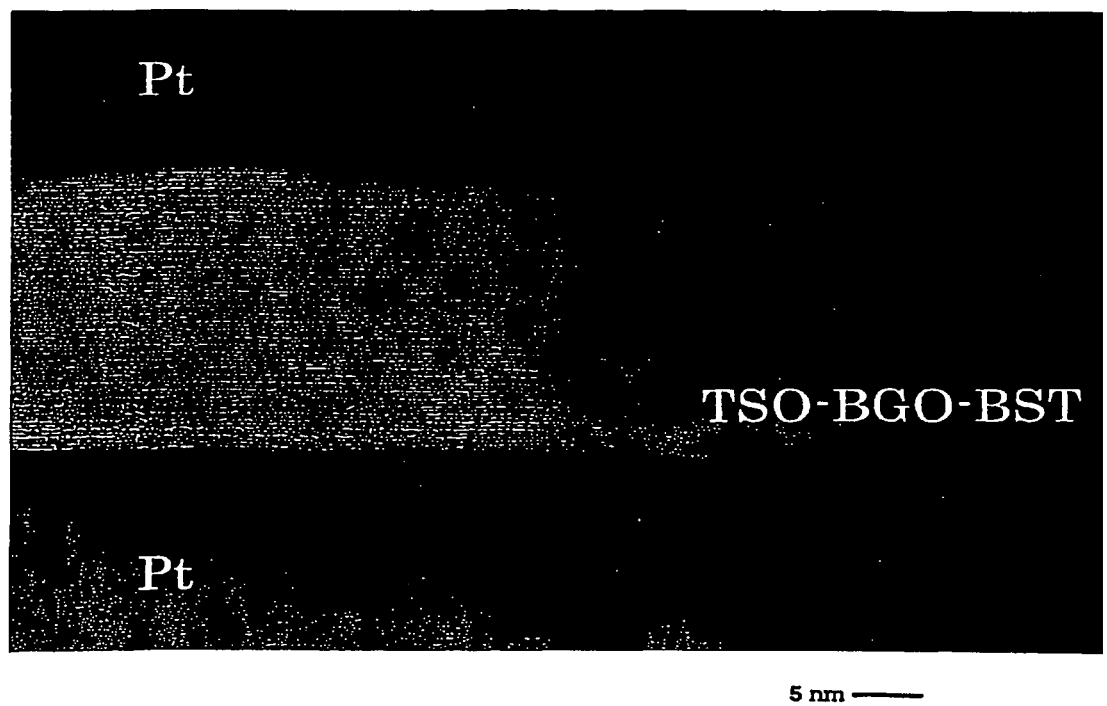
FIG. 24 is a view showing a TEM cross-sectional image of the TSO-BGO-BST thin film of the present invention.
Figure 25:
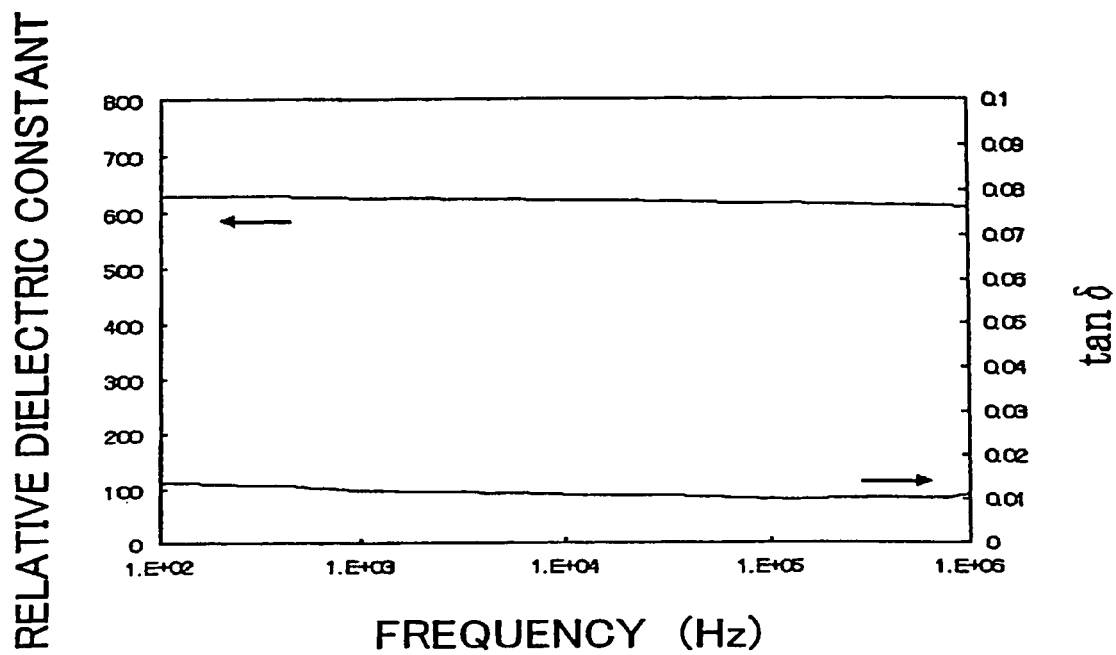
FIG. 25 is a view showing a relation between a relative dielectric constant and a frequency of the TSO-BGO-BST thin film of the present invention.

It was confirmed that the resulting thin film with a thickness of 20 nm was a very good crystal film from a TEM image shown in FIG. 24. Electrical characteristics relating to a relative dielectric constant and a dielectric loss (tan δ) are shown in FIG. 25. A relative dielectric constant of about 600, which is equal to that of bulk, was obtained.

Figure 26:
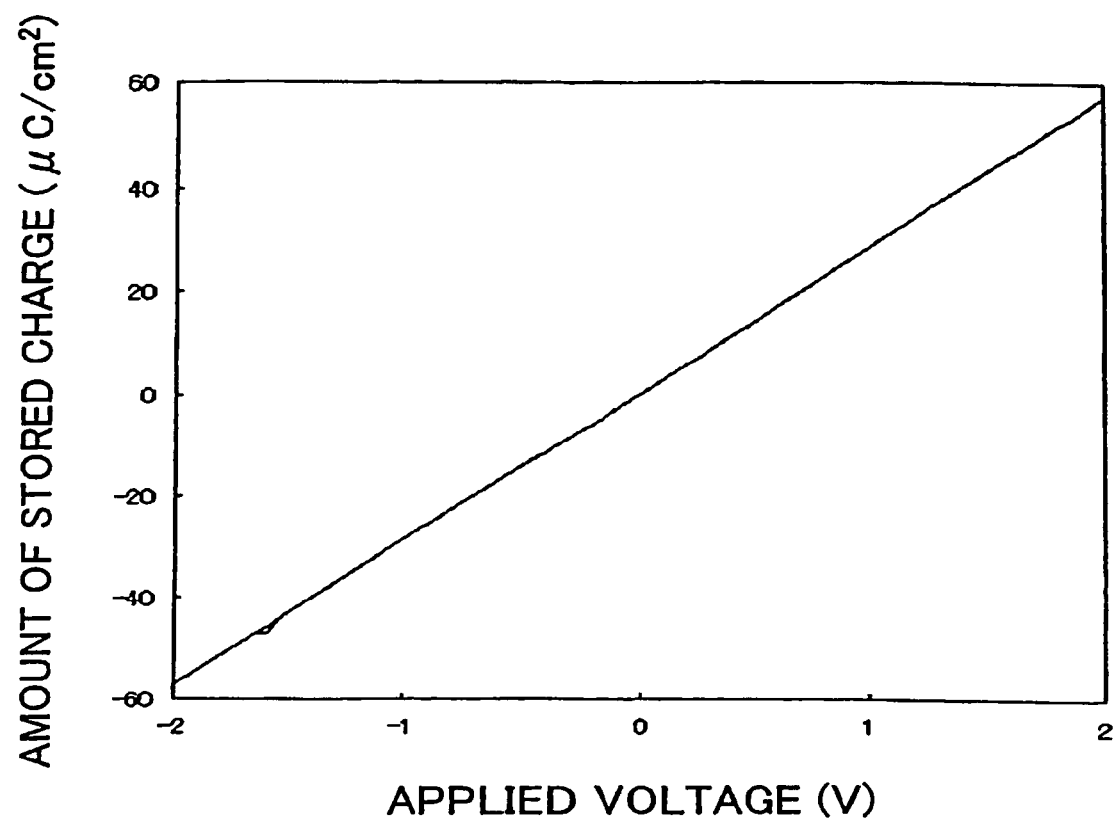
FIG. 26 is a view showing a relation between an applied voltage and the amount of stored charge of the TSO-BGO-BST thin film of the present invention.
Figure 27:
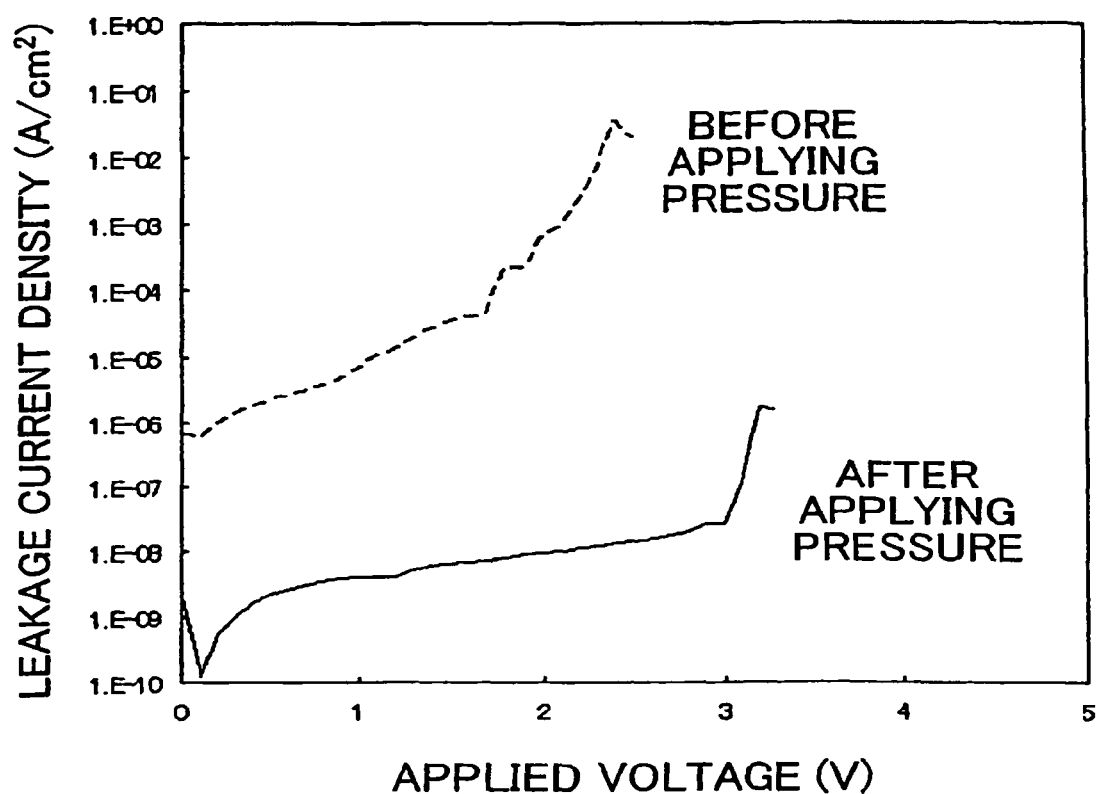
FIG. 27 is a view showing leakage current characteristics of the TSO-BGO-BST thin film of the present invention.

Q-E characteristics and leakage current characteristics were shown in FIGS. 26 and 27. The amount of stored charge was about 50 µC/cm² at an applied voltage of 2 V, and the breakdown voltage was 3 V or more. The leakage current characteristics of the sample were remarkably improved after pressure annealing.

Example 10

Figure 28:
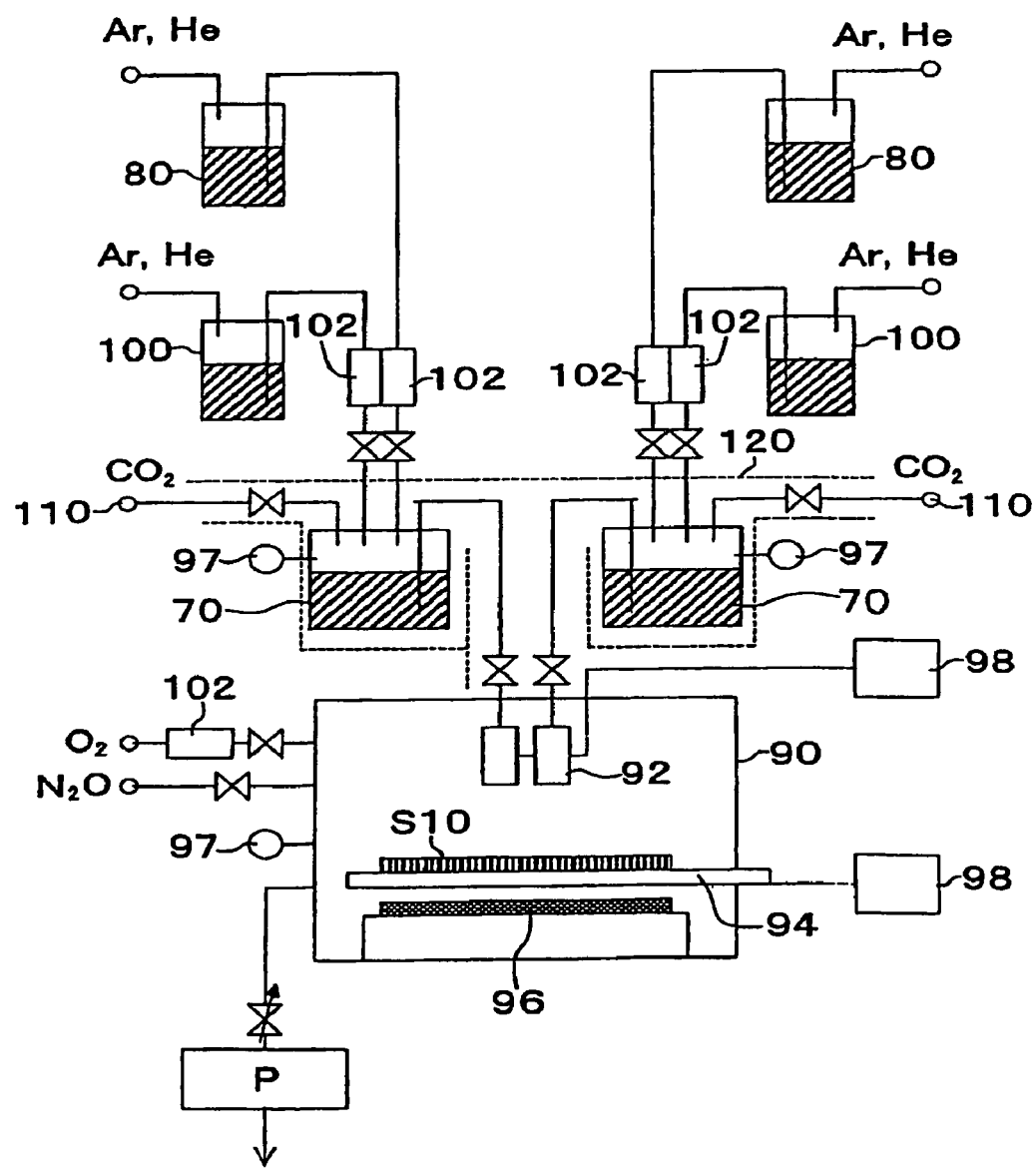
FIG. 28 is a view showing an LSMCD apparatus using supercritical carrier gas used for forming a ferroelectric thin film of the present invention.

A TSO-BGO-BST thin film with a thickness of 20 nm was formed by using a thin film formation apparatus using a supercritical fluid. As shown in FIG. 28, an LSMCD apparatus using a supercritical fluid includes a fluid supplying means 110 which supplies a carbon dioxide ($CO_2$) fluid in a supercritical state, a deposition raw material container 100 in which a deposition raw material consisting of a polycondensation product of constituent elements of an objective metal oxide is placed, an alcohol container 80 in which an alcohol is placed, a mixer 70 which is connected with the fluid supplying means 110, the deposition raw material container 100, and the alcohol container 80 and forms a raw material fluid by mixing the carbon dioxide, deposition raw material, and alcohol (methanol or ethanol), a nozzle 92, connected with the mixer 70, which is disposed in a deposition chamber 90 and sprays the raw material fluid, and a substrate holder 94 which is placed in the deposition chamber 90 and holds the substrate S10. The mixer 70 is set at a specific temperature by a heating means 120. In FIG. 28, a numeral 96 indicates a heater for heating the substrate holder 94, a numeral 98 indicates a supersonic oscillator for applying vibration to the nozzle 92 or the substrate holder 94, a numeral 97 indicates a pressure gauge, and a numeral 102 indicates a mass flow controller.

In this LSMCD method, a thin film is deposited on the substrate by mixing the polycondensation product and alcohol, mixing the mixture and a fluid or liquid in a supercritical state to form the raw material fluid, and supplying the raw material fluid to the surface of the substrate.

The formation procedure for the TSO-BGO-BST thin film is described below.

As the polycondensation product consisting of the constituent elements of the metal oxide, the gels for forming BST and TSO-BGO used in the MOCVD method in Example 9 were used. The above two types of gels were mixed in the mixer to prepare a gel for forming TSO-BGO-BST. After adjusting the viscosity of the gel by adding ethanol, $CO_2$ in a supercritical state was added. The mixing molar ratio of the gel for forming TSO-BGO-BST, ethanol, and supercritical $CO_2$ was TSO-BGO-BST:ethanol:supercritical $CO_2$=1:1:1. The coating amount of the mixture per application was 50 µl.

The mixed fluid of the gel for forming TSO-BGO-BST, ethanol, and supercritical $CO_2$ was applied to the substrate 3 through the nozzle 5 disposed in the deposition chamber 1.

Figure 29:
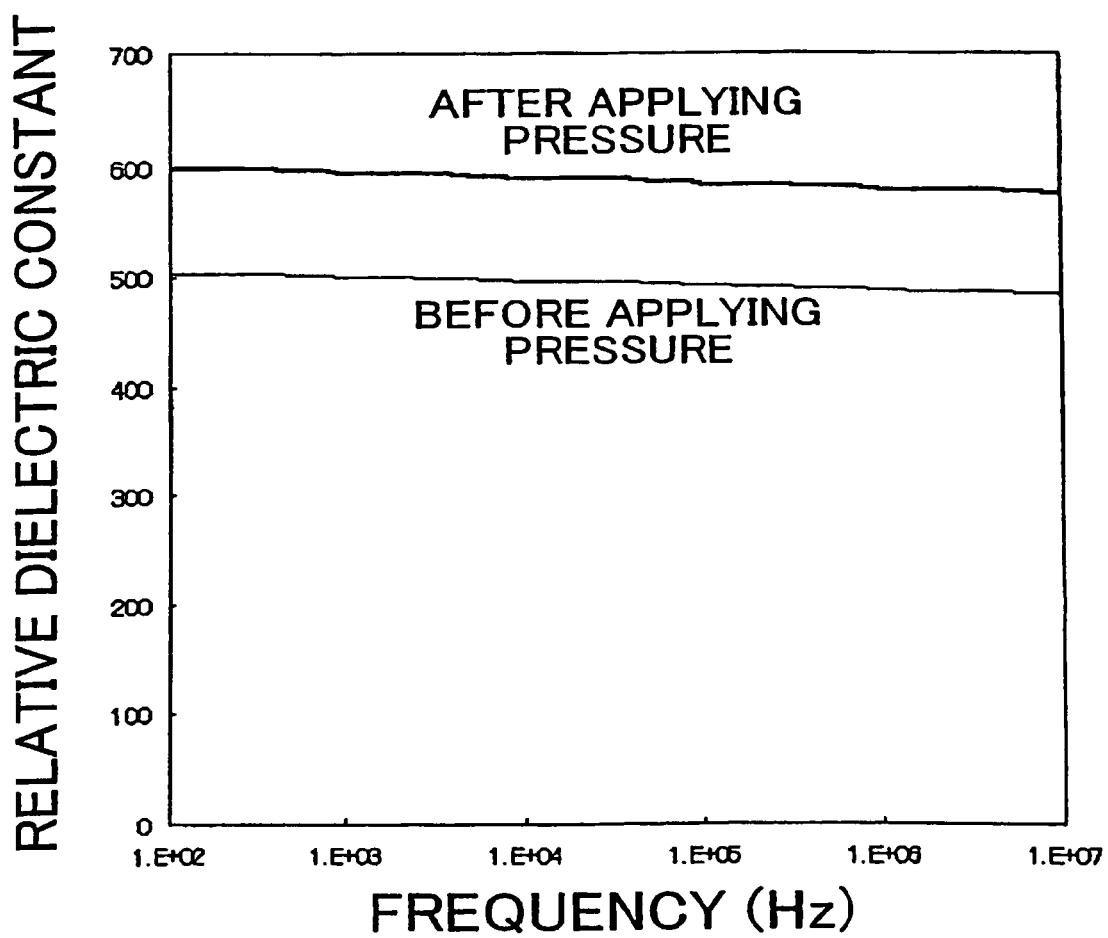
FIG. 29 is a view showing a relation between a relative dielectric constant and a frequency of the TSO-BGO-BST thin film of the present invention formed by using the LSMCD apparatus using supercritical carrier gas before and after pressure annealing.

After drying (150° C. for two min. in air) and presintering (400° C. for five min. in air), coating, drying, and presintering were performed again. The resulting film was then subjected to pressure annealing at 450° C. for 30 min. in oxygen at 9.9 atm. A Pt upper electrode (diameter: 100 μmφ, thickness: 100 nm) was formed on the thin film by vapor deposition to obtain a capacitor. The ferroelectric characteristics of this capacitor were evaluated. The results are shown in FIG. 29.

This capacitor had good dielectric characteristics with a relative dielectric constant of 500. However, the dielectric characteristics was a little inferior in comparison with the case of using the MOCVD method. Therefore, the capacitor was subjected to pressure annealing at 450° C. for 30 min. in oxygen at 9.9 atm. As a result, a relative dielectric constant of 600 was obtained. This is because the interface conditions between the Pt upper electrode and the thin film were improved by pressure post-annealing.

As described above, although pressure annealing had sufficient effect before forming the upper electrode, it was particularly effective to perform pressure annealing after forming the electrode, taking into consideration the formation of the interface with the electrode.

Example 11

Figure 30:
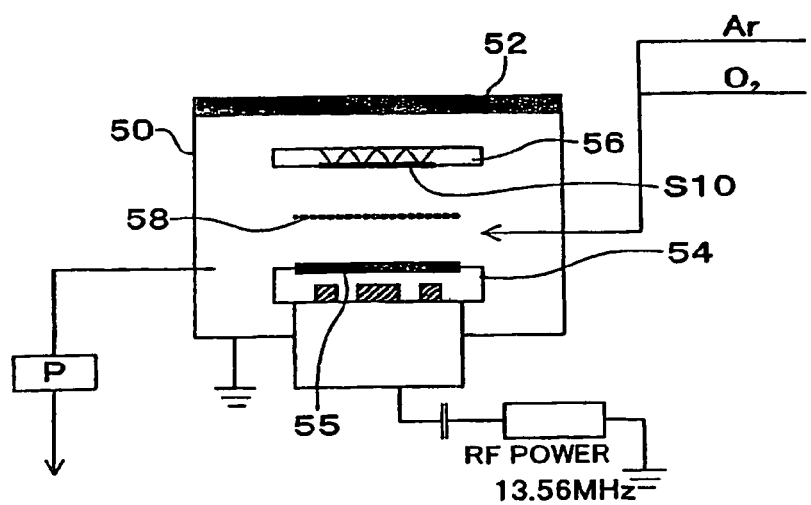
FIG. 30 is a view showing a high-frequency magnetron sputtering apparatus used for forming a ferroelectric thin film of the present invention.

A high-frequency magnetron sputtering apparatus shown in FIG. 30 was used as a sputtering apparatus. This conventional sputtering apparatus includes an anode 52 and a cathode 54 facing each other in a chamber 50. A sputtering target 55 is provided on the cathode 54. A support stage 56 which supports a substrate S10 on which the film is formed is provided between the anode 52 and the cathode 54. A shutter 58 is provided between the cathode 54 and the support stage 56.

Figure 31:
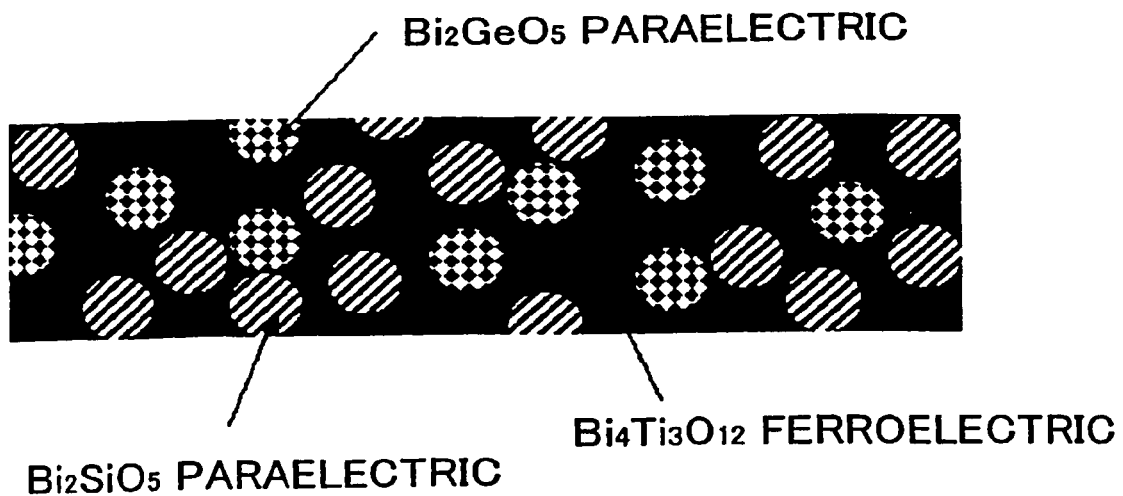
FIG. 31 is a cross-sectional view showing a BSO-BGO-SBT target of the present invention.

A sintered body sputtering target used in the present invention was formed by the following procedure. A 10% Bi-excess SBT target (target density: 50%) was immersed in a mixed solution of a sol-gel solution for forming $Bi_2SiO_5$ and a sol-gel solution for forming $Bi_2GeO_5$, and dried at 150° C. in air. After repeating this operation five times, the target was subjected to heat treatment at 450° C. for 10 min. in air to prepare a BSO-BGO-SBT target shown in FIG. 31. A 10% Bi-excess SBT target (target density: 95%) was provided for characteristic comparison.

As a substrate for deposition, a Pt/Ti/$SiO_2$/Si substrate with dimensions of 2 cm×2 cm□ was used. After forming BSO-BGO-SBT and SBT thin films under deposition conditions given below, Pt with a diameter of 100 μmφ and a thickness of 100 nm was formed by vapor deposition as an upper electrode to obtain a capacitor sample.

Sputtering Conditions
High frequency output: 200 W
Sputtering gas: Ar:$O_2$=10:1
Sputtering gas pressure: 15 Pa
Target-substrate distance: 50 mm
Substrate temperature: 650° C.
Sputtering time: 10 min.

Figure 32:
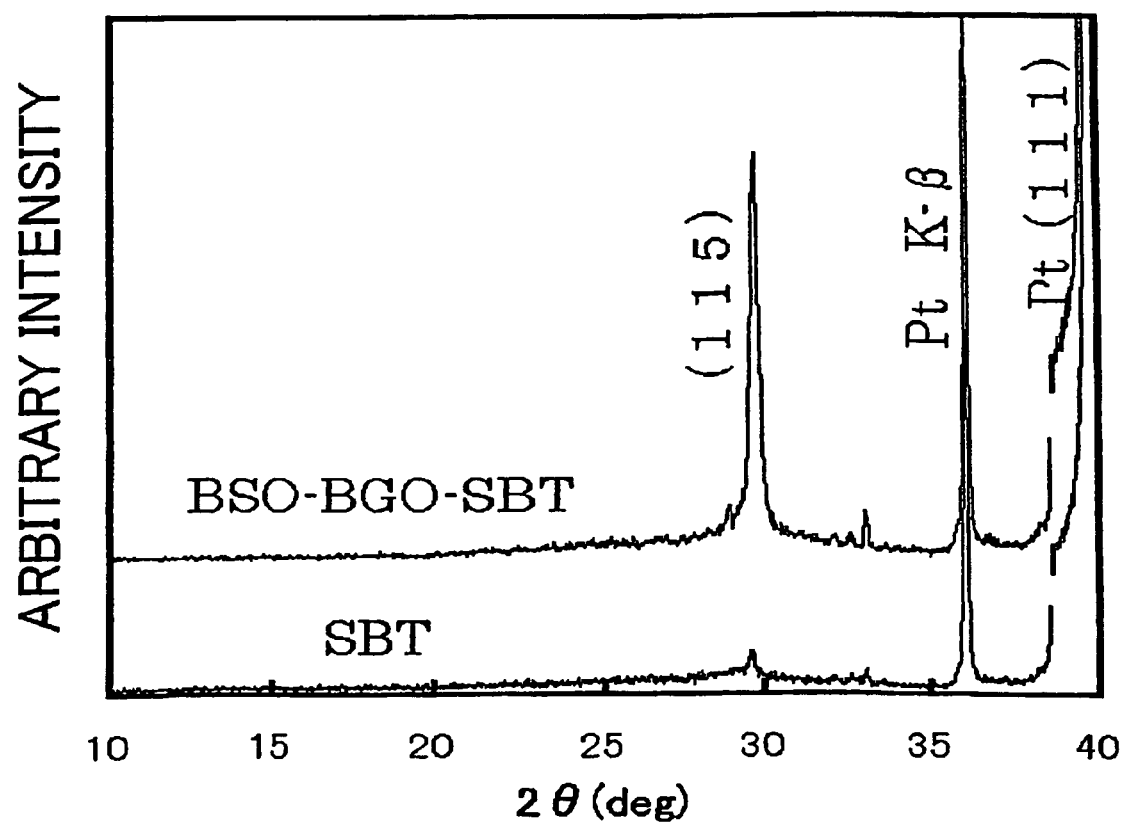
FIG. 32 is a view showing an XRD pattern of a BSO-BGO-SBT thin film formed by using the high-frequency magnetron sputtering apparatus.

FIG. 32 shows an XRD pattern of the resulting BSO-BGO-SBT thin film with a thickness of 100 nm. As shown in FIG. 32, an $SrBi_2Ta_2O_9$ randomly oriented film was obtained. The peaks of $Bi_2SiO_5$ and $Bi_2GeO_5$ were not included as compared to the XRD pattern of the SBT thin film formed for comparison.

Figure 33:
FIG. 33 is a view showing a TEM cross-sectional image of the BSO-BGO-SBT thin film formed by using the high-frequency magnetron sputtering apparatus.
Figure 33:

FIG. 33 shows a comparison of TEM images of the cross section of the films. There was a large difference in the morphology in cross section between these films. The BSO-BGO-SBT thin film formed by using the BSO-BGO-SBT target of the present invention was formed of very dense column-shaped crystals.

D-E hysteresis characteristics of the sample were evaluated. In the case of a conventional SBT thin film, a ferroelectric hysteresis was not confirmed because the leakage current was too large for the film thickness due to a low density.

Figure 34:
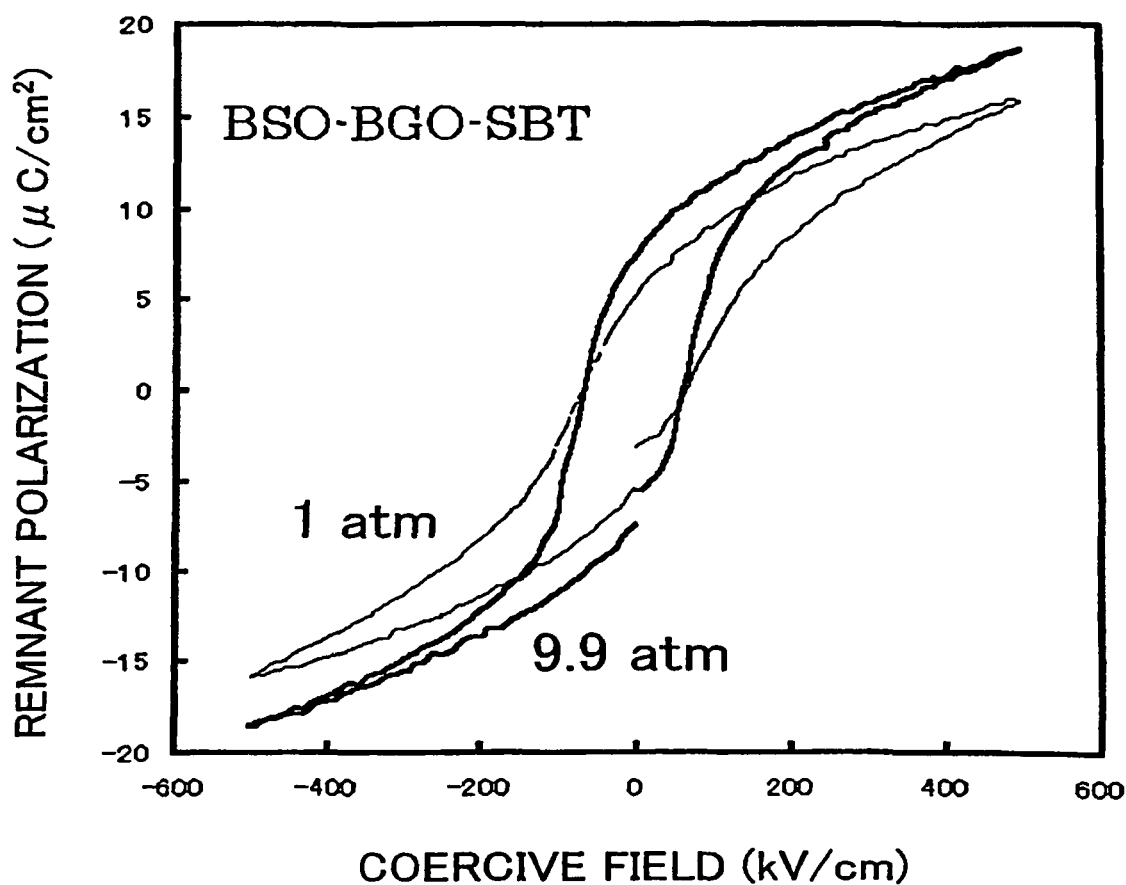
FIG. 34 is a view showing hysteresis characteristics of the BSO-BGO-SBT thin film formed by using the high-frequency magnetron sputtering apparatus.

In the case of the BSO-BGO-SBT thin film of the present invention, a ferroelectric hysteresis shown in FIG. 34 was confirmed although the hysteresis was leaky.

A capacitor having the above BSO-BGO-SBT ceramic film was subjected to pressure annealing for three hours in oxygen at 9.9 atm. As a result, a ferroelectric hysteresis better than the hysteresis shown in FIG. 34 was obtained.

Example 12

In this example, a BSO-BIT ceramic thin film of the present invention was formed by a solid phase method. A BSO-BIT (molar ratio R=BSO/BIT=0.2/0.8) ceramic was formed by using a conventional solid phase method.

As the starting raw materials, $Bi_2O_3$, $TiO_2$, and Si (all powder form) were mixed so that a desired composition (Bi:Ti:Si=1:2.5:0.5) was obtained. The raw materials weighed using a direct reading balance were placed in a polyethylene pot together with an agate stone and acetone. The raw materials were mixed for 10 hours by ball milling. The mixture was then removed using an enamel vat, dried using a dryer, and formed in the shape of a column using a mold at a pressure of about 800 kg/cm². The formed product was placed in an alumina crucible and presintered at 850° C. for two hours. After presintering, the resulting product was ground by using an alumina mortar to obtain raw material powder for forming a sample.

The raw material powder was formed in the shape of a column together with a small amount of polyvinyl alcohol (binder) by using a mold at a pressure of about 800 kg/cm². The binder was removed by maintaining the formed product in an oxidization furnace at 500° C. for two hours. The formed product was heated at a rate of 200° C./h, maintained at 1100° C. for two hours, and allowed to cool to prepare a column-shaped BSO-BIT ceramic with a diameter of 10 mm and a thickness of 1 mm. However, since the column was collapsed, the ceramic was obtained only in the form of powder. The color of the powder was partly black or gray. This suggests that the solid phase reaction did not proceed.

In this example, $(CH_3)_2Si(OC_2H_5)_2$ (liquid) was mixed with $Bi_2O_3$ so that a desired composition (Bi:Si=2:1) was obtained. The raw materials weighed using a direct reading balance were placed in a polyethylene pot together with an agate stone and acetone. The raw materials were mixed for 10 hours by ball milling. The mixture was then removed using an enamel vat, dried using a dryer, and formed in the shape of a column using a mold at a pressure of about 800 kg/cm². The formed product was placed in an alumina crucible and presintered at 850° C. for two hours. After presintering, the resulting product was ground by using an alumina mortar to obtain $Bi_2SiO_5$ (BSO) raw material powder for forming a sample. $Bi_2O_3$ and $TiO_2$ were mixed so that a desired composition (Bi:Si=4:3) was obtained. The raw materials weighed using a direct reading balance were placed in a polyethylene pot together with an agate stone and acetone. The raw materials were mixed for 10 hours by ball milling. The mixture was then removed using an enamel vat, dried using a dryer, and formed in the shape of a column using a mold at a pressure of about 800 kg/cm². The formed product was placed in an alumina crucible and presintered at 850° C. for two hours. After presintering, the resulting product was ground by using an alumina mortar to obtain BIT raw material powder for forming a BIT sample.

The $Bi_2SiO_5$ raw material powder and BIT raw material powder for forming a sample were mixed together with polyvinyl alcohol (binder), and formed in the shape of a column using a mold at a pressure of about 800 kg/cm². The binder was removed by maintaining the formed product in an oxidization furnace at 500° C. for two hours. The formed product was heated at a rate of 200° C./h, maintained at 950° C. for two hours, and allowed to cool to prepare a column-shaped BSO-BIT ceramic with a diameter of 10 mm and a thickness of 1 mm. As a result, a good column-shaped BSO-BIT ceramic was obtained. The entire ceramic was dense and black. This suggests that the solid phase reaction was promoted in a good state.

Figure 35:
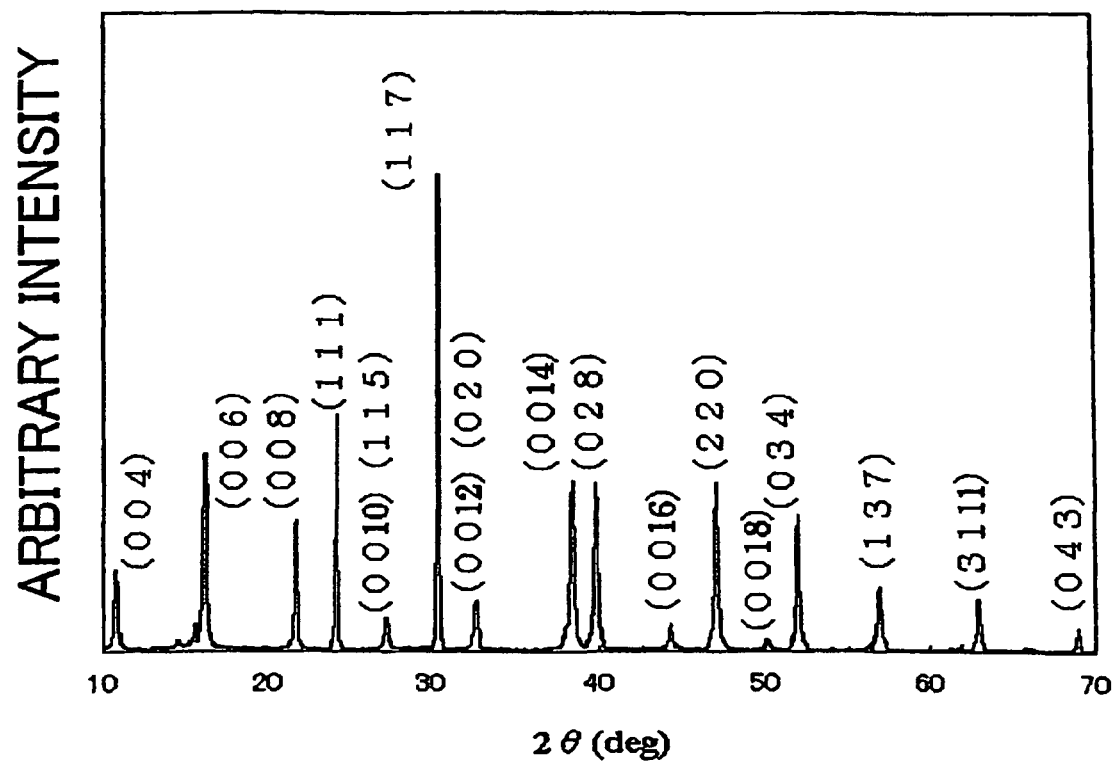
FIG. 35 is a view showing an XRD pattern of a BSO-BIT thin film formed by using a solid phase method.
Figure 36:
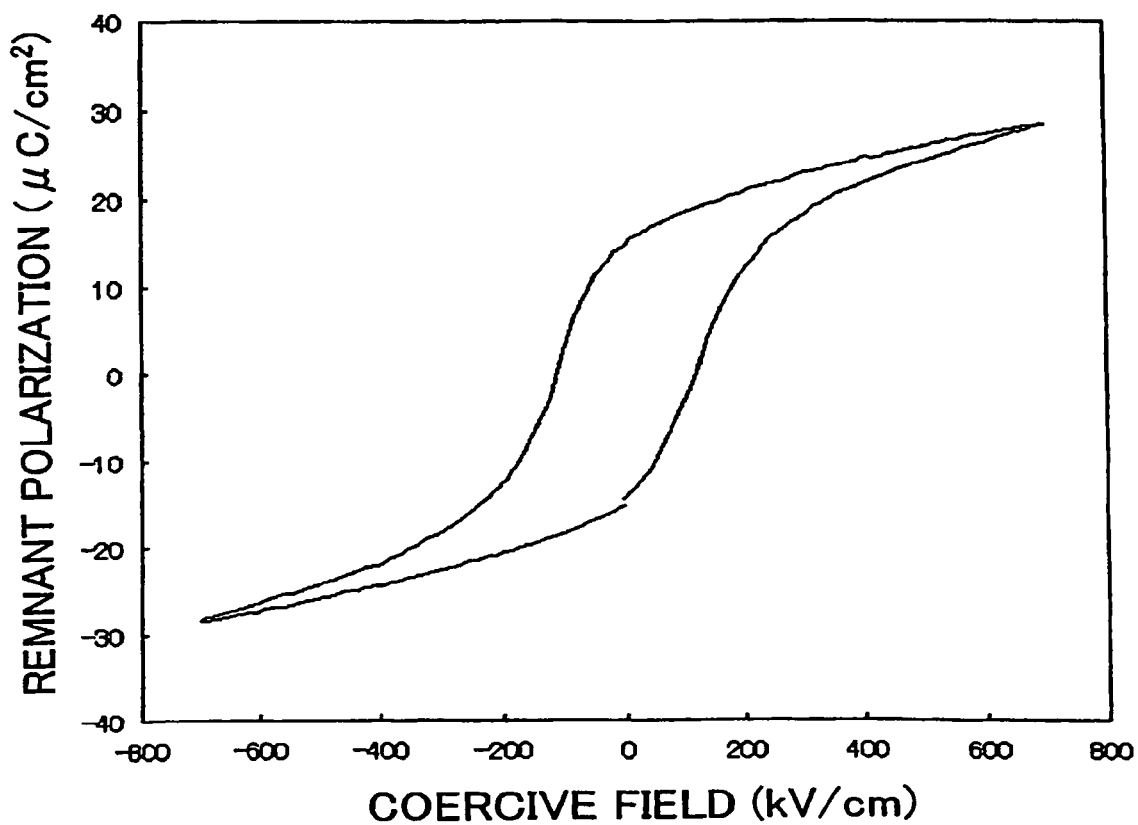
FIG. 36 is a view showing hysteresis characteristics of the BSO-BIT thin film formed by using the solid phase method.

FIG. 35 shows an XRD pattern of this ceramic. In FIG. 35, only random peaks of BIT were obtained and a peak originating in BSO was not detected. Therefore, it was confirmed that a good BSO-BIT solid solution was obtained in this example. A Pt electrode with a diameter of 1 mmφ and a thickness of 300 nm was formed on the upper and lower sides of the resulting column-shaped ceramic to obtain a capacitor sample. The ferroelectric characteristics of this sample were evaluated. As a result, a good ferroelectric hysteresis shown in FIG. 36 was obtained.

What is claimed is:

1. An actuator comprising:
    a lower electrode, a ceramic film, and an upper electrode, wherein the ceramic film includes a complex oxide having Si in an oxygen octahedral structure,
    wherein the ceramic film further includes a paraelectric oxide having an oxygen tetrahedral structure.

2. The actuator according to claim 1, wherein at least part of the ceramic film has a column-shaped structure which is continuous between the upper electrode and the lower electrode.

3. The actuator according to claim 2, wherein a diameter of the column-shaped structure is 1 to 50 nm.

4. The actuator according to claim 1, wherein the Si in the oxygen octahedral structure has a coordination number of six.

5. The actuator according to claim 1, wherein the complex oxide has a perovskite structure.

6. The actuator according to claim 1, wherein the complex oxide has a bismuth-layer structure.

7. The actuator according to claim 1, wherein the paraelectric oxide has Si in the oxygen tetrahedral structure.

* * * * *